(12) United States Patent
Maekawa

(10) Patent No.: US 8,912,546 B2
(45) Date of Patent: Dec. 16, 2014

(54) THIN FILM TRANSISTOR AND DISPLAY DEVICE

(75) Inventor: Shinji Maekawa, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 308 days.

(21) Appl. No.: 12/360,551

(22) Filed: Jan. 27, 2009

(65) Prior Publication Data

US 2009/0134401 A1 May 28, 2009

Related U.S. Application Data

(62) Division of application No. 11/137,746, filed on May 25, 2005, now Pat. No. 7,491,590.

(30) Foreign Application Priority Data

May 28, 2004 (JP) .................................. 2004-159939

(51) Int. Cl.
*H01L 29/04* (2006.01)
*H01L 31/036* (2006.01)
*H01L 23/48* (2006.01)
*H01L 27/12* (2006.01)

(52) U.S. Cl.
CPC .................................. *H01L 27/1214* (2013.01)
USPC .......... 257/72; 257/59; 257/762; 257/E27.111

(58) Field of Classification Search
CPC ................ H01L 27/1214; H01L 27/12; H01L 29/66765; H01L 29/4908; H01L 23/49883
USPC ................ 257/59, 72, E27.111, 762
See application file for complete search history.

(56) References Cited

U.S. PATENT DOCUMENTS

| | | | |
|---|---|---|---|
| 4,051,074 A | | 9/1977 | Asada |
| 5,075,746 A | * | 12/1991 | Hayashi et al. ............... 257/392 |
| 5,184,399 A | | 2/1993 | Ueno et al. |
| 5,286,927 A | | 2/1994 | Ueno et al. |
| 6,246,070 B1 | | 6/2001 | Yamazaki et al. |
| 6,338,893 B1 | | 1/2002 | Kodera et al. |
| 6,380,011 B1 | | 4/2002 | Yamazaki et al. |
| 6,555,420 B1 | * | 4/2003 | Yamazaki ..................... 438/158 |
| 6,838,324 B2 | | 1/2005 | Yamazaki et al. |
| 6,979,416 B2 | | 12/2005 | Nakao et al. |

(Continued)

FOREIGN PATENT DOCUMENTS

| | | |
|---|---|---|
| EP | 0 463 872 A2 | 1/1992 |
| JP | 52-129293 | 10/1977 |

(Continued)

*Primary Examiner* — Shouxiang Hu
(74) *Attorney, Agent, or Firm* — Husch Blackwell LLP

(57) ABSTRACT

The present invention provides a technique by which a component forming a display device, such as a wiring can be formed with good adhesion.

In the invention, a component forming a thin film transistor, a display device, or the like is formed with a material which is the same as at least one of the substances forming the formation subject surface added (mixed); thus, adhesion between the component and the formation subject is improved. An insulating layer formed over the component is formed with a laminate of a first insulating layer containing an organic material and a second insulating layer containing an inorganic material; thus, the insulating layer sufficiently covers irregularities on the surface of the component, and is also dense enough so as to be reliable as an insulating layer.

17 Claims, 28 Drawing Sheets

(56) References Cited

U.S. PATENT DOCUMENTS

| | | | |
|---|---|---|---|
| 7,067,337 B2 * | 6/2006 | Yudasaka et al. | 438/21 |
| 7,094,684 B2 | 8/2006 | Yamazaki et al. | |
| 7,176,069 B2 | 2/2007 | Yamazaki et al. | |
| 7,208,764 B2 * | 4/2007 | Furusawa | 257/72 |
| 7,320,905 B2 | 1/2008 | Yamazaki et al. | |
| 7,585,761 B2 | 9/2009 | Yamazaki et al. | |
| 7,742,019 B2 | 6/2010 | Takahara | |
| 7,777,698 B2 | 8/2010 | Takahara et al. | |
| 7,924,248 B2 | 4/2011 | Takahara | |
| 7,932,880 B2 | 4/2011 | Takahara et al. | |
| 8,063,855 B2 | 11/2011 | Takahara et al. | |
| 2002/0001048 A1 * | 1/2002 | Lee et al. | 349/43 |
| 2003/0218221 A1 * | 11/2003 | Wager et al. | 257/410 |
| 2005/0180083 A1 | 8/2005 | Takahara et al. | |
| 2006/0158482 A1 | 7/2006 | Nakamura et al. | |
| 2006/0163580 A1 | 7/2006 | Yamazaki et al. | |
| 2009/0184984 A1 | 7/2009 | Takahara | |

FOREIGN PATENT DOCUMENTS

| | | |
|---|---|---|
| JP | 4-134788 | 5/1992 |
| JP | 8-227153 | 9/1996 |
| JP | 10-319580 | 12/1998 |
| JP | 11-251259 | 9/1999 |
| JP | 2000-150904 | 5/2000 |
| JP | 2000-150906 | 5/2000 |
| JP | 2003-315829 | 11/2003 |
| JP | 2004-29755 | 1/2004 |
| JP | 2004-134788 | 4/2004 |

* cited by examiner

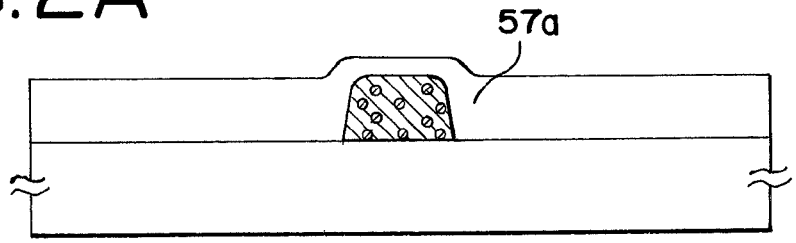
FIG.2A
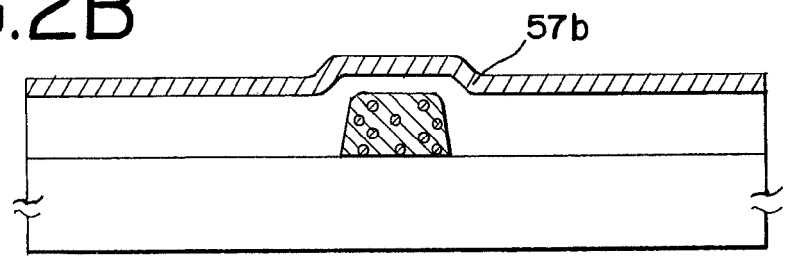
FIG.2B
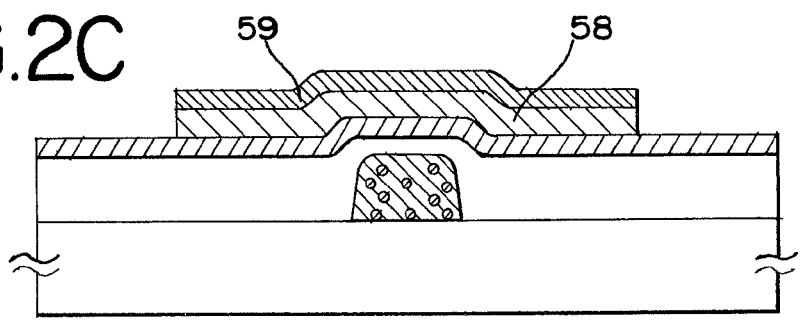
FIG.2C
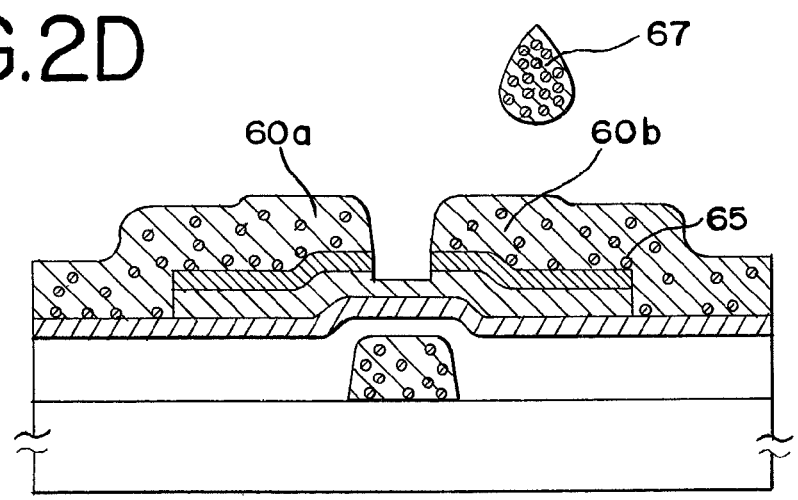
FIG.2D

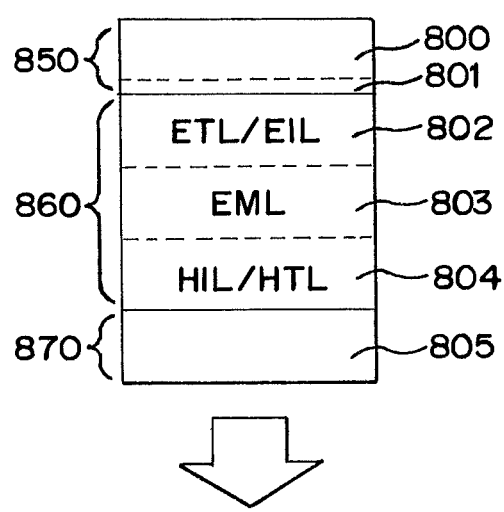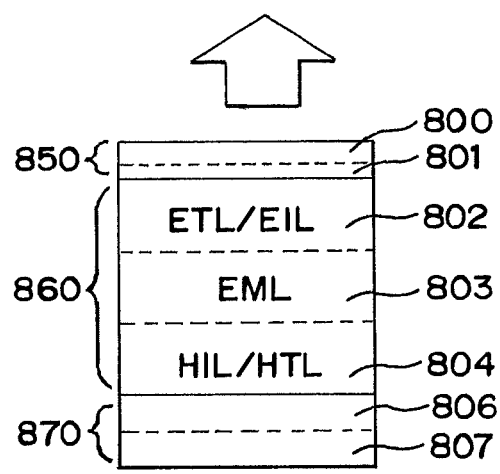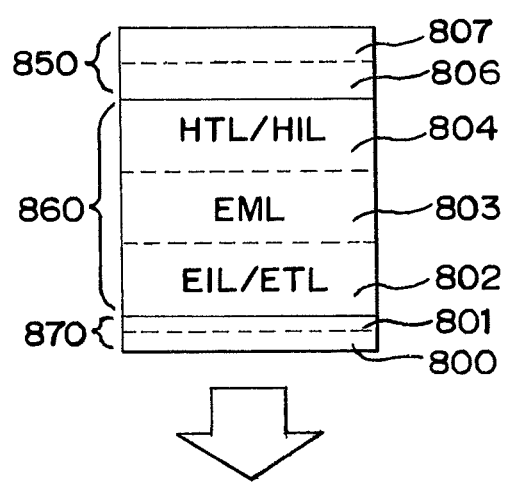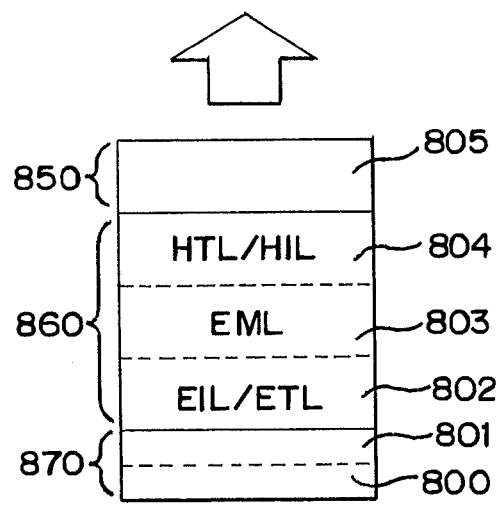

FIG.20A
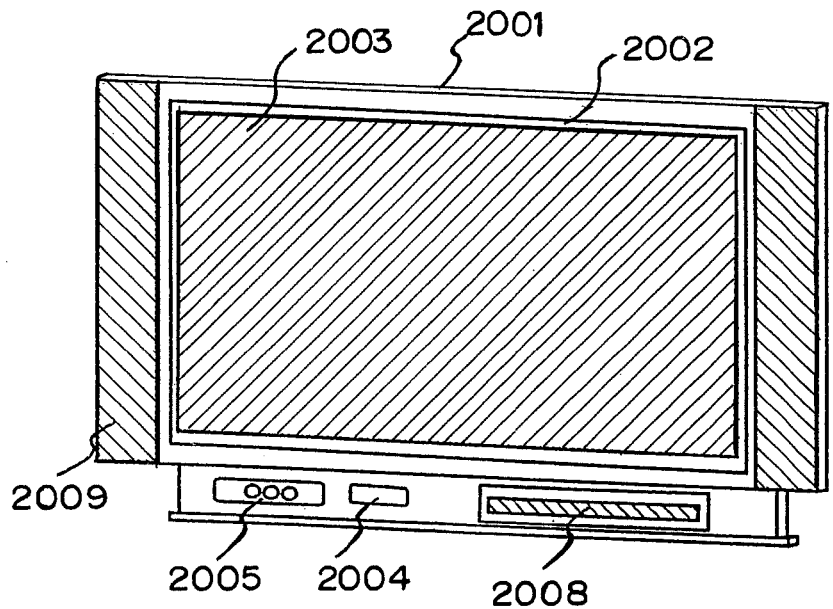
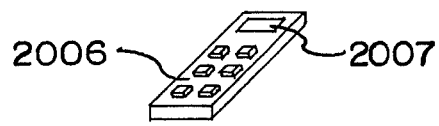
FIG.20B
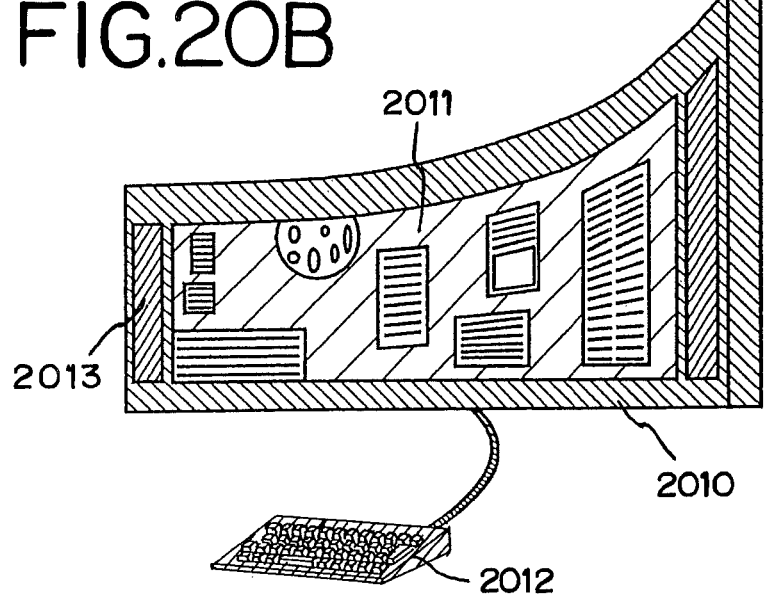

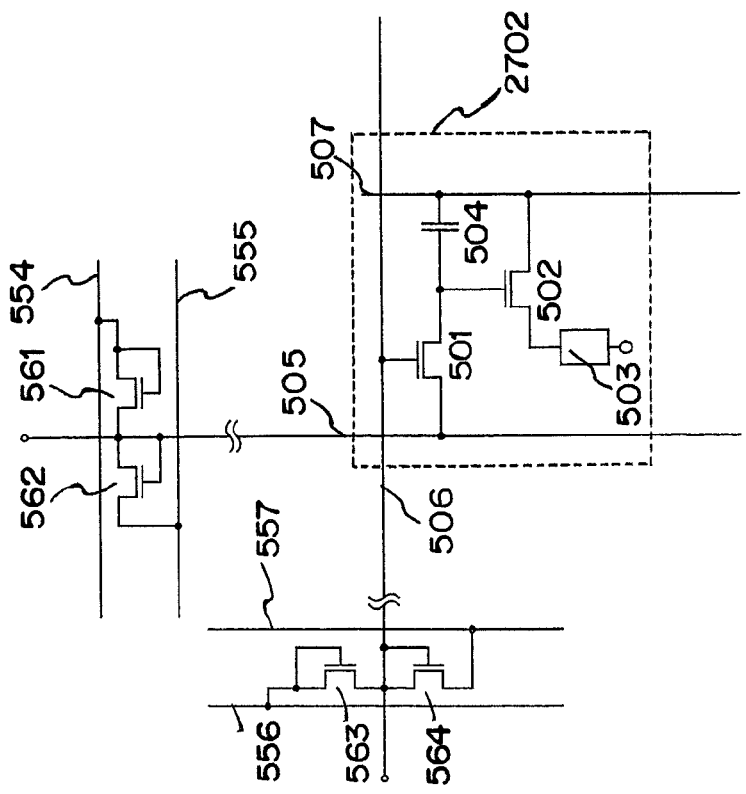

FIG.31A
FIG.31B
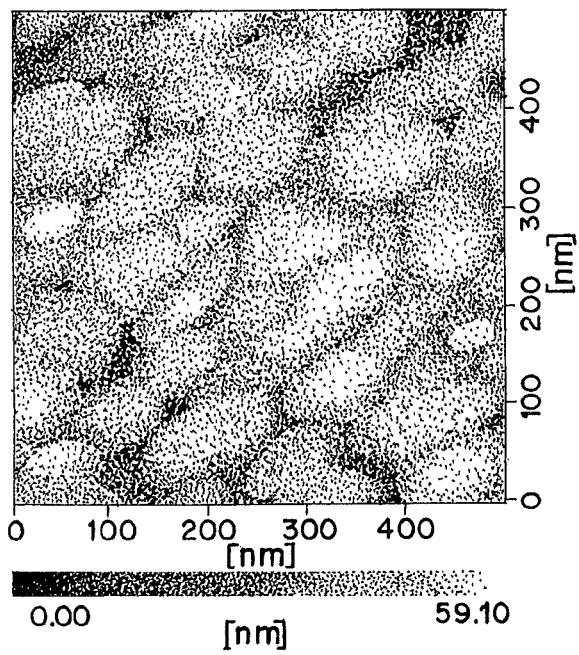
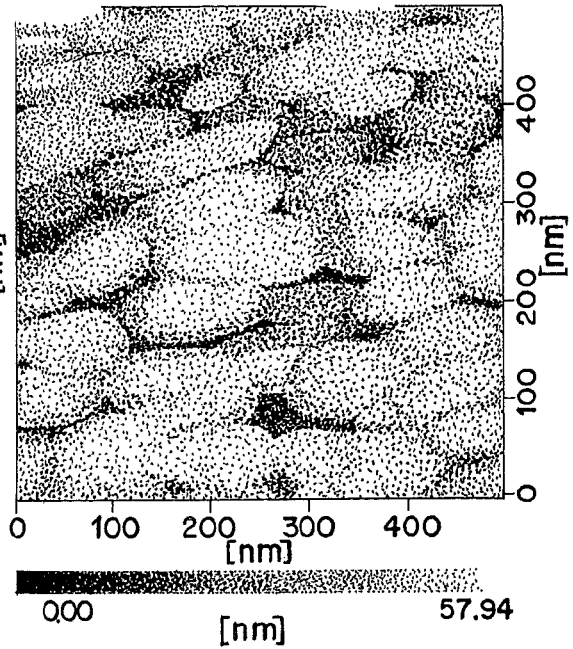
FIG.31C
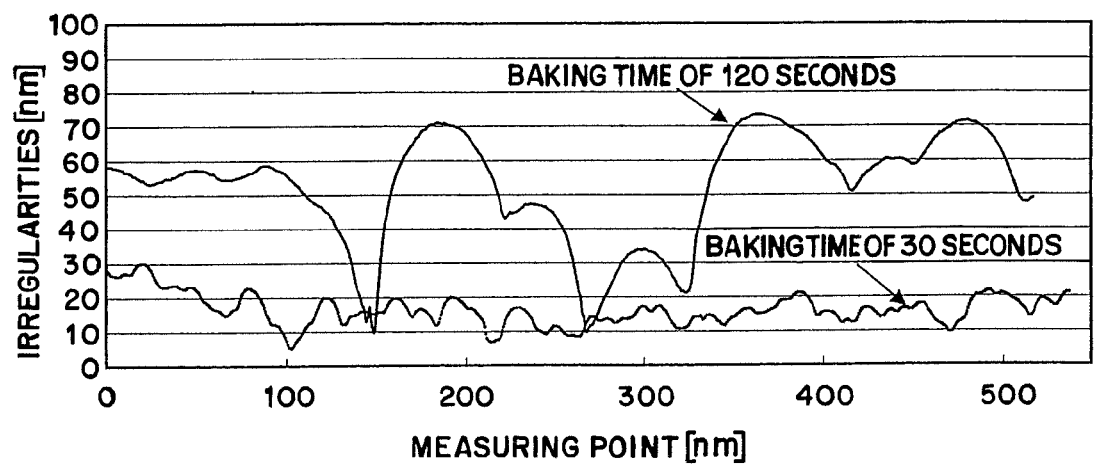

THIN FILM TRANSISTOR AND DISPLAY DEVICE

This application is a divisional of application Ser. No. 11/137,746 filed on May 25, 2005 now U.S. Pat. No. 7,491,590.

BACKGROUND OF THE INVENTION

1. Field of the Invention

The invention relates to a thin film transistor and a method for manufacturing the same, a display device and a method for manufacturing the same, and a television device using the above.

2. Description of the Related Art

A thin film transistor (hereinafter, referred to as a "TFT") and an electronic circuit using the thin film transistor are manufactured by stacking various types of thin films of such as a semiconductor, an insulator, a conductor over a substrate and then, appropriately forming a predetermined pattern by photolithography. The photolithography is a technique of transferring a pattern of a circuit or the like formed with a material which does not transmit light over a transparent flat surface, referred to as a photomask, onto an objective substrate by utilizing light. The technique has been widely used in the manufacturing processes of a semiconductor integrated circuit and the like.

In the manufacturing process employing a conventional photolithography technique, a multi-stage process including light exposure, development, baking, peeling, and the like are required only for treating a mask pattern which is formed of a photosensitive organic resin material referred to as a photoresist. Therefore, as the number of the photolithography steps is increased, the manufacturing cost is inevitably increased. In order to improve such problems as described above, it has been tried to manufacture a TFT by reducing the number of the photolithography steps (for example, Reference 1: Japanese Patent Laid-Open No. H11-251259).

However, in the technique disclosed in Reference 1, only some of the plural photolithography steps in a TFT manufacturing process are replaced by printing method, and no contribution is made to a drastic reduction in the number of steps. Further, a light exposure apparatus to be used for transferring a mask pattern in photolithography transfers a pattern of under several micrometers to one micrometer or less by equivalent projection light exposure or reduction projection light exposure. It is theoretically difficult, from a technical standpoint, to expose a large substrate which is more than one meter on a side to light all at once using the light exposure apparatus.

As to a thin film transistor which is formed by stacking various thin films, it is important to improve the planarity of a formation region where thin films are formed, so that the respective films are formed with good adhesion and stability. This is because reduction in step coverage or nonuniformity of processing is caused in a thin film when a formation region has poor planarity (for example, Reference 2: Japanese Patent Laid-Open No. 2000-150906).

SUMMARY OF THE INVENTION

It is an object of the present invention to reduce the number of photolithography steps in the manufacturing process of a TFT, an electronic circuit using the TFT, and a display device formed using the TFT, and to simplify the manufacturing process. It is a further object of the present invention to provide a technique by the TFT, the electronic circuit, and the display device can be manufactured even over a large substrate with a side of more than one meter with higher yield at lower cost.

It is another object of the present invention to provide a technique by which wiring patterns and the like constituting a part of a display device can be formed with good adhesion to manufacture a highly reliable display device.

In the invention, an object on which a component is formed refers to as a formation subject. The component constituting a part of a thin film transistor, a display device or the like is formed by adding (mixing) a material which is the same as at least one of substances forming the surface of the formation subject, which has good adhesion to the formation subject in the component to improve adhesion between the component and the formation subject. Further, insulating layer formed over the component is formed with a laminate of a first insulating layer containing an organic material and a second insulating layer containing an inorganic material; thus, the insulating layer sufficiently covers irregularities on the surface of the component, and is also dense enough so as to be reliable as an insulating layer.

A display device according to the present invention includes a light emitting display device including a TFT connected to a light emitting element in which an organic material or a medium including a mixture of an organic material and an inorganic material producing luminescence referred to as electroluminescence (hereinafter also referred to as "EL") is sandwiched between electrodes; a liquid crystal display device in which a liquid crystal element having a liquid crystal material is used as a display element.

A thin film transistor according to the invention has an insulating surface and a conductive layer in which a material which is the same as at least one of substances forming the insulating surface is dispersed, over the insulating surface.

A thin film transistor according to the invention has a first insulating layer containing an organic material over a conductive layer; a second insulating layer containing an inorganic material over the first insulating layer; and a semiconductor layer over the second insulating layer, wherein the conductive layer is formed by discharging a composition containing a conductive material.

A thin film transistor according to the invention has an insulating surface; a conductive layer in which a material which is the same as at least one of substances forming the insulating surface is dispersed, on the insulating surface; a first insulating layer containing an organic material over the conductive layer; a second insulating layer containing an inorganic material over the first insulating layer; and a semiconductor layer over the second insulating layer.

A thin film transistor according to the invention has an insulating surface; a first conductive layer in which a material which is the same as at least one of substances forming the insulating surface is dispersed, on the insulating surface; a first insulating layer containing an organic material over the first conductive layer; a second insulating layer containing an inorganic material over the first insulating layer; a semiconductor layer over the second insulating layer; and a second conductive layer in which a material which is the same as at least one of substances forming the semiconductor layer is dispersed, which is in contact with the semiconductor layer.

A thin film transistor according to the invention has an insulating surface; a first conductive layer in which a material which is the same as at least one of substances forming the insulating surface is dispersed, on the insulating surface; a first insulating layer containing an organic material over the first conductive layer; a second insulating layer containing an inorganic material over the first insulating layer; a semiconductor layer over the second insulating layer; a second conductive layer in which a material which is the same as at least one of substances forming the semiconductor layer is dispersed, which is in contact with the semiconductor layer; a third insulating layer containing an organic material over the second conductive layer; a fourth insulating layer containing an inorganic material over the third insulating layer, wherein the third insulating layer and the fourth insulating layer have openings reaching the second conductive layer, and the third conductive layer in contact with the second conductive layer is in the opening.

A display device according to the invention has an insulating surface; a gate electrode layer in which a material which is the same as at least one of substances forming the insulating surface is dispersed, on the insulating surface; an insulating layer over the gate electrode layer; a semiconductor layer over the insulating layer; a source/drain electrode layer which is in contact with the semiconductor layer; and an electrode layer which is electrically connected to the source/drain electrode layer.

A display device according to the invention has a first insulating layer containing an organic material over a gate electrode layer; a second insulating layer containing an inorganic material over the first insulating layer; a semiconductor layer over the second insulating layer; a source/drain electrode layer which is in contact with the semiconductor layer; and an electrode layer which is electrically connected to the source/drain electrode layer, wherein the gate electrode layer is formed by discharging a composition containing a conductive material.

A display device according to the invention has an insulating surface; a gate electrode layer in which a material which is the same as at least one of substances forming the insulating surface is dispersed, on the insulating surface; a first insulating layer containing an organic material over the gate electrode layer; a second insulating layer containing an inorganic material over the first insulating layer; a semiconductor layer over the second insulating layer; a source/drain electrode layer which is in contact with the semiconductor layer; and an electrode layer which is electrically connected to the source/drain electrode layer.

A display device according to the invention has an insulating surface; a gate electrode layer in which a material which is the same as at least one of substances forming the insulating surface is dispersed, on the insulating surface; a first insulating layer containing an organic material over the gate electrode layer; a second insulating layer containing an inorganic material over the first insulating layer; a semiconductor layer over the second insulating layer; a source electrode layer in which a material which is the same as at least one of substances forming the semiconductor layer is dispersed, which is in contact with the semiconductor layer; a drain electrode layer in which a material which is the same as at least one of substances forming the semiconductor layer is dispersed, which is in contact with the semiconductor layer; and an electrode layer which is electrically connected to the source electrode layer or the drain electrode layer.

A display device according to the invention has an insulating surface; a gate electrode layer in which a material which is the same as at least one of substances forming the insulating surface is dispersed, on the insulating surface; a first insulating layer containing an organic material over the gate electrode layer; a second insulating layer containing an inorganic material over the first insulating layer; a semiconductor layer over the second insulating layer; a source electrode layer in which a material which is the same as at least one of substances forming the semiconductor layer is dispersed, which is in contact with the semiconductor layer; a drain electrode layer in which a material which is the same as at least one of substances forming the semiconductor layer is dispersed, which is in contact with the semiconductor layer; a third insulating layer containing an organic material over the source electrode layer and the drain electrode layer; and a fourth insulating layer containing an inorganic material over the third insulating layer, wherein the third insulating layer and the fourth insulating layer have opening reaching the source electrode layer or the drain electrode layer, a wiring layer in contact with the source/drain electrode layer is in the opening, and an electrode layer in contact with the wiring layer.

A television device according to the invention can be manufactured with a display screen including the display device having the above structure.

As to a manufacturing method of a thin film transistor, a conductive layer is formed on an insulating surface by discharging a composition containing a conductive material in which a material which is the same as at least one of substances forming the insulating surface is dispersed.

A manufacturing method of a thin film transistor includes the steps of: forming a conductive layer by discharging a composition containing a conductive material; forming a first insulating layer containing an organic material over the conductive layer; forming a second insulating layer containing an inorganic material over the first insulating layer; and forming a semiconductor layer over the second insulating layer.

A manufacturing method of a thin film transistor includes the steps of: forming a conductive layer on an insulating surface by discharging a composition containing a conductive material in which a material which is the same as at least one of substances forming the insulating surface is dispersed; forming a first insulating layer containing an organic material over the conductive layer; forming a second insulating layer containing an inorganic material over the first insulating layer; and forming a semiconductor layer over the second insulating layer.

A manufacturing method of a thin film transistor includes the steps of: forming a first conductive layer on an insulating surface by discharging a composition containing a conductive material in which a material which is the same as at least one of substances forming the insulating surface is dispersed; forming a first insulating layer containing an organic material over the first conductive layer; forming a second insulating layer containing an inorganic material over the first insulating layer; forming a semiconductor layer over the second insulating layer; and forming a second conductive layer in which a material which is the same as at least one of substances forming the semiconductor layer is dispersed, which is in contact with the semiconductor layer.

A manufacturing method of a thin film transistor includes the steps of: forming a first conductive layer on an insulating surface by discharging a composition containing a conductive material in which a material which is the same as at least one of substances forming the insulating surface is dispersed; forming a first insulating layer containing an organic material over the first conductive layer; forming a second insulating layer containing an inorganic material over the first insulating layer; forming a semiconductor layer over the second insulating layer; forming a second conductive layer by discharging a composition containing a conductive material in which a material which is the same as at least one of substances forming the semiconductor layer is dispersed, which is in contact with the semiconductor layer; forming a third insulating layer containing an organic material over the second conductive layer; and forming a fourth insulating layer containing an inorganic material over the third insulating layer, forming opening reaching the second conductive layer in the third insulating layer and the fourth insulating layer and forming a third conductive layer in contact with the second conductive layer in the opening.

A manufacturing method of a display device includes the steps of: forming a gate electrode layer on an insulating surface by discharging a composition containing a conductive material in which a material which is the same as at least one of substances forming the insulating surface is dispersed; forming an insulating layer over the gate electrode layer; forming a semiconductor layer over the insulating layer; forming a source electrode layer and a drain electrode layer which is in contact with the semiconductor layer; and forming an electrode layer which is electrically connected to the source electrode layer or the drain electrode layer.

A manufacturing method of a display device comprising the steps of: forming a gate electrode layer by discharging a composition containing a conductive material; forming a first insulating layer containing an organic material over the gate electrode layer; forming a second insulating layer containing an inorganic material over the first insulating layer; forming a semiconductor layer over the second insulating layer; forming a source electrode layer and a drain electrode layer which are in contact with the semiconductor layer; and forming an electrode layer which is electrically connected to the source electrode layer or the drain electrode layer.

A manufacturing method of a display device includes the steps of: forming a gate electrode layer on an insulating surface by discharging a composition containing a conductive material in which a material which is the same as at least one of substances forming the insulating surface is dispersed; forming a first insulating layer containing an organic material over the gate electrode layer; forming a second insulating layer containing an inorganic material over the first insulating layer; forming a semiconductor layer over the second insulating layer; forming a source electrode layer and a drain electrode layer which are in contact with the semiconductor layer; and forming an electrode layer which is electrically connected to the source electrode layer or the drain electrode layer.

A manufacturing method of a display device includes the steps of: forming a gate electrode layer on an insulating surface by discharging a composition containing a conductive material in which a material which is the same as at least one of substances forming the insulating surface is dispersed; forming a first insulating layer containing an organic material over the gate electrode layer; forming a second insulating layer containing an inorganic material over the first insulating layer; forming a semiconductor layer over the second insulating layer; forming a source electrode layer and a drain electrode layer by discharging a composition containing a conductive material in which a material which is the same as at least one of substances forming the semiconductor layer is dispersed, which is in contact with the semiconductor layer; and forming an electrode layer which is electrically connected to the source electrode layer or the drain electrode layer.

A manufacturing method of a display device includes the steps of: forming a gate electrode layer on an insulating surface by discharging a composition containing a conductive material in which a material which is the same as at least one of substances forming the insulating surface is dispersed; forming a first insulating layer containing an organic material over the gate electrode layer; forming a second insulating layer containing an inorganic material over the first insulating layer; forming a semiconductor layer over the second insulating layer; forming a source electrode layer and a drain electrode layer by discharging a composition containing a conductive material which is the same as at least one of substances forming the semiconductor layer is dispersed, which is in contact with the semiconductor layer; forming a third insulating layer containing an organic material over the source electrode layer and the drain electrode layer; forming a fourth insulating layer containing an inorganic material over the third insulating layer, forming an opening reaching the source electrode layer or the drain electrode layer in the third insulating layer and the fourth insulating layer; forming a wiring layer in contact with the semiconductor layer in the opening; and forming an electrode layer in contact with the wiring layer.

According to the present invention, a thin film transistor or a component forming a display device can be formed with a desired pattern and good adhesion. Further, the material loss and costs can be reduced. Hence, a high-performance and highly reliable display device can be manufactured with high yield.

BRIEF DESCRIPTION OF THE DRAWING

FIGS. 2A to 2D are figures describing the present invention.

FIGS. 13A to 13D are figures describing a structure of a light emitting element which can be applied to the present invention.

FIGS. 20A and 20B are figures showing electronic devices to which the present invention is applied.

FIG. 23 is an equivalent circuit diagram of an EL display panel according to the present invention.

FIG. 24 is a top view describing an EL display module according to the present invention.

FIGS. 31A to 31C are AFM micrograph and AFM measurement data of silver wirings formed by a droplet discharge method.

DETAILED DESCRIPTION OF THE INVENTION

Embodiment Mode

Figure 1A:
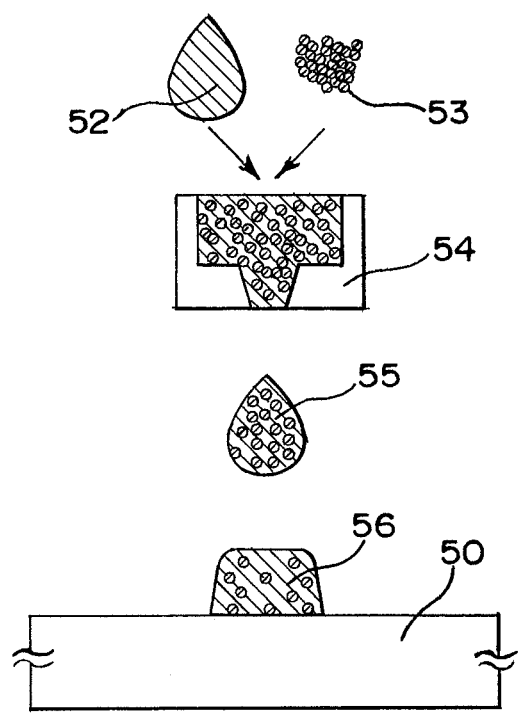
FIGS. 1A and 1B are figures describing the present invention.

Embodiment Modes and Embodiment of the present invention will be described in detail with reference to the accompanying drawings. However, the present invention is not limited to the following description and it is easily understood by those skilled in the art that various changes and modifications are possible, unless such changes and modifications depart from the content and the scope of the present invention. Therefore, the present invention is to be interpreted without limitation to the description in embodiment modes and the embodiment shown below. Note that, in the structure of the present invention described hereinafter, the same reference numerals denote the same parts or parts having the same functions in different drawings and the explanation will not be repeated.

An embodiment mode according to the present invention is described with reference to FIGS. 1A to 1D, 2A and 2B, and 28.

One feature of the present invention is that at least one or more of components required to manufacture a display panel, such as a conductive layer for forming a wiring layer or an electrode, or a mask layer for forming a predetermined pattern is/are formed by a method capable of selectively forming a pattern to the desired shape to manufacture a display device. In the present invention, a component (also referred to as a pattern) denotes a conductive layer such as a gate electrode layer, a source electrode layer, or a drain electrode layer; a semiconductor layer; a mask layer; an insulating layer; or the like, which constitutes a thin film transistor and a display device, and the pattern includes any component formed so as to have a predetermined shape. A droplet discharge (ejection) method (including an ink-jet method, depending on its mode) that can form a conductive layer, an insulating layer, or the like into a predetermined pattern by selectively discharging (ejecting) a droplet of a compound mixed for a particular purpose is employed as the method capable of selectively forming a pattern to the desired shape. In addition, a method capable of transferring or drawing a component in the desired pattern, for example, various printing methods (a method for forming a pattern to the desired shape, such as screen (mimeograph) printing, offset (lithography) printing, relief printing or gravure (intaglio) printing or the like can also be employed.

In this embodiment mode, a method of forming a desired pattern by discharging (ejecting) a compound including a component forming material, which is fluid, as a droplet is used. A pattern is formed by discharging a droplet including a component forming material to a component formation region, and the composition is fixed by baking, drying, and the like to form a desired pattern.

Figure 28:
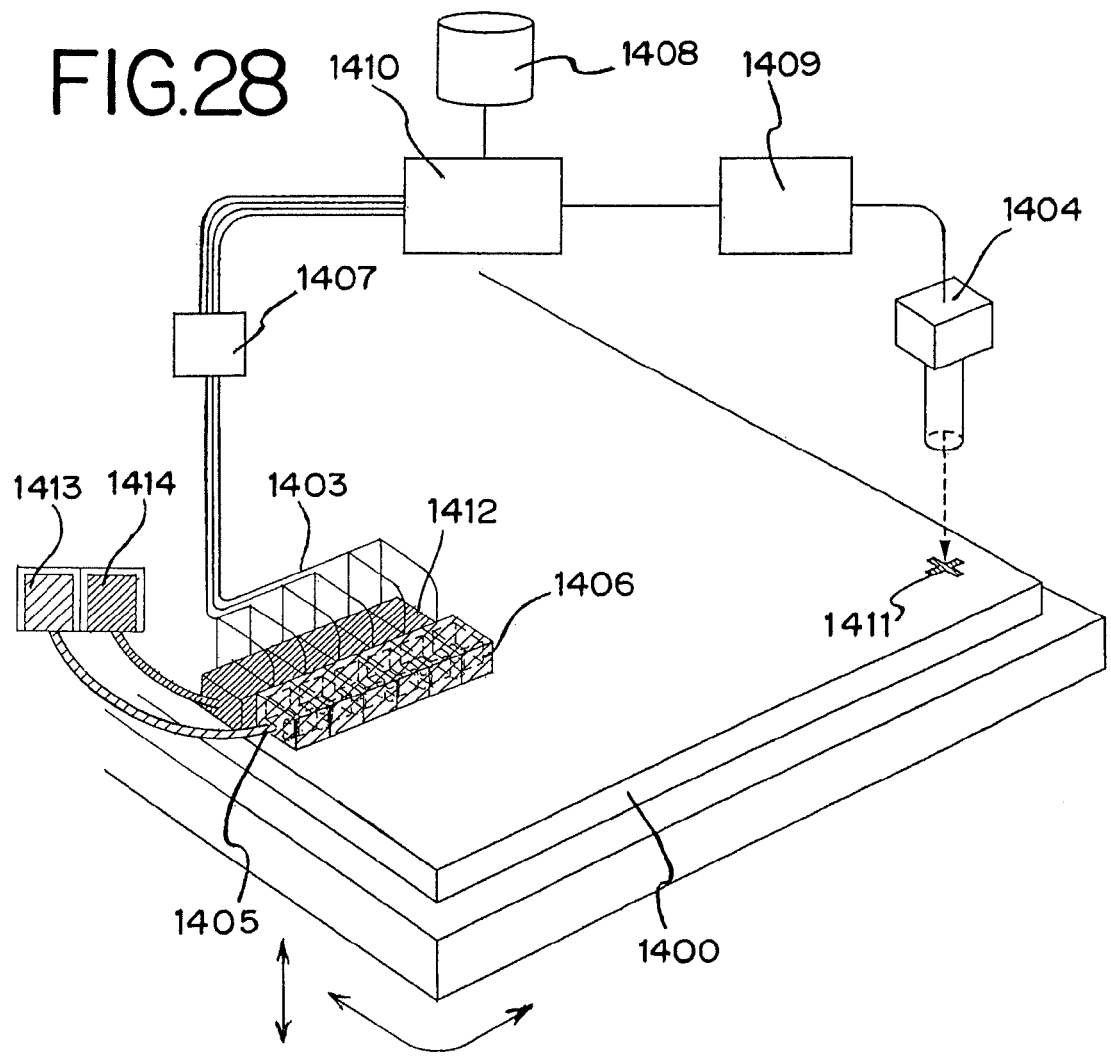
FIG. 28 is a figure describing a structure of a droplet discharge system which is applicable to the present invention.

One mode of a droplet discharge system used for forming a pattern is shown in FIG. 28. Each of heads 1405 and 1412 of a droplet discharge means 1403 is connected to a control means 1407, and is controlled by a computer 1410, so that a preprogrammed pattern can be formed. The formation position may be determined based on a marker 1411 that is formed over a substrate 1400, for example. Alternatively, a reference point can be fixed based on an edge of the substrate 1400. The reference point is detected by an imaging means 1404, and changed into a digital signal by an image processing means 1409. Then, the digital signal is recognized by the computer 1410 to generate a control signal, and the control signal is transmitted to the control means 1407. An image sensor using a charge coupled device (CCD) and a complementary metal oxide semiconductor (CMOS) or the like can be used for the imaging means 1404. Naturally, information about a pattern to be formed over the substrate 1400 is stored in a storage medium 1408, and the control signal is transmitted to the control means 1407 based on the information, so that each head 1405 and 1412 of the droplet discharge means 1403 can be individually controlled. Heads 1405 and 1412 are supplied with a material to be discharged from material supply sources 1413 and 1414 through pipes, respectively.

The head 1405 has an inside structure which has a space filled with a liquid material as shown by a dotted line 1406 and a nozzle which is a discharge opening. Although it is not shown, the head 1412 has a similar inside structure to the head 1405. The sizes of the heads 1405 and 1412 are different each other, and different materials can be simultaneously discharged with different widths. Also, a conductive material, an organic material, an inorganic material, and the like can be discharged from one head. When a droplet is drawn over a wide area such as an interlayer insulating film, one material is simultaneously discharged from a plurality of nozzles to improve a throughput, and thus, drawing can be performed. When a large-sized substrate is used, the heads 1405 and 1412 can freely scan over the substrate in a direction indicated by an arrow in FIG. 28, and a region to be drawn can be freely set. Thus, a plurality of the same patterns can be formed over one substrate.

A thin film transistor manufactured in this embodiment mode according to the invention will be described with reference to FIGS. 1A and 1B and FIGS. 2D to 2D.

In the case of forming a conductive layer or the like by a droplet discharge method, a conductive layer is formed as follows: a composition containing a conductive material which is processed into particles is discharged, and fused or welded and joined by baking to solidify the composition. Since the composition containing a conductive material is attached to the formation region by discharging, the composition is formed with including a solvent and a conductive particles to have fluidity. As to a conductive layer formed by discharging a composition containing a conductive material and baking, the conductive layer is not dense, has a defect, and has poor adhesion to an insulating surface that is a formation subject (an object on which the composition is formed) on occasions. Further, the surface of the conductive layer may have irregularities with poor planarity. Accordingly, a conductive layer (or an insulating layer) which is formed by sputtering or the like often has a columnar structure while the conductive layer formed by a droplet discharge method mostly has a polycrystalline structure with many grain boundaries.

Such defects of adhesion and planarity cause reduction in reliability of a thin film transistor, a display device, or the like to be manufactured. Two methods are shown in the invention for improving the reliability.

In one of the methods, a component forming a thin film transistor, a display device, or the like is formed with a substance having high adhesion to the formation subject added (mixed) thereinto, thereby improving adhesion between the component and the formation subject. As the substance with high adhesion, a material which is the same as at least one substances forming the formation subject is used.

In the other method, an insulating layer formed over the component is formed with a laminate of a first insulating layer containing an organic material and a second insulating layer containing an inorganic material; thus, the insulating layer sufficiently covers irregularities on the surface of the component, and is also dense enough so as to be reliable as an insulating layer.

Either one or both of the above methods may be used. The reliability can be improved by using one of the methods. Naturally, the reliability would improve more when both of the methods are used. In this embodiment, an example of using both the methods is shown.

As shown in FIG. 1, a gate electrode layer 56 is formed over a substrate 50. A composition containing a conductive material in which matter 53 containing a material which is the same as at least one of the substances forming the substrate 50 is dispersed is discharged (ejected) as a droplet 55 from a droplet discharge system 54 to attach to the substrate 50 that is a formation subject. Thereafter, drying and baking are performed to form a gate electrode layer 56.

Figure 1B:
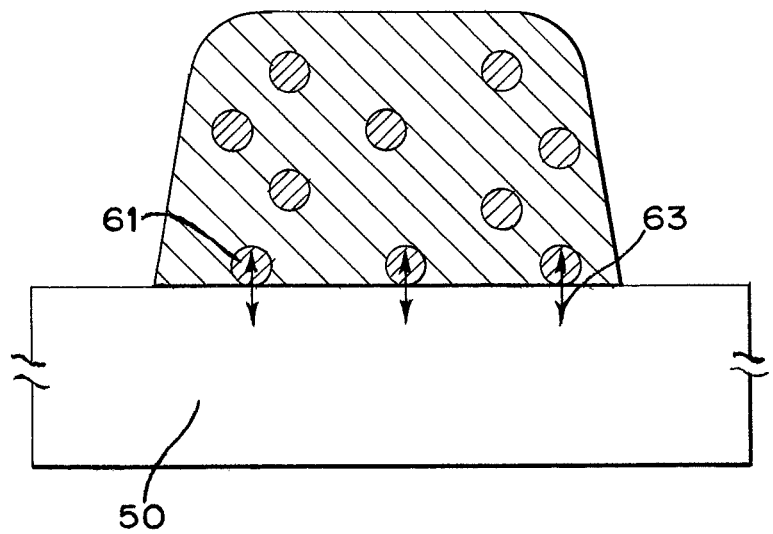
Figure 3A:
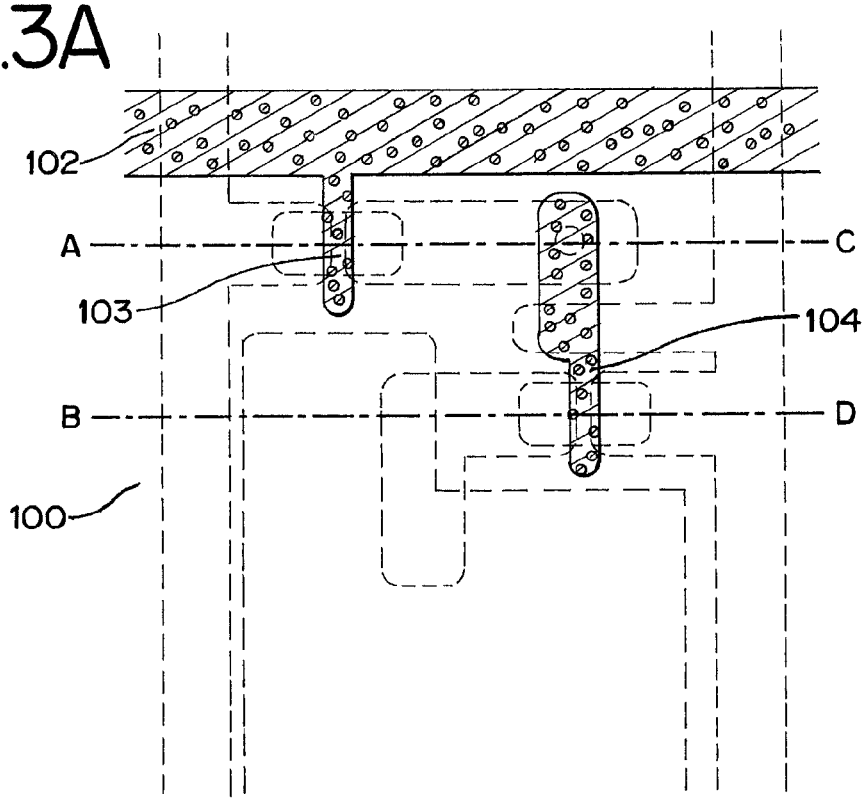
FIGS. 3A to 3C are views describing a method for manufacturing a display device according to the present invention.
Figure 3B:
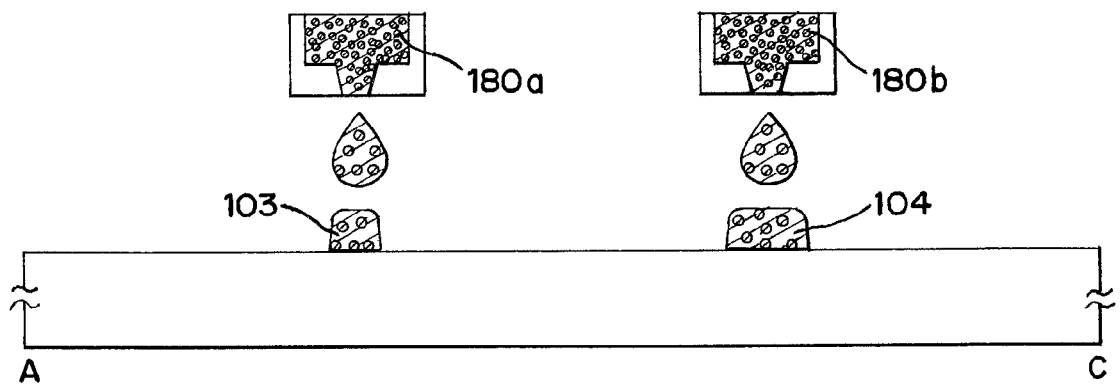
Figure 3C:
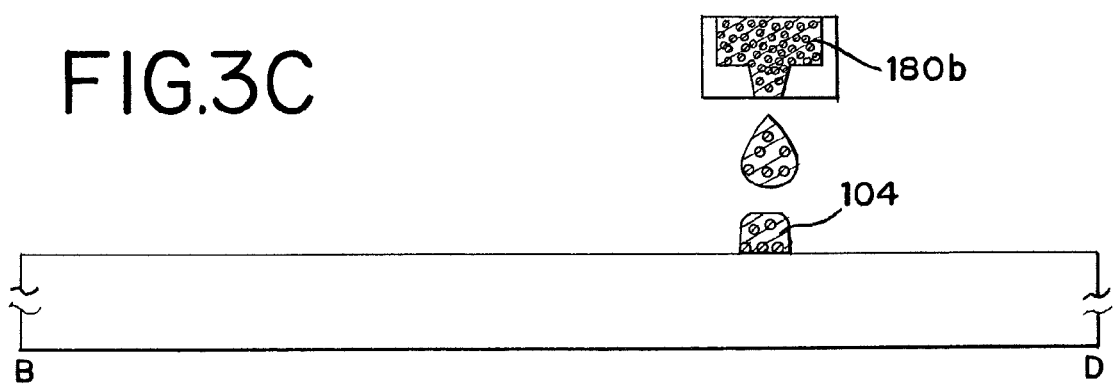

FIG. 1B shows an enlarged view of the gate electrode layer 56 formed over the substrate 50. The substrate 50 is a glass substrate in this embodiment mode. Accordingly, as a matter containing a material which is the same as at least one of substances forming the substrate 50, a matter containing silicon oxide is dispersed in the gate electrode layer 56. As the matter containing silicon oxide added into the gate electrode layer, FIG. 1B shows three matters 61 in contact with the substrate 50, each of which contains silicon oxide. The substrate 50 and the matters 61 each containing silicon oxide that have good adhesion to the substrate 50 have adhesion to each other at the interface therebetween as shown by the arrows 63. Thus, the adhesion between the gate electrode layer 56 and the substrate 50 is increased by the adhesion between the substrate 50 and the matters 61 in contact with the substrate 50, each of which contains silicon oxide.

A matter containing a material which is the same as at least one of the substances forming the surface of the formation subject may have any shape such as particle shape, columnar shape, needle shape, or plate shape. Further, a matter containing a material which is the same as at least one of a plurality of substances forming the surface of the formation subject may be aggregated to form an aggregate as a unit. The matter containing a material which is the same as at least one of substances forming the surface of the formation subject may have a size of 100 nm or less, preferably several tens nm or less. In the case of forming a thin wiring with nano level size, a conductive nanoparticles are used as the conductive material; thus, also the matter containing a material which is the same as one of substances forming the surface of the formation subject is desirably 10 nm or less. The matter containing a material which is the same as at least one of substances forming the surface of the formation subject is mixed in a conductive material to exert an effect. Specifically, the ratio of the matter containing a material which is the same as at least one of substances forming the surface of the formation subject to the conductive material may be 0.5 wt % to 4.0 wt %, preferably 1.0 wt % to 3.0 wt %. Thus, the adhesion can be improved by mixing into a conductive material only a small amount of a matter containing a material which is the same as at least one of substances forming the surface of the formation subject, which can improve the adhesion. The invention provides a method that is easier than forming a base film or performing pretreatment all over a formation region and is also advantageous in the aspect of productivity and cost.

The matter containing a material which is the same as one of substances forming the surface of the formation subject may be either a conductive material or an insulating material such as silicon, nitrogen, oxide, or nitride, and the material can be selected depending on the substance forming the formation subject surface. The oxide may include silicon oxide ($SiO_2$), boracic acid ($B_2O_3$), sodium oxide ($NaO_2$), magnesium oxide (MgO), aluminum oxide (alumina) ($Al_2O_3$) potassium oxide ($K_2O$), calcium oxide (CaO), diarsenic trioxide (arsenious acid) ($As_2O_3$) strontium oxide (SrO), antimony oxide ($Sb_2O_3$), barium oxide (BaO), indium tin oxide (ITO), ITSO containing indium tin oxide and silicon oxide, zinc oxide (ZnO), or the like, and the mixing ratio may be appropriately set in accordance with the component ratio (composition ratio) of the surface of the formation subject. Also, matters each containing a material which is the same as one of substances forming the surface of the formation subject may have a composition ratio different from the surface of the formation subject and may respectively have different sizes. Further, according to the invention, the matters each containing a material which is the same as one of substances forming the surface of the formation subject is only require to be inside the conductive layer or the insulating layer, and the dispersion state may be uniform or nonuniform. Accordingly, there may be a dense part and a sparse part in the conductive layer, or aggregation or separation of the matters may be caused in the forming step of the conductive layer.

In this embodiment mode, the gate electrode layer 56 is formed by a droplet discharge means. The droplet discharge means is a general term for one having a means of discharging a droplet such as a nozzle having a discharge opening of a composition or a head equipped with one or plural nozzles. The diameter of the nozzle included in the droplet discharge means is set in the range of from 0.02 μm to 100 μm (preferably, 30 μm or less), and the amount of the composition to be discharged from the nozzle is set in the range of from 0.001 pl to 100 pl (preferably, 0.1 pl to 40 pl, more preferably, 10 pl or less). The amount of the composition to be discharged increases in proportion to the size of the diameter of the nozzle. Further, it is preferable that the distance between an object to be processed and the discharge opening of the nozzle is as short as possible in order to drop the droplet on a desired position. Preferably, the distance is set approximately in the range from 0.1 mm to 3 mm (more preferably, 1 mm or less).

As for the composition to be discharged from the discharge opening, a conductive material dissolved or dispersed in a solvent is used. The conductive material may be fine particles or dispersed nanoparticles of a metal such as Ag, Au, Cu, Ni, Pt, Pd, Ir, Rh, W, or Al, sulfide of a metal such as Cd or Zn, an oxide of Fe, Ti, Si, Ge, Zr, Ba, or the like, or silver halide. The conductive material may be indium tin oxide (ITO), ITSO formed of indium tin oxide and silicon oxide, organic indium or organotin, zinc oxide, titanium nitride, or the like, which is used as a transparent conductive film. Particles of a single element or a plurality of elements can be mixed and used. However, as for the composition to be discharged from the discharge opening, it is preferable to use any one of the materials of gold, silver, and copper, which is dissolved or dispersed in a solvent, taking a specific resistance value into consideration. It is more preferable to use silver or copper having a low resistance value. When silver or copper is used, a barrier film may be additionally provided as a countermeasure against impurities. A silicon nitride film or nickel boron (NiB) can be used for the barrier film.

In addition, a particle in which a conductive material is coated with another conductive material to form a plurality of layers may be used. For example, a three-layer structure particle in which copper is coated with nickel boron (NiB), which is further coated with silver may be used. As for the solvent, esters such as butyl acetate and ethyl acetate; alcohols such as isopropyl alcohol and ethyl alcohol; organic solvents such as methyl ethyl ketone and acetone; water; or the like may be used. The viscosity of the composition is preferably 20 mPa·s (cp) or less. This prevents the composition from drying, or enables the composition to be smoothly discharged from the discharge opening. The surface tension of the composition is preferably 40 mN/m or less. However, the viscosity of the composition and the like may be appropriately controlled in accordance with a solvent to be used and use. For example, the viscosity of a composition in which ITO, organic indium, or organotin is dissolved or dispersed in the solvent may be set from 5 mPa·s to 20 mPa·s, the viscosity of a composition in which silver is dissolved or dispersed in the solvent may be set from 5 mPa·s to 20 mPa·s, and the viscosity of a composition in which gold is dissolved or dispersed in a solvent may be set from 5 mPa·s to 20 mPa·s.

The conductive layer may be formed by stacking a plurality of conductive materials. In addition, the conductive layer may be formed by a droplet discharge method using silver as a conductive material; thereafter, it may be plated with copper or the like. Plating may be performed by electroplating or a chemical (electroless) plating method. Plating may be performed by soaking a substrate surface into a container filled with a solution containing a plating material. The solution containing a plating material may be applied so that the solution flows over the substrate surface with the substrate placed obliquely (or vertically). When the plating is performed by applying a solution with the substrate placed vertically, there is an advantage that a process apparatus can be smaller.

The diameter of a particle of the conductor is preferably as small as possible for the purpose of preventing nozzles from being clogged and manufacturing a fine pattern, although it depends on the diameter of each nozzle, a desired shape of a pattern, and the like. Preferably, the diameter of the particle of the conductive material is 0.1 μm or less. The composition is formed by a known method such as an electrolyzing method, an atomizing method, a wet reduction method, or the like, and the particle size to be obtained is typically about from 0.01 μm to 10 μm. However, when a gas evaporation method is employed, nanoparticles protected with a dispersant are minute, about 7 nm. When the surface of each particle is covered with a coating, the nanoparticles do not aggregate in the solvent and are uniformly dispersed in the solvent at room temperature, and behaves similarly to liquid. Accordingly, it is preferable to use a coating.

Although it depends on the pattern shape or the like, the material which is the same as at least one of the substances forming the formation subject surface that is added into the composition containing a conductive material for improving adhesion preferably has small size, desirably, 100 nm or less in order to prevent nozzle clogging or to manufacture a highly fine pattern.

The process of discharging a composition may be performed under reduced pressure. In addition, when the process is performed under reduced pressure, an oxide film or the like is not formed over the surface of the conductive material, which is preferable. After discharging the composition, either or both steps of drying and baking is/are performed. Each step of drying and baking is carried out by heat treatment. For example, drying is performed for three minutes at 100° C. and baking is performed for 15 minutes to 60 minutes at a temperature of from 200° C. to 550° C., each of which has a different purpose, temperature, and period. The steps of drying and baking are performed at normal pressure or under reduced pressure by laser light irradiation, rapid thermal annealing, heating using a heating furnace, or the like. Note that the timing and the times of the heat treatment is not particularly limited. The substrate may be heated in advance to favorably perform the steps of drying and baking. The temperature of the substrate at the time depends on the material of the substrate or the like, but it is typically 100° C. to 800° C. (preferably, from 200° C. to 550° C.). Through the steps, nanoparticles are made in contact with each other and fusion and welding are accelerated by hardening and shrinking a peripheral resin while the solvent in the composition is volatilized or the dispersant is chemically removed.

A continuous wave or pulsed gas laser or a solid-state laser may be used for laser light irradiation. An excimer laser, a YAG laser, or the like can be used as the former gas laser. A laser using a crystal of YAG, $YVO_4$, $GdVO_4$, or the like which is doped with Cr, Nd, or the like can be used as the latter solid-state laser. Note that it is preferable to use a continuous wave laser in relation to the absorptance of laser light. Moreover, a so-called hybrid laser irradiation method in which pulsed and continuous wave lasers are combined may be used. However, it is preferable that the heat treatment by laser light irradiation is instantaneously performed within several microseconds to several tens of seconds so as not to damage the substrate, depending on heat resistance of the substrate. Rapid thermal annealing (RTA) is carried out by raising the temperature rapidly and heating for several microseconds to several minutes using an infrared lamp or a halogen lamp which emits light of from ultraviolet to infrared in an inert gas atmosphere. Since the treatment is performed instantaneously, only a thin film on a top surface can be substantially heated and the lower layer film is not affected. Accordingly, even a substrate having low heat resistance such as a plastic substrate is not affected.

After forming the gate electrode layer and the like by discharging a composition by a droplet discharge method, the surface thereof may be planarized by pressing with pressure to enhance the planarity. As a pressing method, irregularities may be smoothed by moving a roller-shaped object over the surface, or the surface may be vertically pressed with a flat plate-shaped object. A heat process may be performed at the time of pressing. Alternatively, unevenness on the surface may be eliminated with an air knife after softening or melting the surface with a solvent or the like. A CMP method may be also used for polishing the surface. This step may be applied for planarizing a surface when irregularities are caused through a droplet discharge method.

A gate insulating layer is formed over the gate electrode layer 56. In the invention, a plurality of gate insulating layers are layered to improve the planarity of the gate insulating layer surface and increase the density. First, as shown in FIG. 2A, a first insulating layer 57a containing an organic material is formed. The first insulating layer 57a is an organic insulating material containing an organic material, so that it can be formed by a wet method (wet process) such as an application method such as dip coating or spin coating, a droplet discharge method, or a printing method (a method by which a pattern can be directly formed, such as screen printing or offset printing). An application method can be applied to a surface having steps with large irregularities to give good coverage; thus, the planarity of the surface can be improved.

Next, a second insulating layer 57b is formed on the first insulating layer 57a. The second insulating layer 57b is an inorganic insulating material containing an inorganic material, so that it can be formed by a dry method (dry process) such as vacuum deposition, ion plating, an ion beam method, PVD, CVD, sputtering, RF magnetron sputtering, and plasma spraying. A fine film can be formed by vapor deposition so that superior electrical characteristics such as high dielectric strength can be imparted to a gate insulating layer. In this embodiment mode, a second insulating layer is formed using silicon nitride (SiN). Note that a rare gas element such as Ar may be included to be mixed in the gate insulating layer so as to form a fine insulating layer with less gate leakage current at a low film formation temperature.

By applying the invention, a gate insulating layer which cause both effects of improvements in planarity and electrical characteristics (strength) can be formed.

A resin material such as epoxy resin, phenol resin, novolac resin, acrylic resin, melamine resin, urethane resin, acrylic acid, methacrylic acid and derivative thereof or a polymer such as polyimide, aromatic polyamide, polybenzimidazole, a compound material formed by polymerization of a siloxane polymer having a Si—O—Si bond, or the like may be used as a material for forming the first insulating layer 57a. Preferably, the film thickness be several tens nm to 500 nm. A first insulating layer is formed by using a composition containing a siloxane polymer in this embodiment mode.

The second insulating layer 57b can be formed with an insulating material such as silicon oxide ($SiO_2$), silicon nitride (SiN), silicon oxynitride (SiON), silicon nitride oxide (SiNO), aluminum oxide ($Al_2O_3$), aluminum nitride (AlN), aluminum (AlON) oxynitride, or aluminum nitride oxide (AlNO) can be used. Silicon oxynitride and aluminum oxynitride has more oxygen than nitrogen in terms of the component ratio, and silicon nitride oxide and aluminum nitride oxide has more nitrogen than oxygen in terms of the component ratio. The film thickness is preferably several tens nm to 300 nm.

The proportion of the film thickness of the first insulating layer 57a to the second insulating layer 57b is controlled in accordance with the surface shape and the film thickness of the gate electrode to be covered, the desired planarity, and the electrical characteristics; thus, an optimum gate insulating layer can be formed. Thus, the characteristics of the gate insulating layer can be controlled; accordingly, wide range of the characteristics desired for a thin film transistor or a display device can be obtained. Further, each of the first insulating layer 57a containing an organic material and the second insulating layer 57b containing an inorganic material may be a stack having a plurality of layers. In this case, the stack is required to have two or more layers including at least a first insulating layer containing an organic material, with which good coverage and planarity can be achieved, and a second insulating layer containing an inorganic material, with which high density can be achieved.

A semiconductor layer 58 and an n-type semiconductor layer 59 that is a semiconductor layer having one conductivity type are formed over the gate electrode layer 56, the first insulating layer 57a, and the second insulating layer 57b. A semiconductor layer having one conductivity type may be formed as necessary. An n-type semiconductor layer is formed so that an NMOS structure of an n-channel TFT, a PMOS structure of a p-channel TFT formed with a p-type semiconductor layer, and a CMOS structure of an n-channel TFT and a p-channel TFT can be manufactured. Further, an n-channel TFT or a p-channel TFT can be formed by making an impurity region into a semiconductor layer by adding an element which imparts conductivity to impart conductivity.

An amorphous semiconductor (hereinafter also referred to as an "AS") manufactured by a vapor phase growth method or sputtering using a semiconductor material gas typified by silane or germane; a polycrystalline semiconductor that is formed by crystallizing the amorphous semiconductor by utilizing light energy or thermal energy; a semiamorphous (also referred to as microcrystalline or microcrystal) semiconductor (hereinafter also referred to as a "SAS"); or the like can be used as a material for forming the semiconductor layer 58.

The SAS is a semiconductor having an intermediate structure between an amorphous structure and a crystalline structure (including a single crystal and a polycrystal) and having a third state which is stable in terms of free energy, and includes a crystalline region having short-range order and lattice distortion. A crystalline region of from 0.5 nm to 20 nm can be observed in at least a part of the film. When silicon is contained as the main component, a Raman spectrum is shifted to a lower frequency than 520 $cm^{-1}$. A diffraction peak of (111) or (220) to be caused by a crystal lattice of silicon is observed in X-ray diffraction. Hydrogen or halogen of at least 1 atomic % or more is contained to terminate a dangling bond. The SAS is formed by glow discharge decomposition (plasma CVD) of a silicon source gas. $SiH_4$ is used as a typical silicon source gas. Alternatively, $Si_2H_6$, $SiH_2Cl_2$, $SiHCl_3$, $SiCl_4$, $SiF_4$, or the like can also be used as the silicon source gas. Further, $F_2$ or $GeF_4$ may be mixed. This silicon source gas may be diluted with $H_2$, or $H_2$ and one or more rare gas elements selected from He, Ar, Kr, and Ne. The dilution ratio ranges from 1:2 to 1:1000. The pressure ranges approximately from 0.1 Pa to 133 Pa, and the power frequency ranges from 1 MHz to 120 MHz, preferably from 13 MHz to 60 MHz. The substrate heating temperature may be 300° C. or less, and the film can also be formed at a temperature from 100° C. to 200° C. It is desirable that an atmospheric constituent impurity such as oxygen, nitrogen, or carbon is $1 \times 10^{20}$ atoms/$cm^3$ or less as an impurity element in the film; specifically, the oxygen concentration is $5 \times 10^{19}$ atoms/$cm^3$ or less, preferably $1 \times 10^{19}$ atoms/$cm^3$ or less. A preferable SAS can be obtained by further promoting lattice distortion by adding a rare gas element such as helium, argon, krypton or neon to enhance stability. Additionally, a SAS layer formed using a hydrogen-based gas may be formed over a SAS layer formed using a fluorine-based gas.

The semiconductor layer is formed using an amorphous semiconductor, typically, hydrogenated amorphous silicon, or a crystalline semiconductor, typically, polysilicon. Polysilicon (polycrystalline silicon) includes a high-temperature polysilicon which mainly contains polysilicon that is formed under a process temperature of 800° C. or more, a low-temperature polysilicon which mainly contains polysilicon that is formed under a process temperature of 600° C. or less, and a polysilicon which is crystallized by adding an element which promotes crystallization. Naturally, as described above, a semiconductor which includes a crystalline phase in a part of a semiamorphous semiconductor or a semiconductor layer may be used.

In the case where a crystalline semiconductor layer is used as the semiconductor layer, a known method (laser crystallization, thermal crystallization, a thermal crystallization method using an element promoting crystallization such as nickel, or the like) may be employed as a method for manufacturing the crystalline semiconductor layer. A microcrystalline semiconductor which is a SAS can be crystallized by being irradiated with laser light to improve the crystallinity. In the case where an element promoting crystallization is not used, the hydrogen is released until hydrogen concentration contained in an amorphous silicon film becomes $1 \times 10^{20}$ atoms/cm$^3$ or less by heating the amorphous silicon film at a temperature of 500° C. for one hour in a nitrogen atmosphere before irradiating the amorphous silicon film with laser light. This is because a film is damaged when the amorphous silicon film containing much hydrogen is irradiated with laser light.

Any method can be used for introducing a metal element into the amorphous semiconductor layer as long as the method is capable of making the metal element exist on the surface of or inside the amorphous semiconductor layer. For example, sputtering, CVD, a plasma treatment (including plasma CVD), an adsorption method, or a method for applying a metal salt solution can be employed. Among them, the method using a solution is simple and easy and is advantageous in terms of easy concentration control of the metal element. It is preferable to form an oxide film by UV light irradiation in an oxygen atmosphere, a thermal oxidation method, a treatment with ozone water or hydrogen peroxide including a hydroxyl radical, or the like in order to improve wettability of the surface of the amorphous semiconductor layer and to spread the aqueous solution over the entire surface of the amorphous semiconductor layer.

In addition, heat treatment and laser light irradiation may be combined to crystallize the amorphous semiconductor layer. Alternatively, one of the heat treatment and the laser light irradiation may be performed plural times.

A crystalline semiconductor layer may be directly formed over the substrate by a linear plasma method. Alternatively, a crystalline semiconductor layer may be selectively formed over the substrate by using a linear plasma method.

The crystalline semiconductor layer can be formed by a printing method, a spray method, spin coating, a droplet discharge method, or the like using an organic semiconductor material. In this case, since the above etching step is not required, the number of steps can be reduced. A low molecular weight material, a high molecular weight material, or the like is used for the organic semiconductor, and in addition, a material such as an organic pigment, a conductive high molecular weight material can be used. A π-electron conjugated high molecular weight material having a skeleton constituted by a conjugated double bonds is preferably used as an organic semiconductor material used in the present invention. Typically, a soluble high molecular weight material such as polythiophene, polyfluoren, poly(3-alkylthiophene), a polythiophene derivative or pentacene can be used.

There is an organic semiconductor material which can be treated after the deposition of a soluble precursor to form a first semiconductor region according to the invention. Note that polythienylenevinylene, poly(2,5-thienylenevinylene), polyacetyrene, polyacetyrene derivative, polyallylenevinylene or the like can be used as such an organic semiconductor material formed by using a precursor.

In converting the precursor to an organic semiconductor, a reaction catalyst such as a hydrogen chloride gas is added in addition to a heat treatment. The following can be applied as a typical solvent which dissolves the soluble organic semiconductor material: toluene, xylene, chlorobenzene, dichlorobenzene, anisole, chloroform, dichloromethane, γ butyl lactone, butyl cellosolve, cyclohexane, NMP (N-methyl-2-pyrrolidone), cyclohexanone, 2-butanone, dioxane, dimethylformamide (DMF), THF (tetrahydrofuran), or the like.

A source/drain electrode layers 60*a* and 60*b* are formed in contact with an n-type semiconductor layer 59 by discharging a droplet 67 from a droplet discharge system 66 (FIG. 2D). In this embodiment mode, the source/drain electrode layers 60*a* and 60*b* are formed by a droplet discharge method in which a composition containing a conductive material. As with the gate electrode layer 56, a matter 65 containing silicon as a material which is the same as at least one of the substances forming the formation subject surface, which has good adhesion to the formation subject surface is added to the source/drain electrode layers 60*a* and 60*b* to improve the adhesion to the formation subject region. The semiconductor layer that is the formation subject, the first insulating layer, and the substrate contains silicon, and the semiconductor layer has good adhesion to the matter 65 containing silicon. Owing to increase in the adhesion of the mixed matter 65 containing silicon, the source/drain electrode layers 60*a* and 60*b* can be formed with good adhesion and stability.

A composition containing particles of a metal such as Ag (silver), Au (gold), Cu (copper), W (tungsten), or Al (aluminum) can be used as a conductive material forming the source/drain electrode layers 60*a* and 60*b*. Further, indium tin oxide (ITO), ITSO composed of indium tin oxide and silicon oxide, organic indium, organotin, zinc oxide, or titanium nitride which has light-transmitting properties may be combined.

By combining a droplet discharge method, material loss can be prevented and cost reduction can be achieved in comparison with the entire surface coating formation by spin coating or the like.

According to the present invention, a component can be formed to a desired pattern with good adhesion, and the material loss and cost can be reduced. Hence, a thin film transistor and a display device with high performance and high reliability can be manufactured with high yield.

An embodiment mode according to the present invention will be described with reference to FIGS. 3A to 3C, 4A to 4C, 5A to 5C, 6A to 6C, 7A to 7C, 8A, 8B, 9A, 9B, 14A to 14C, 15A, and 15B. More specifically, a method for manufacturing a display device having a channel etch type thin film transistor according to the present invention will be described. Each of FIGS. 3A, 4A, 5A, 6A, and 7A shows a top view of a pixel area in a display device, each of FIGS. 3B, 4B, 5B, 6B, and 7B shows a cross-sectional view taken along line A-C in FIGS. 3A, 4A, 5A, 6A and 7A, and each of FIGS. 3C, 4C, 5C, 6C and 7C shows a cross-sectional view taken along line B-D in FIGS. 3A, 4A, 5A, 6A and 7A.

Figure 14A:
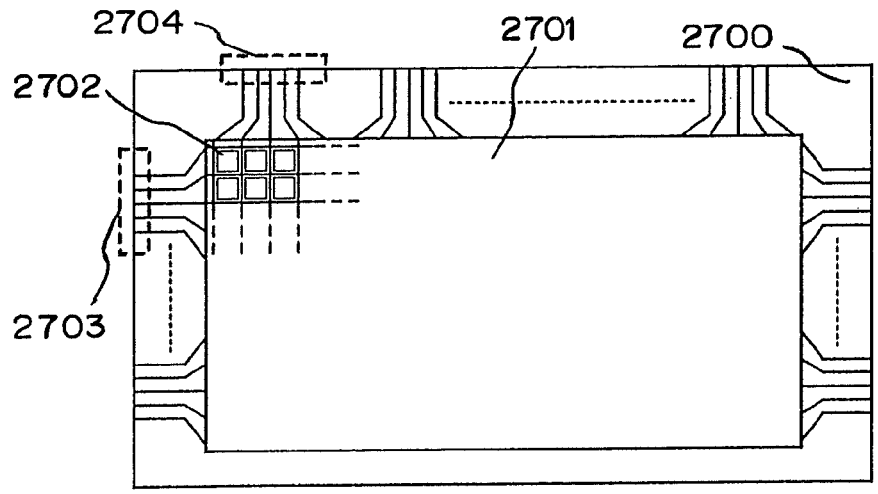
FIGS. 14A to 14C are top views of a display device according to the present invention.

FIG. 14A is a top view showing a structure of a display panel according to the present invention. A pixel area 2701 in which pixels 2702 are arranged in matrix, a scan line input terminal 2703, and a signal line input terminal 2704 are formed over a substrate 2700 having an insulating surface. The number of the pixels may be determined in accordance with various standards. The number of pixels of XGA may be 1024×768×3 (RGB), that of UXGA may be 1600×1200×3 (RGB), and that of a full-spec high vision may be 1920×1080×3 (RGB).

The pixels 2702 are arranged in matrix by intersecting a scan line extended from the scan line input terminal 2703 and a signal line extended from the signal line input terminal 2704. Each of the pixels 2702 is provided with a switching element and a pixel electrode connected thereto. A typical example of the switching element is a TFT. The gate electrode of the TFT is connected to the scan line, and the source or drain thereof is connected to the signal line, which enables each pixel to be independently controlled by a signal input from outside.

Figure 15A:
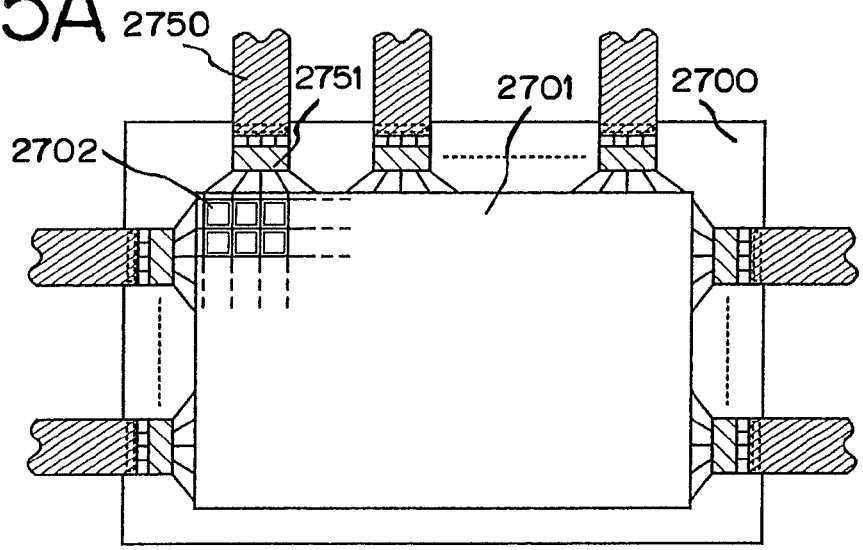
FIGS. 15A and 15B are top views of a display device according to the present invention.
Figure 15B:
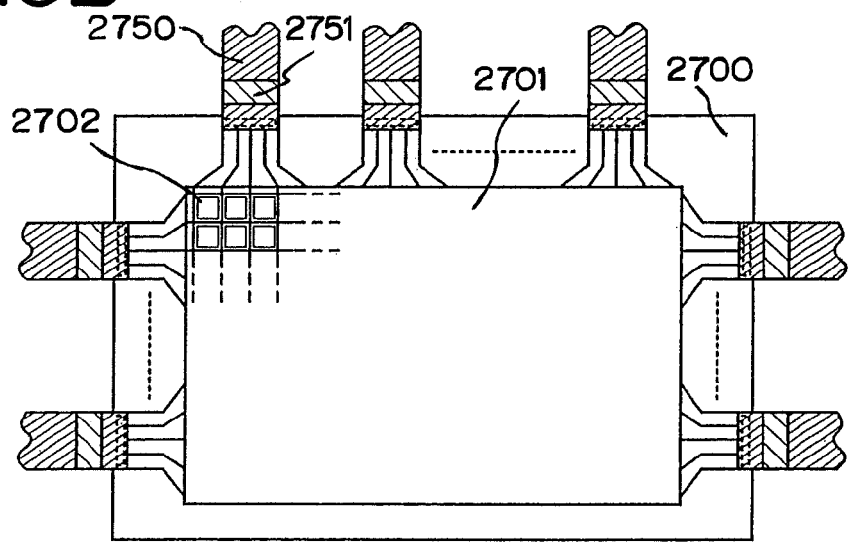

FIG. 14A shows a structure of a display panel in which a signal to be input to a scan line and a signal line is controlled by an external driver circuit. Alternatively, a driver IC 2751 may be mounted on a substrate 2700 by COG (Chip on Glass) method as shown in FIG. 15A. As another mounting mode, TAB (Tape Automated Bonding) may be also used as shown in FIG. 15B. The driver IC may be formed over a single crystal semiconductor substrate or may be formed with a TFT, over a glass substrate. In FIGS. 15A and 15B, a driver IC 2751 is connected to an FPC (Flexible Printed Circuit) 2750.

Figure 14B:
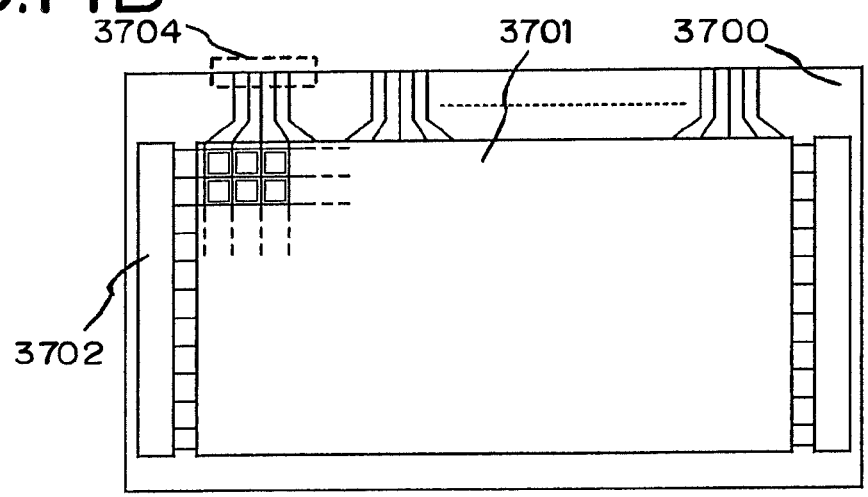
Figure 14C:
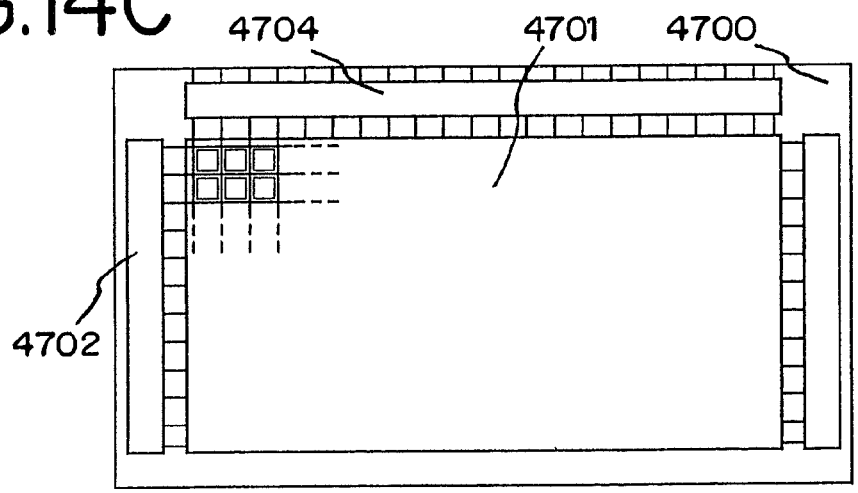

When a TFT provided in a pixel is formed of a SAS, a scan line driver circuit 3702 may be integrally formed over a substrate 3700 as shown in FIG. 14B. In FIG. 14B, a pixel area 3701 is controlled by an external driver circuit which is connected to a signal line input terminal 3704 in the same manner as in FIG. 14A. When a TFT provided in a pixel is formed of a polycrystalline (microcrystalline) semiconductor, a single crystal semiconductor, or the like having high electron mobility, a pixel area 4701, a scan line driver circuit 4702 and a signal line driver circuit 4704 can be integrally formed over a substrate 4700 as shown in FIG. 14C.

The TFT includes a semiconductor layer, a gate insulating layer, and a gate electrode layer as its main components. A wiring layer connected to a source/drain region formed in the semiconductor layer also accompanies with the TFT. A top gate type TFT in which a semiconductor layer, a gate insulating layer, and a gate electrode layer are arranged from the substrate side, a bottom gate type TFT in which a gate electrode layer, a gate insulating layer, and a semiconductor layer are arranged from the substrate side, and the like are known as typical structures of a TFT. Any one of the structures may be applied to the present invention.

A glass substrate formed of barium borosilicate glass, alumino borosilicate glass, or the like; a quartz substrate; a silicon substrate; a metal substrate; a stainless-steel substrate; or a plastic substrate which can withstand the process temperature of the manufacturing process is used for a substrate 100. The surface of the substrate 100 may be polished by CMP or the like to be planarized. In this embodiment mode, a glass substrate containing silicon oxide is used for the substrate 100. In addition, an insulating layer containing silicon may be formed over the substrate 100. The insulating layer is formed of a single layer or a laminate by a known method such as CVD, plasma CVD, sputtering, or spin coating using an oxide material or nitride material containing silicon. For example, a silicon oxide film, a silicon oxynitride film, a silicon nitride oxide film, or a laminate thereof may be used. Although the insulating layer is not necessarily formed, it has an effect of blocking contaminants or the like from the substrate 100. In this case, the gate electrode layer is formed in contact with the insulating layer formed over a substrate serving as a base. Accordingly, a material which is the same as at least one of the substances forming the insulating layer of the surface of the formation subject surface is mixed into the gate electrode layer. A material which is the same as at least one of the substances forming the insulating layer forming the formation subject surface has good adhesion to the insulating layer surface; thus, the gate electrode layer can be formed with good adhesion.

Gate electrode layers 103 and 104 are formed over a substrate 100 by droplet discharge systems 180a and 180b (FIG. 3). In this embodiment mode, the gate electrode layers 103 and 104 are formed by discharging a conductive composition added with a material which is the same as at least one of the substances forming the formation subject surface. The gate electrode layers 103 and 104 are formed using Ag, Cu, or the like as a conductive material as with Embodiment Mode 1. The adhesion between the gate electrode layers 103 and 104, and the substrate 100 can be improved owing to the adhesion between the substrate and the material which is the same as at least one of the substances forming the formation subject surface. In this embodiment mode, a matter containing silicon as the material which is the same as at least one of the substances forming the formation subject surface.

Figure 4A:
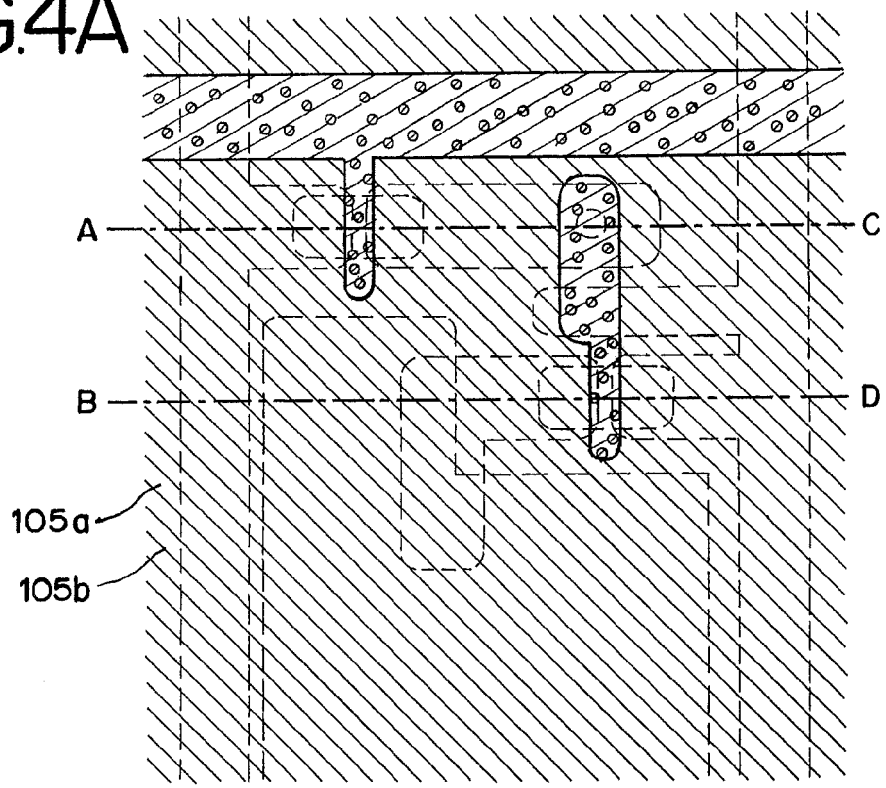
FIGS. 4A to 4C are views describing a method for manufacturing a display device according to the present invention.
Figure 4B:
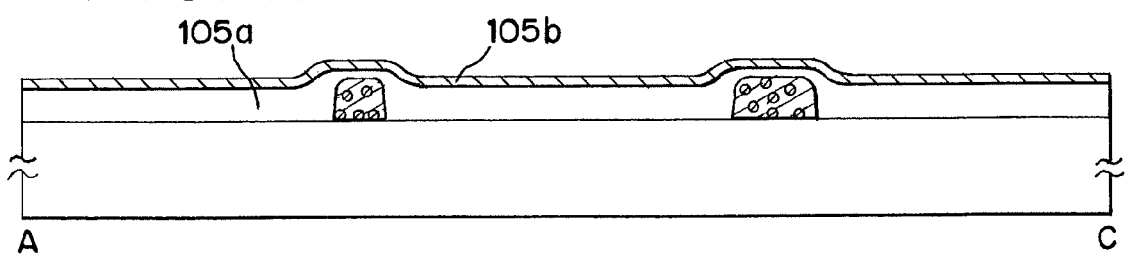
Figure 4C:
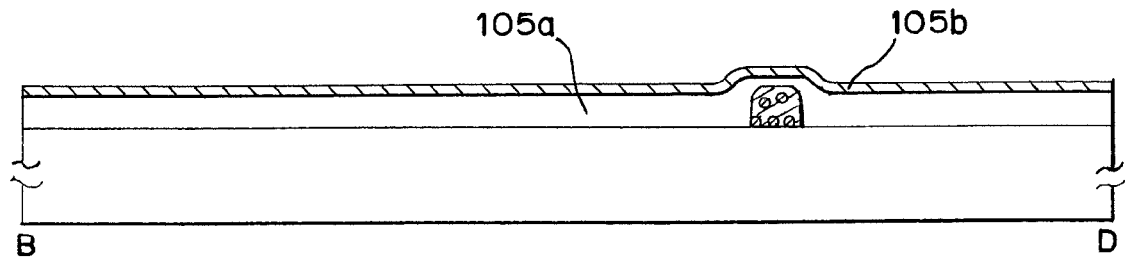
Figure 5A:
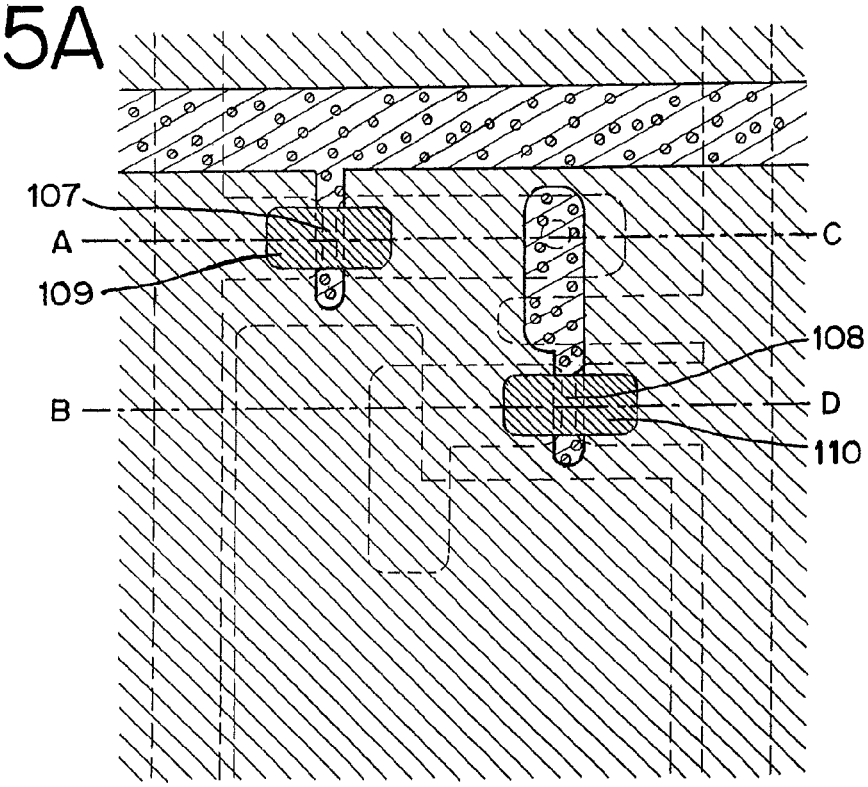
FIGS. 5A to 5C are views describing a method for manufacturing a display device according to the present invention.
Figure 5B:
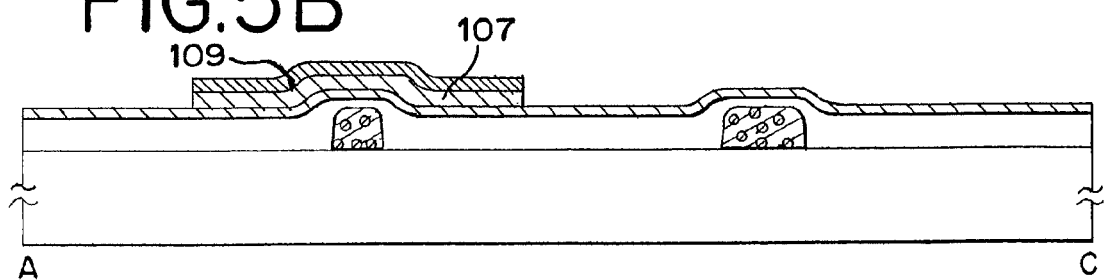
Figure 5C:
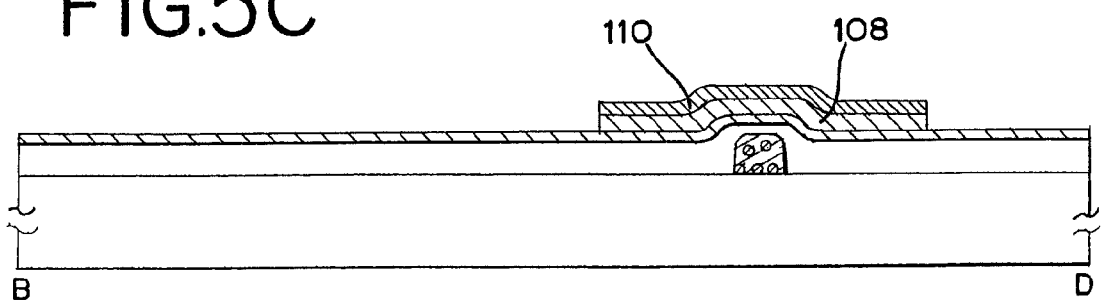

Next, first and second insulating layers 105a and 105b are formed as gate insulating layers over the gate electrode layers 103 and 104 (FIGS. 4A to 4C). In this invention, a stack with a plurality of layers are formed for the gate insulating layers in order to improve the planarity of the gate insulating layer surfaces and increase the density of the gate insulating layers. First, the first insulating layer 105a containing an organic material is formed. The first insulating layer 105a is an organic insulating layer including an organic material, so that it can be formed by a wet method (wet process) such as an application method such as dip coating or spin coating, a droplet discharge method, or a printing method (a method by which a pattern can be directly formed, such as screen printing or offset printing). An application method has advantages that a matter can be formed with good coverage even over a surface having steps with large irregularities and the planarity of the surface can be improved.

The second insulating layer 105b is formed over the first insulating layer 105a. The second insulating layer 105b is an inorganic insulating layer containing an inorganic material, so that it can be formed by a dry method (dry process) such as vacuum deposition, ion plating, an ion beam method, PVD, CVD, sputtering, RF magnetron sputtering and plasma spraying. The insulating layer can be formed so as to be a fine film by a deposition method, so that the insulating layer can have electrical characteristics with the good withstand voltage as a gate insulating layer. In the embodiment mode, the second insulating layer 105b includes silicon nitride (SiN).

By applying the invention, a gate insulating layer which cause both effects of improvements in planarity and electrical characteristics (strength) can be formed.

A semiconductor layer is formed over the second insulating layer 105b, and an n-type semiconductor layer is formed thereover as a semiconductor layer having one conductivity. The semiconductor layer is patterned using a mask or the like to form a semiconductor layer 107, a semiconductor layer 108, an n-type semiconductor layer 109, and an n-type semiconductor layer 110 (FIG. 5). Silicon that is an inorganic material is used for the semiconductor layer 107, the semiconductor layer 108, the n-type semiconductor layer 109, and the n-type semiconductor layer 110 in this embodiment mode; however, an organic semiconductor such as pentacene mentioned above can also be used. When an organic semiconductor is selectively formed by a droplet discharge method or the like, the process of patterning can be simplified.

A mask formed with an insulator such as a resist or polyimide is formed by using a droplet discharge method. An opening 145 is formed in a part of a first insulating layer 105a and a second insulating layer 105b by etching using the mask, and a part of the gate electrode layer 104 disposed in the lower layer is exposed. Either plasma etching (dry etching) or wet etching may be used for the etching. However, plasma etching is suitable to treat a large substrate. A fluorine-based gas such as $CF_4$, $NF_3$, or a chlorine-based gas such as $Cl_2$ or $BCl_3$ is used as the etching gas, and an inert gas such as He or Ar may be appropriately added. In addition, a local electrical discharge process can be performed when an atmospheric pressure discharge etching process is applied, and a mask layer need not be entirely formed over the substrate.

A mask for patterning can be formed by selectively discharging a composition. Thus formed mask makes it possible to simplify the process of patterning. A resin material such as epoxy resin, acrylic resin, phenol resin, novolac resin, melamine resin, and urethane resin. In addition, the mask may be formed by a droplet discharge method using an organic material such as benzocyclobutene, parylene, flare, or light-transmitting polyimide; a compound material made by the polymerization of such as a siloxane-based polymer; a composite material containing a water-soluble homopolymer and a water-soluble copolymer; or the like. Alternatively, a commercial resist material containing a photosensitizer may be used. For example, a typical positive type resist such as a novolac resin and a naphthoquinone diazide compound that is a photosensitizer, or a negative type resist such as a base resin and diphenylsilanediol and an acid generator may be used. In using whichever material, the surface tension and the viscosity are appropriately controlled by diluting the concentration of a solvent or adding a surfactant or the like.

Figure 6A:
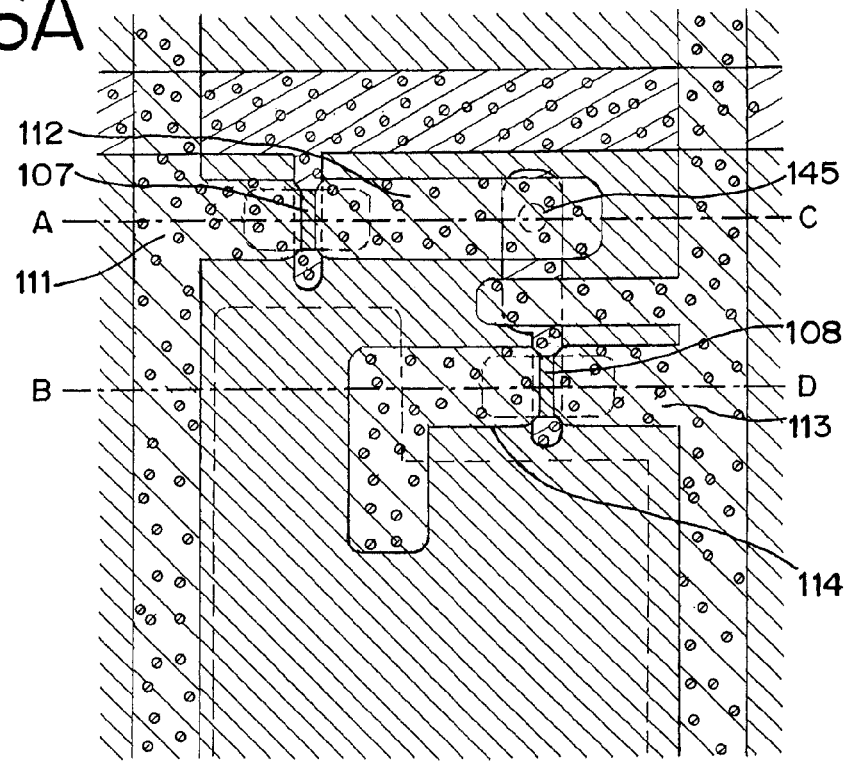
FIGS. 6A to 6C are views describing a method for manufacturing a display device according to the present invention.
Figure 6B:
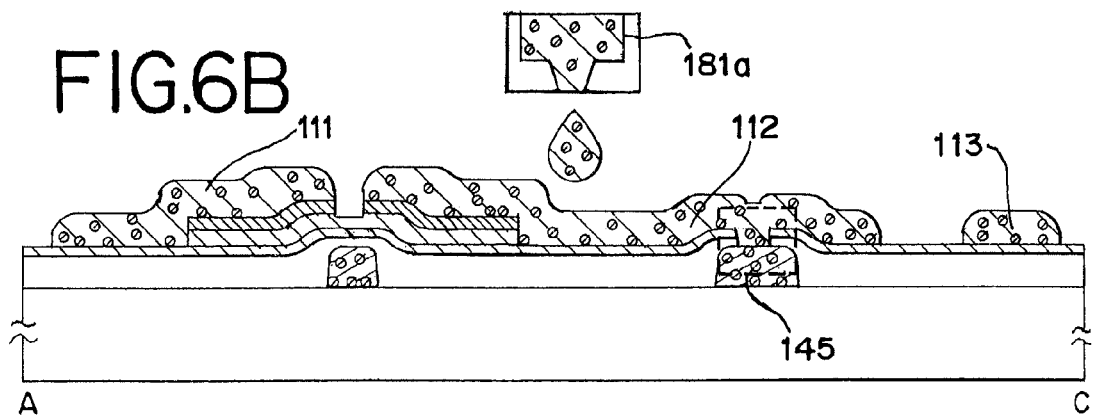
Figure 6C:
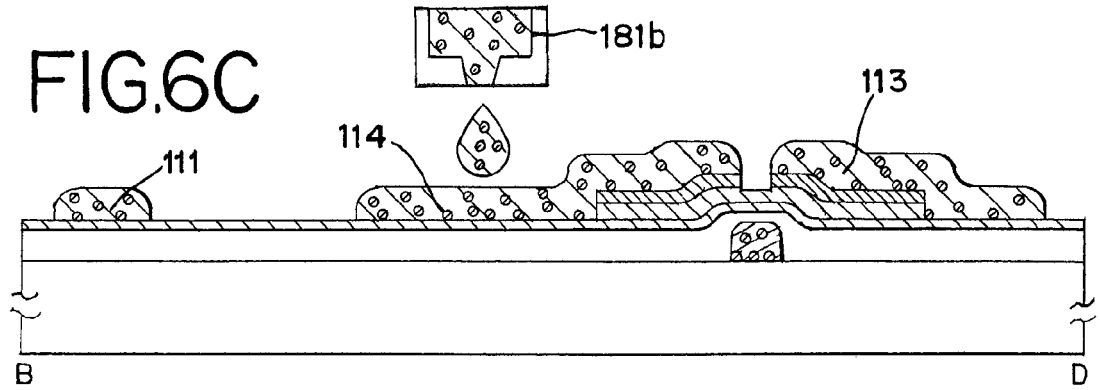

After removing the mask, a composition containing a conductive material is discharged from droplet discharge systems 181a and 181b to form source/drain electrode layers 111, 112, 113, and 114 (FIG. 6A to 6C). As with the gate electrode layer, silicon is added into the source/drain layers, as a material which is the same as at least one of substances forming a formation subject surface, which have good adhesion to the formation subject to improve the adhesion between the source/drain electrode layer and the formation subject surface. A semiconductor layer that is the formation subject, the first insulating layer, and the substrate contain silicon, and have good adhesion to a matter containing silicon. Owing to increase in the adhesion of the mixed matter containing silicon, the source/drain electrode layer 111 to 114 can be formed with good adhesion and stability.

The semiconductor layers 107 and 108, and the n-type semiconductor layer 109 are patterned using the source/drain electrode layer 111 to 114 as masks to expose the semiconductor layers 107 and 108. The source/drain electrode layer 111 also serves as a source wiring layer, and the source/drain electrode layer 113 also serves as a power supply line.

As a conductive material for forming the source/drain electrode layers 111, 112 113, and 114, a compound which mainly contains metal particles of Ag (silver), Au (gold), Cu (copper), W (tungsten), Al (aluminum), or the like can be used. Alternatively, indium tin oxide (ITO), ITSO containing indium tin oxide and silicon oxide, organic indium, organo-tin, zinc oxide, titanium nitride, or the like which has light-transmitting properties may be combined.

The source/drain electrode layer 112 and the gate electrode layer 104 are electrically connected to each other through the opening 145. A part of the source/drain electrode layer forms a capacitor element.

The source/drain electrode layers 111, 112, 113, and 114 are formed and the opening 145 may be formed using the source/drain electrode layers 111, 112, 113, and 114. The source/drain electrode layer 112 and the gate electrode layer 104 are electrically connected by forming a conductive layer in the opening 145. Such structure is advantageous in simplifying the process.

Thus, channel etch type thin film transistors 170 and 171 according to this embodiment mode are formed.

Figure 7A:
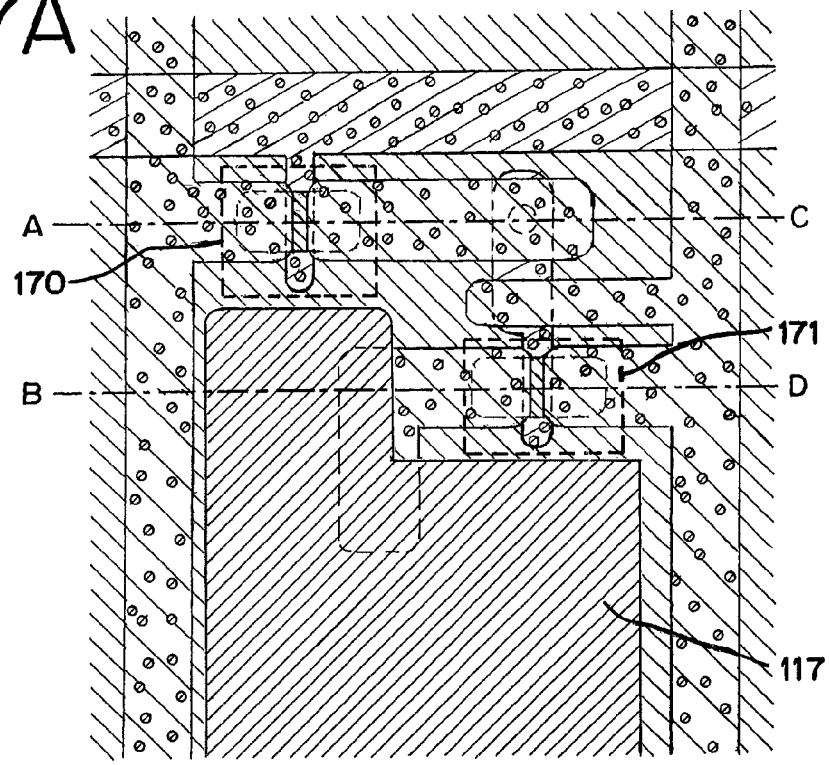
FIGS. 7A to 7C are views describing a method for manufacturing a display device according to the present invention.
Figure 7B:
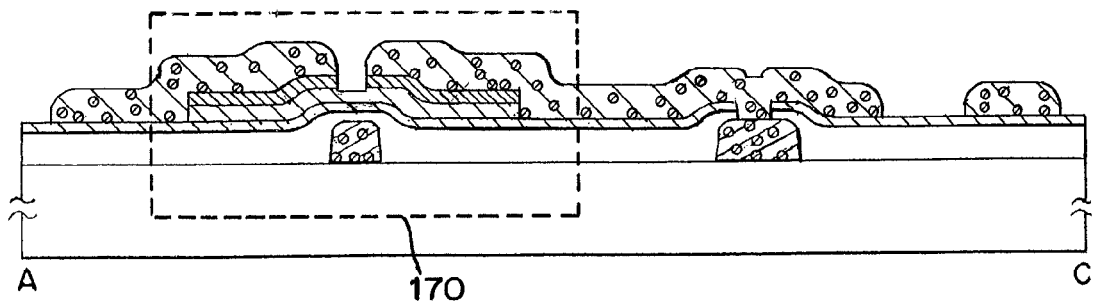
Figure 7C:
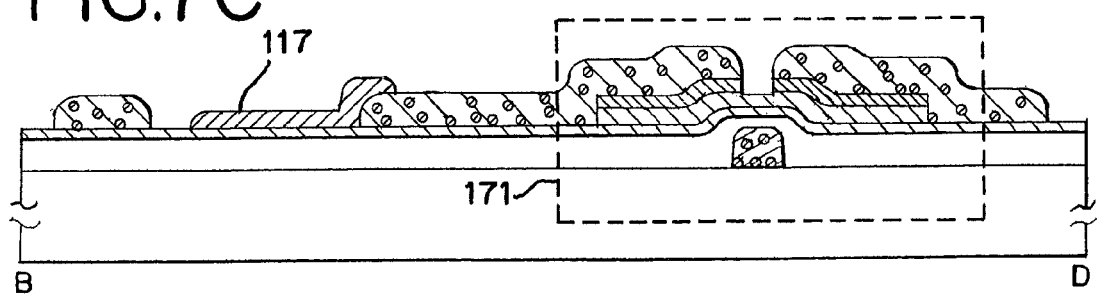

Then, a first electrode layer 117 is formed by selectively discharging a composition containing a conductive material over the second insulating layer 105b that is a gate insulating layer (FIGS. 7A to 7C). When light is emitted from the light transmitting substrate 100 side, or when a transmissive display panel is manufactured, the first electrode layer 117 may be formed by forming a predetermined pattern using a material including indium tin oxide (ITO), indium tin oxide containing silicon oxide (ITSO), indium zinc oxide (IZO) containing zinc oxide (ZnO), zinc oxide (ZnO), a material in which gallium (Ga) is doped in ZnO, or tin oxide ($SnO_2$) or the like, and by baking the pattern.

Preferably, the first electrode layer 117 may be formed of indium tin oxide (ITO), indium tin oxide containing silicon oxide (ITSO), zinc oxide (ZnO), or the like by sputtering. It is more preferable to use indium tin oxide containing silicon oxide formed by sputtering using a target of ITO containing silicon oxide of from 2% to 10% by weight. In addition, a conductive material in which ZnO is doped with gallium (Ga), or an oxide conductive material which contains silicon oxide and in which indium oxide is mixed with zinc oxide (ZnO) of from 2% to 20% by weight may be used. After the first electrode layer 117 is formed by sputtering, a mask layer may be formed by a droplet discharge method, and the desired pattern may be formed by etching. In this embodiment mode, the first electrode layer 117 is formed of a light-transmitting conductive material by a droplet discharge method. Specifically, it is formed using indium tin oxide or ITSO made of ITO and silicon oxide.

In this embodiment mode, the second insulating layer 105b is formed of silicon nitride. As a preferable structure, the first electrode layer 117 containing indium tin oxide including silicon oxide is preferably formed in close contact with the second insulating layer containing silicon nitride included in the gate insulating layer. Accordingly, an effect of increasing a rate at which light generated in an electroluminescent layer is emitted outside can be exerted. The gate insulating layer (the first insulating layer 105a, the second insulating 105b) may be interposed between the gate electrode layer or the source/drain electrode layer and the first electrode layer and may function as a capacitor element.

The first electrode layer 117 can be selectively formed over the second insulating layer 105b that is a gate insulating layer before forming the source/drain electrode layer 114. In this case, this embodiment mode has a connection structure in which the source/drain electrode layer 114 is stacked over the first electrode layer 117. When the first electrode layer 117 is formed before forming the source/drain electrode layer 114, it can be formed over a flat formation region. Therefore, the first electrode layer 117 can be formed with high planarity since good coverage and deposition properties can be obtained and polishing treatment such as CMP can be carried out sufficiently.

Figure 9A:
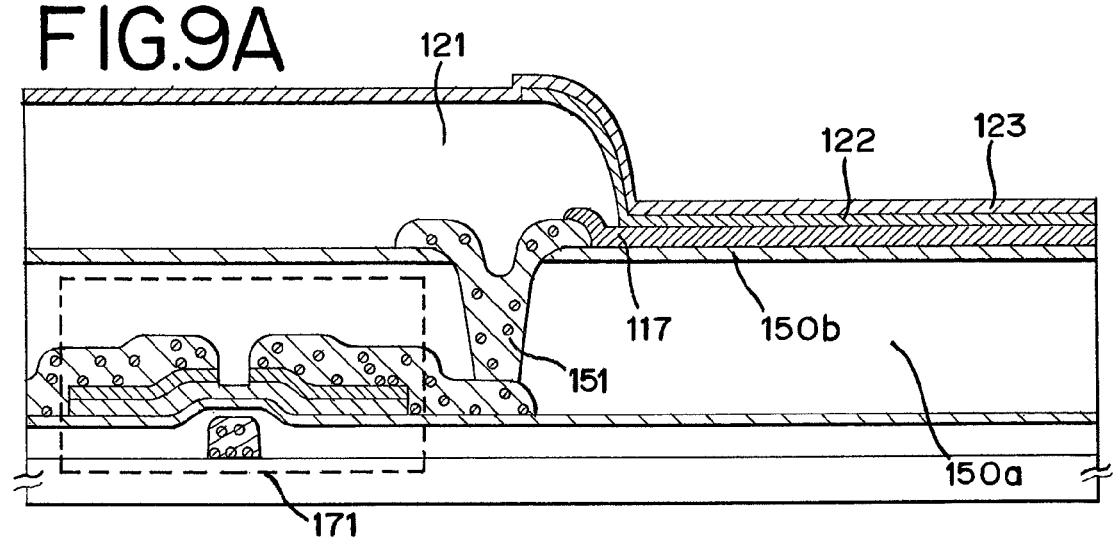
FIGS. 9A and 9B are views describing a method for manufacturing a display device according to the present invention.

As shown in FIG. 9A, a structure in which a third insulating layer 150a and a fourth insulating layer 150b which are to be interlayer insulating layers are formed over the source/drain electrode layer 114, and the insulating layers are electrically connected to the first electrode layer 117 through a wiring layer 151 may be used. The third insulating layer 150*a* and the fourth insulating layer 150*b* which are to be interlayer insulating layers can be formed in a similar manner to the first insulating layer 105*a* and the second insulating layer 105*b* which are gate insulating layers according to the invention. As to a display device shown in FIG. 9A, a material which is the same as at least one of the substances forming the source/drain electrode layer 114 in contact with the wiring layer 151 is added to form the wiring layer 151. In this embodiment mode, silicon oxide is mixed in the source/drain layer 114; therefore, silicon oxide is also added to the wiring layer 151.

The third insulating 150*a* is an insulating layer containing an organic material as with the first insulating layer 105*a* and is formed by a wet method such as an application method. The third insulating layer containing an organic material is formed with good coverage to fill the irregularities and steps; thus, the surface can be planarized.

The forth insulating 150*b* is an insulating layer containing an inorganic material as with the second insulating layer 105*b* and is formed by a dry method such as a deposition method. The fourth insulating layer containing an inorganic material can have a dense structure by employing a dry method.

By applying the invention, an interlayer insulating layer which cause both effects of improvements in planarity and electrical characteristics (strength) can be formed. Accordingly, a first electrode layer formed over the third insulating layer 150*a* and the fourth insulating layer 150*b* can be formed stably and uniformly with good coverage. The planarity is important for the first electrode layer 117 which functions as a pixel electrode to display a high definition and high quality image. According to the invention, the first electrode layer 117 can be formed over a surface with good planarity; thus, a stack of a thin light emitting layer can be formed stably to a preferable shape. Consequently, an image display device which can display a high quality image can be manufactured.

Figure 9B:
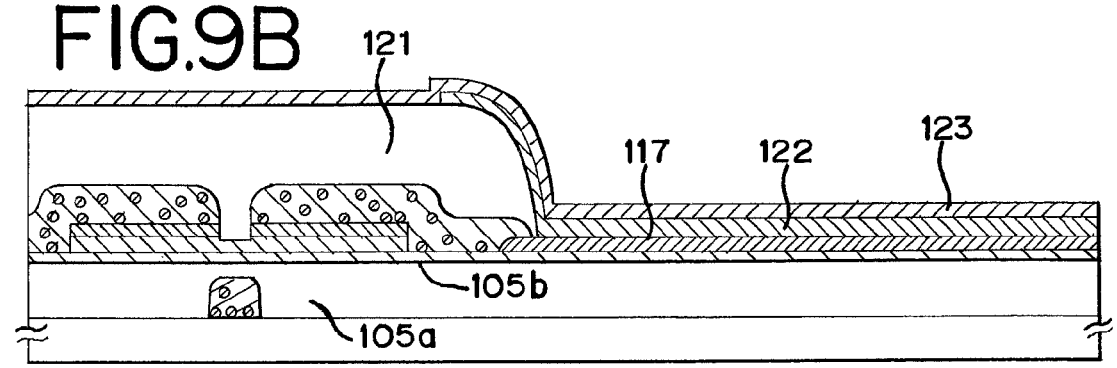

Further as shown in FIG. 9B, the first insulating layer containing an organic material, which is formed by an application method or the like can be formed relatively thick so as to fill the step due to the gate electrode layer to improve the planarity. In this case, the second insulating layer containing an inorganic material to be formed thereover can also be formed to be more dense, and electrical characteristics required for an insulating layer, such as dielectric strength can be improved.

When an EL display panel is manufactured or in the case of a structure in which generated light is emitted to the side opposite to the substrate 100 side, a compound which mainly contains metal particles of Ag (silver), Au (gold), Cu (copper), W (tungsten), or Al (aluminum), or the like can be used. Alternatively, the first electrode layer 117 may be formed by forming a transparent conductive film or a conductive film having light reflectivity by sputtering, forming a mask pattern by a droplet discharge method, and then combining etching.

The first electrode layer 117 may be polished by CMP or by cleaning with polyvinyl alcohol-based porous body so that the surface of the first conductive layer 117 is made flat. In addition, after polishing by CMP, ultraviolet irradiation or oxygen plasma treatment or the like may be performed on the surface of the first electrode layer 117.

According to the above-mentioned steps, a substrate 100 including TFTs for a display panel, in which bottom gate type TFTs 170 and 171 and a pixel electrode (the first electrode layer 117) are connected to the substrate 100 is completed. The TFT in this embodiment mode is an inverted staggered type.

Subsequently, an insulating layer (also referred to as a partition wall or a bank) 121 is selectively formed. The insulating layer 121 is formed to have an opening over the first electrode layer 117. In this embodiment mode, the insulating layer 121 is formed over the entire surface, and etched and patterned by using a mask of a resist or the like. When the insulating layer 121 is formed by a droplet discharge method or a printing method by which the insulating layer 121 can be formed directly and selectively, patterning by etching is not necessarily required. The insulating layer 121 can also be formed to have a desired shape by pretreatment according to the present invention.

The insulating layer 121 can be formed of silicon oxide, silicon nitride, silicon oxynitride, aluminum oxide, aluminum nitride, aluminum oxynitride or another inorganic insulating material; acrylic acid, methacrylic acid, or a derivative thereof; a heat-resistant polymer such as polyimide, polybenzimidazole; or an inorganic siloxane-based material, each of which contains the Si—O—Si bond among a compound including silicon, oxygen and hydrogen, an organic siloxane-based insulating material in which an organic group such as methyl or phenyl is substituted for hydrogen bound with silicon or which is formed from the inorganic siloxane-based material. The insulating layer 121 may be also formed by using a photosensitive material such as acrylic or polyimide, or a non-photosensitive material. The insulating layer 121 preferably has a shape in which a radius curvature changes continuously. Accordingly, the coverage of an electroluminescent layer 122 and a second electrode layer 123 which are formed over the insulating layer 121 is improved.

After forming the insulating layer 121 by discharging a compound by a droplet discharge method, the surface of the insulating layer may be pressed with pressure to planarize in order to improve its planarity. As a pressing method, unevenness may be smoothed by making a roller-shaped object moved over the surface, or the surface may be vertically pressed with a flat plate-shaped object. Alternatively, irregularities on the surface may be eliminated with an air knife by softening or melting the surface with a solvent or the like. A CMP method may be also used for polishing the surface. This step may be applied for planarizing a surface when irregularities are caused by a droplet discharge method. When the planarity is improved through the step, display unevenness or the like of the display panel can be prevented; therefore, a high-definition image can be displayed.

Figure 8A:
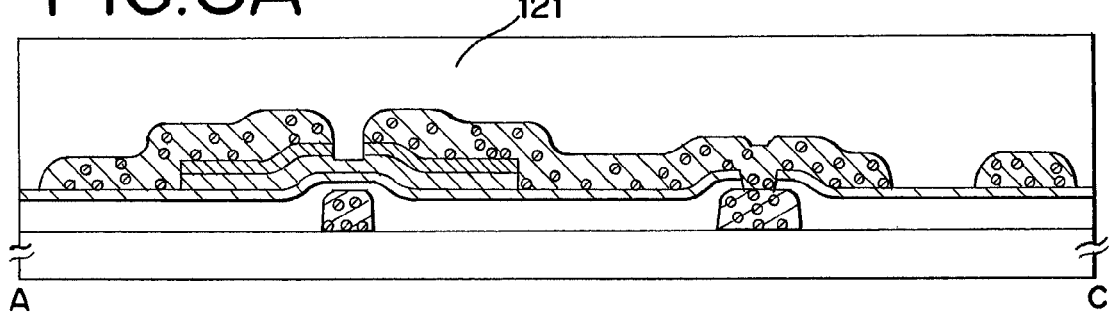
FIGS. 8A and 8B are views describing a method for manufacturing a display device according to the present invention.
Figure 8B:
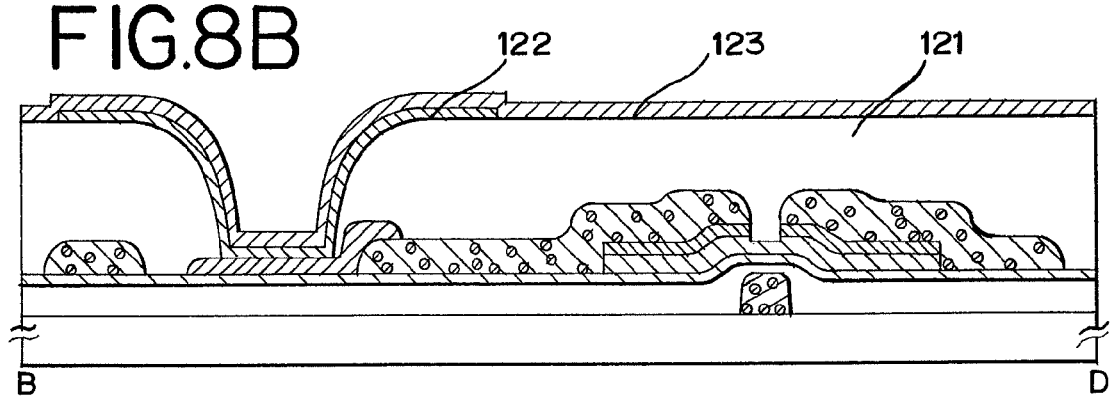

A light emitting element is formed over the substrate 100 having a TFT for a display panel (FIG. 8B).

Before forming the electroluminescent layer 122, moisture in the first electrode layer 117 and the insulating layer 121 or adsorbed in each surface is removed by performing heat treatment at a temperature of 200° C. under atmospheric pressure. It is preferable to perform heat treatment at temperatures of from 200° C. to 400° C., preferably from 250° C. to 350° C. under low pressure, and to form the electroluminescent layer 122 without exposure to atmospheric air by a vacuum evaporation method or a droplet discharge method which is performed under reduced pressure.

As the electroluminescent layer 122, materials each produces the luminescence of red (R), green (G), and blue (B) are selectively applied by an evaporation method using respective evaporation masks. The materials (low molecular weight materials, high molecular weight materials, or the like) each produce luminescence of red (R), green (G) and blue (B) can be formed by a droplet discharge method in the same manner as a color filter. This case is preferable since separate coloring of RGB can be carried out even without using a mask. Then, the second electrode layer 123 is formed over the electroluminescent layer 122 to complete a display device having a display function using a light emitting element.

Although it is not shown, it is effective to provide a passivation film so as to cover the second electrode layer 123. The passivation film which is provided at the time of forming a display device may have a single layer structure or a layered structure. As the passivation film, a single layer of an insulating film containing silicon nitride (SiN), silicon oxide (SiO$_2$), silicon oxynitride (SiON), silicon nitride oxide (SiNO), aluminum nitride (AlN), aluminum oxynitride (AlON), aluminum nitride oxide (AlNO) which has more nitrogen content than oxygen content, aluminum oxide, diamond like carbon (DLC) or a nitrogen-containing carbon film (CN$_x$), or a laminate in which the insulating films are combined can be used. For example, a laminate of a nitrogen-containing carbon film (CN$_x$) and silicon nitride (SiN) can be used. Alternatively, an organic material, or a laminate of a polymer such as a styrene polymer may be used. Further, a material which has a skeleton formed by the bond of silicon (Si) and oxygen (O), and which includes at least hydrogen as a substituent, or at least one of fluorine, an alkyl group, and aromatic hydrocarbon as a substituent may be also used.

At this time, it is preferable to use a film having good coverage as the passivation film, and a carbon film. A DLC film is particularly effective. A DLC film can be formed within the temperatures ranging from room temperature to 100° C.; therefore, a DLC film can be easily formed over an electroluminescent layer having low heat resistance. A DLC film can be formed by a plasma CVD method (typically, RF plasma CVD, microwave CVD, electron cyclotron resonance (ECR) CVD, thermal filament CVD, or the like), a combustion flame method, sputtering, ion beam deposition, laser deposition, or the like. Hydrogen gas and a hydrocarbon-based gas (for example CH$_4$, C$_2$H$_2$, C$_6$H$_6$, or the like) are used as a reactive gas which is used for forming the film. The reaction gas is ionized by glow discharge. The ions are accelerated to collide with a cathode applied with negative self bias. A CN film may be formed by using C$_2$H$_2$ gas and N$_2$ gas as the reactive gas. The DLC film has a high blocking effect on oxygen and can suppress the oxidation of the electroluminescent layer. Accordingly, the electroluminescent layer can be prevented from oxidizing during the subsequent sealing step.

Subsequently, a sealant is formed and sealing is performed with a sealing substrate. Then, a flexible wiring substrate may be connected to a gate wiring layer which is formed so as to be electrically connected to the gate electrode layer 103 to electrically connect to the outside. This is the same for a source wiring layer which is formed so as to be electrically connected to the source/drain electrode layer 111.

Figure 18A:
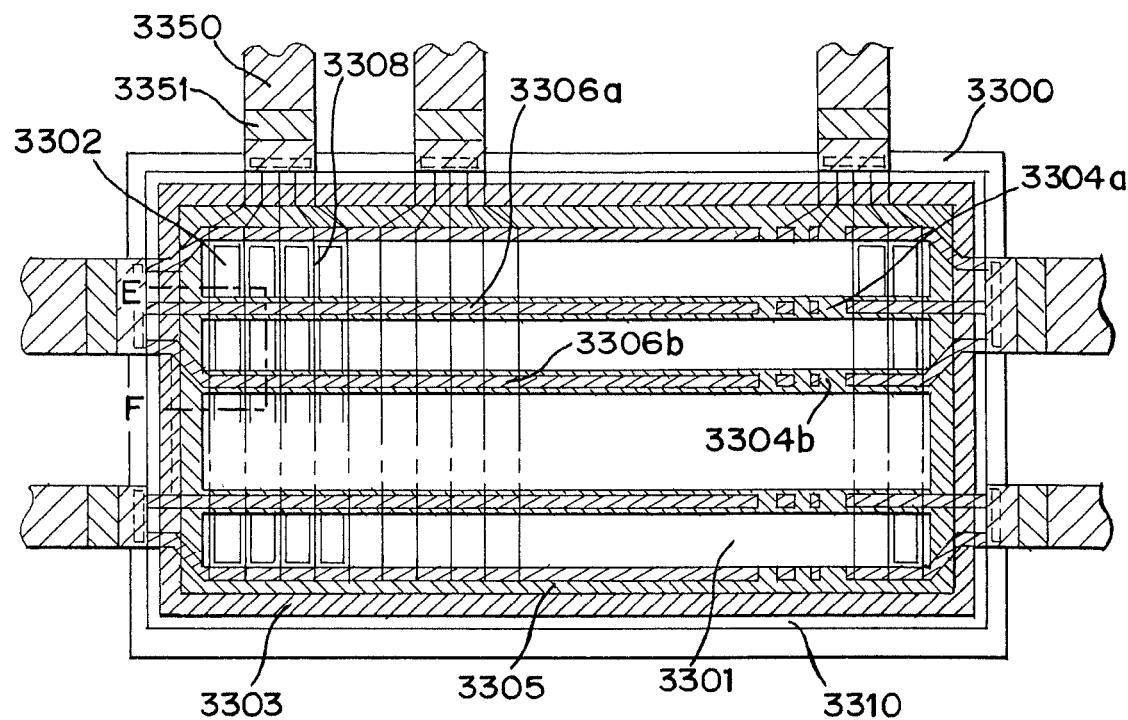
FIGS. 18A and 18B are views describing a display panel according to the present invention.
Figure 18B:
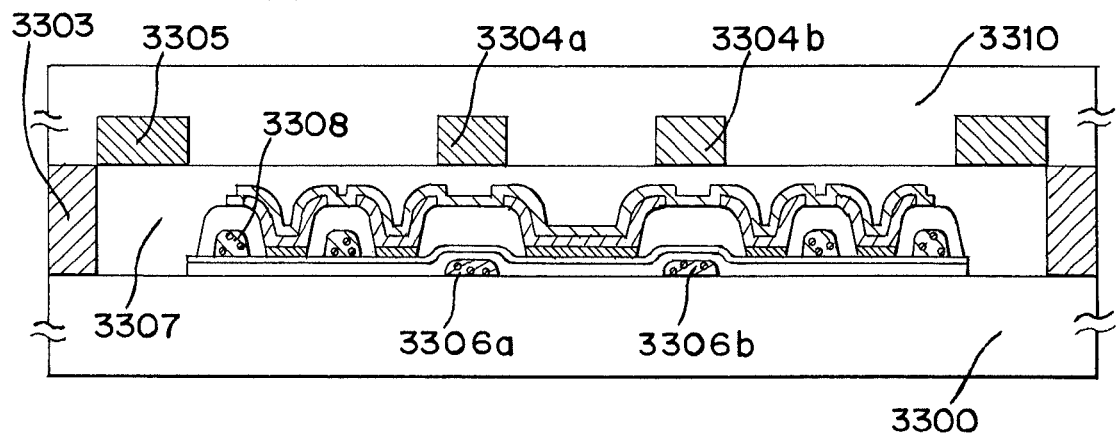

A completion drawing of an EL display panel manufactured according to the present invention is shown in FIGS. 18A and 18B. FIG. 18A shows a top view of the EL display panel and FIG. 18B shows a cross-sectional view taken along line E-F in FIG. 18A. In FIGS. 18A and 18B, a pixel area 3301 formed over an element substrate 3300 includes a pixel 3302, gate wiring layers 3306a and 3306b, and a source wiring layer 3308, and the element substrate 3300 is adhered and fixed to a sealing substrate 3310 with a sealant 3303. In this embodiment mode, a driver IC 3351 is provided over an FPC 3350 and mounted by TAB.

As shown in FIGS. 18A and 18B, desiccants 3305, 3304a and 3304b are provided in a display panel in order to prevent deterioration of the element due to moisture. The desiccant 3305 is formed so as to surround the periphery of the pixel area, and the desiccants 3304a and 3304b are formed in a region corresponding to the gate wiring layers 3306a and 3306b. In this embodiment mode, the desiccants are provided in a depression formed in the sealing substrate, which does not prevent an EL display panel from being thin. Since a desiccant is formed also in a region corresponding to a gate wiring layer, a large water absorption area can be obtained, thereby improving absorption efficiency. Additionally, since the desiccants are formed over the gate wiring layer which does not emit light itself, a light extraction efficiency is not decreased. In this embodiment mode, a filler 3307 is filled in the display panel. In this embodiment mode, the filler 3307 can be applied as a liquid composition by a dropping method like the liquid crystal dropping method shown in FIG. 29. When a hygroscopic substance such as a desiccant is used as the filler, further absorption effect can be obtained and the element can be prevented from being deteriorated.

In this embodiment mode, the case where a light emitting element is sealed with a glass substrate is shown. Sealing is a process for protecting a light emitting element from moisture. Therefore, any of a method in which a light emitting element is mechanically sealed with a cover material, a method in which a light emitting element is sealed with a thermosetting resin or an ultraviolet curable resin, and a method in which a light emitting element is sealed with a thin film of such as metal oxide, nitride or the like having high barrier capabilities, can be used. As for the cover material, glass, ceramics, plastics, or metal can be used. However, when light is emitted to the cover material side, the cover material needs to have light-transmitting properties. The cover material is attached to the substrate over which the above-mentioned light emitting element is formed with a sealant such as a thermosetting resin or an ultraviolet curable resin and then by curing the resin with heat treatment or ultraviolet irradiation treatment to form a sealed space. It is also effective to provide a hydroscopic absorbent material typified by barium oxide in the sealed space. The absorbent material may be provided over the sealant or over a partition wall or a peripheral part so as not to block light emitted from a light emitting element. Further, it is also possible to fill the space between the cover material and the substrate over which the light emitting element is formed with a thermosetting resin or an ultraviolet curable resin. In this case, it is effective to add a hydroscopic material typified by barium oxide in the thermosetting resin or the ultraviolet curable resin.

In this embodiment mode, although a single gate structure of a switching TFT is shown, a multi-gate structure such as a double gate structure may also be employed. In the case where a SAS or a crystalline semiconductor is used, an impurity region can be formed by adding an impurity which imparts one conductivity type. In this case, a semiconductor layer may have impurity regions having different concentrations. For example, the semiconductor layer may have a low concentration impurity region in the vicinity of a channel formation region and a region which is overlapped with a gate electrode layer, and a high concentration impurity region which is outside thereof.

As described above, in this embodiment mode, photolithography using a photomask is not employed, which leads to reduction in the number of steps. In addition, a display panel can be easily manufactured by forming various patterns directly on the substrate with the use of a droplet discharge method even when using a glass substrate which is in and after the fifth generation having 1000 mm or more on a side.

According to the present invention, a component can be formed to a desired pattern with good adhesion, and the material loss and cost can be reduced. Hence, a thin film transistor and a display device with high performance and high reliability can be manufactured with high yield.

Embodiment Mode 3

An embodiment mode of the present invention will be described with reference to FIGS. 10A to 10D and FIGS. 11A and 11B. In this embodiment mode, a display device is manufactured using a top gate type (a staggered type) thin film transistor. An example of a liquid crystal display device using a liquid crystal material as a display element is shown. Accordingly, the same part or a part having similar function will not be repeatedly explained. FIGS. 10A to 10D and FIGS. 11A and 11B show cross-sectional views of the display device.

In this embodiment mode, a particle shape matter containing a material which is the same as at least one of the substances forming the formation subject surface is added (mixed) into a composition containing a conductive material to form a conductive layer. The matter containing a material which is the same as at least one of the substances forming the surface of the formation subject has a particle shape and may have a diameter of 100 mm or less, preferably several tens nm or less. In the case of forming a thin wiring with nano level size, a conductive nanoparticles are used as the conductive material; thus, also the matter containing a material which is the same as one of the substances forming the surface of the formation subject is desirably 10 nm or less. The matter containing a material which is the same as at least one of the substances forming the surface of the formation subject is mixed in a conductive material to exert an effect. Specifically, the ratio of the matter containing a material which is the same as one of the substances forming the surface of the formation subject to the conductive material may be 0.5 wt % to 4.0 wt %, preferably 1.0 wt % to 3.0 wt %. Thus, the adhesion can be improved by mixing only a small amount of a matter containing a material which is the same as at least one of the substances forming the surface of the formation subject into a conductive material, which can improve the adhesion. The invention provides a method that is easier than forming a base film or performing pretreatment all over a formation region and is advantageous in the aspect of productivity and cost.

Figure 10A:
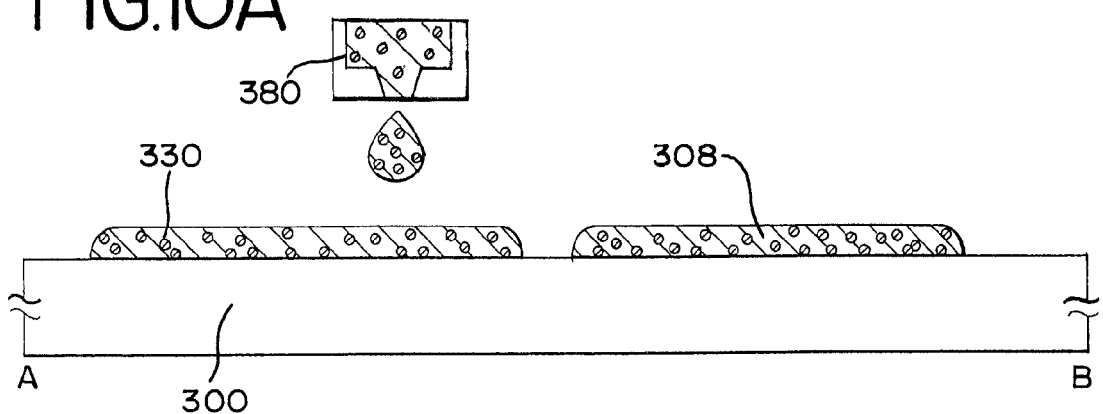
FIGS. 10A to 10D are views describing a method for manufacturing a display device according to the present invention.

A source/drain electrode layer 330 and a source/drain electrode layer 308 are formed over a substrate 300 (FIG. 10A). In this embodiment mode, the substrate 300 is a glass substrate containing silicon oxide. The source/drain electrode layer is formed to contain silicon oxide as the material which is the same as at least one of substances forming the formation subject surface, which has good adhesion to the substrate 300 that is the formation subject surface. A composition containing a conductive material added with a material containing silicon oxide is discharged onto the substrate 300 with the use of the droplet discharge system 380 and dried and baked to form an electrode layer. Thus formed electrode layer will be used as source/drain electrode layers 330 and 308 with good formation and good adhesion owing to the adhesion promotion effect of the material containing silicon oxide existing at the interface with the substrate 300.

Figure 10B:
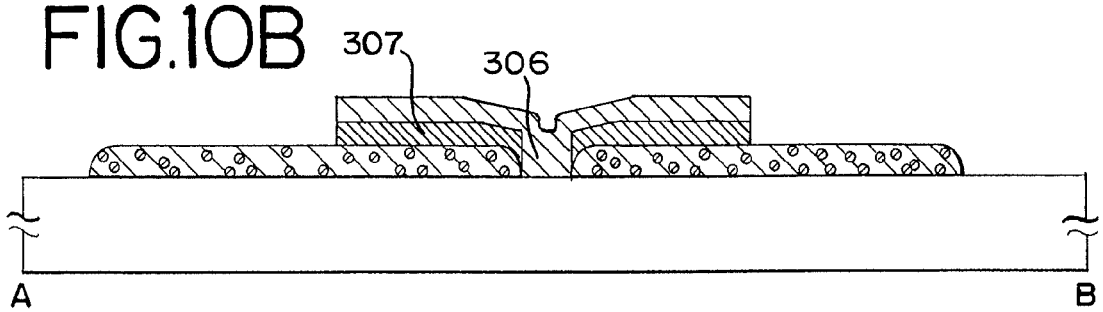

An n-type semiconductor layer is formed over the source/drain electrode layers 330 and 308 and is etched using a mask formed of a resist or the like. The resist may be formed by a droplet discharge method. Another semiconductor layer is formed over the n-type semiconductor layer and patterned using a mask or the like. Thus, n-type semiconductor layers 307 and 306 are formed (FIG. 10B). The semiconductor layer 306 is made of silicon which is an inorganic material; however, it can also be formed with an organic semiconductor such as the above pentacene. When an organic semiconductor is selectively formed by a droplet discharge method or the like, the patterning process can be simplified.

Figure 10C:
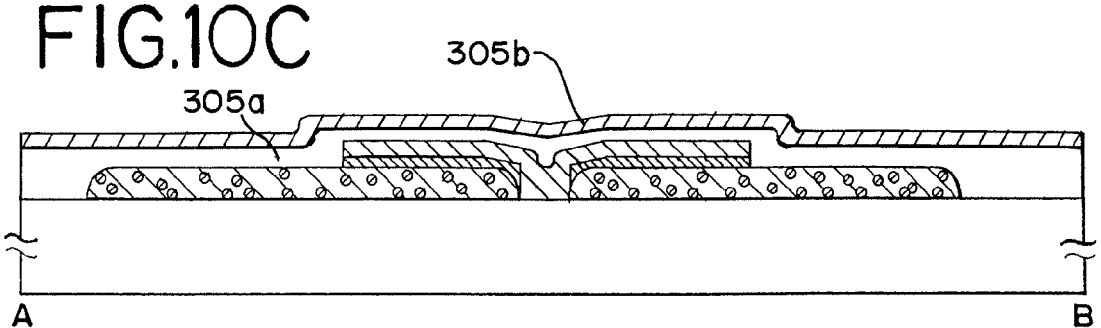

Next, a first insulating layer 305a containing an organic material and a second insulating layer 305b containing an inorganic material are formed to be layered (FIG. 10C). The first insulating layer 305a is an organic insulating material containing an organic material so that it is formed by an application method. Accordingly, the irregularities, steps on the formation subject region, or the like can be covered and leveled sufficiently. As in this embodiment mode, even if the source/drain layers 330 and 308 which are formed by a droplet discharge method have irregularities on the surfaces, they can be formed with good planarity without formation defect. In this embodiment mode, a composition containing a siloxane polymer is used to form the first insulating layer.

Next, the second insulating layer is formed by plasma CVD or sputtering. Accordingly, the second insulating layer can be formed densely and the electrical characteristics such as dielectric strength to voltage can be improved. In this embodiment mode, the second insulating layer is formed using silicon nitride (SiN). By applying the invention, a gate insulating layer which cause both effects of improvements in planarity and electrical characteristics (strength) can be formed.

Figure 10D:
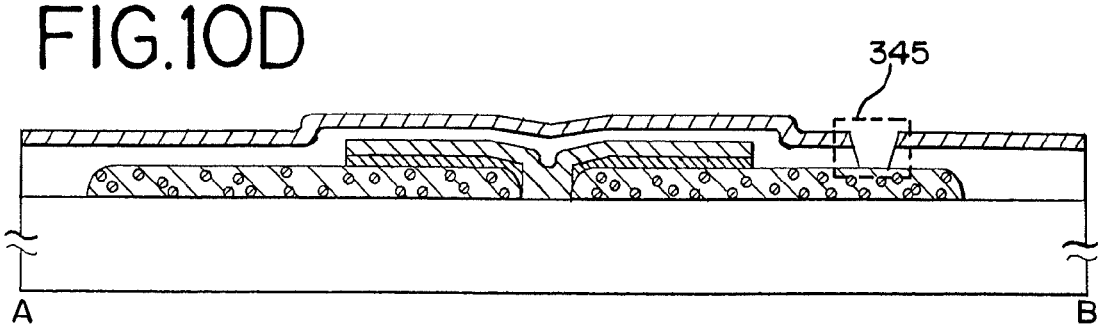

Next, a mask formed from a resist or the like and the first insulating layer 305a and the second insulating layer 305b are etched to form an opening 345. In this embodiment mode, the mask is selectively formed by a droplet discharge method (FIG. 10D).

Figure 11A:
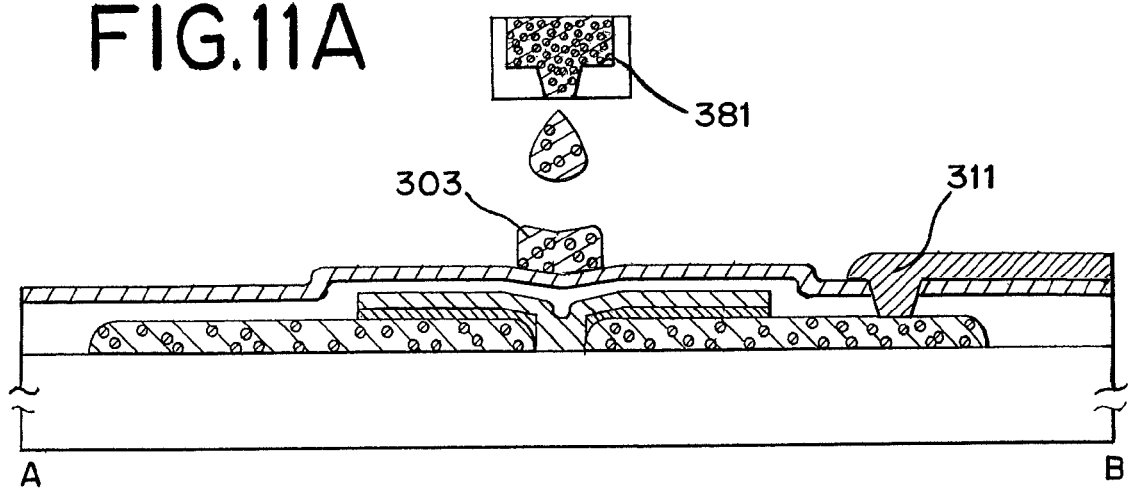
FIGS. 11A and 11B are views describing a method for manufacturing a display device according to the present invention.

A composition containing a conductive material is discharged as a fluid droplet from a droplet discharge system 381 onto the second insulating 305b to form a gate electrode layer 303 (FIG. 11A). In this embodiment mode, as with the source/drain electrode layer 330, silicon is added into the gate electrode layer 303, as a material which is the same as at least one of substances forming a formation subject surface, which have good adhesion to the formation subject to improve the adhesion between the gate electrode layer 303 and the formation subject surface. Thus the gate electrode layer 303 can be formed on the second insulating layer 305b with good adhesion and stably owing to the adhesion promotion effect of the material containing silicon.

A pixel electrode layer 311 is formed by a droplet discharge method. In this embodiment mode, the planarity of the surface has been improved by the first insulating layer 305a, so that the pixel electrode layer 311 can also be formed stably and uniformly without a formation defect or the like. The pixel electrode layer 311 and the source/drain electrode layer 308 are electrically connected through the opening 345 formed in advance. The pixel electrode layer 311 can be formed from a similar material to the first electrode layer 117. In the case of manufacturing a transmissive liquid crystal display panel, a composition containing indium tin oxide (ITO), indium tin oxide containing silicon oxide (ITSO), zinc oxide (ZnO), tin oxide ($SnO_2$) or the like is used for a predetermined pattern and the pixel electrode layer 311 can be formed by baking.

An insulating layer 312 called an alignment film is formed by a printing method or spin coating so as to cover the pixel electrode layer 311. The insulating layer 312 can be selectively formed with the use of a screen printing method or an offset printing method. Then, rubbing is performed. A sealant is formed at the periphery of the region where a pixel is formed by a droplet discharge method (not shown).

Figure 11B:
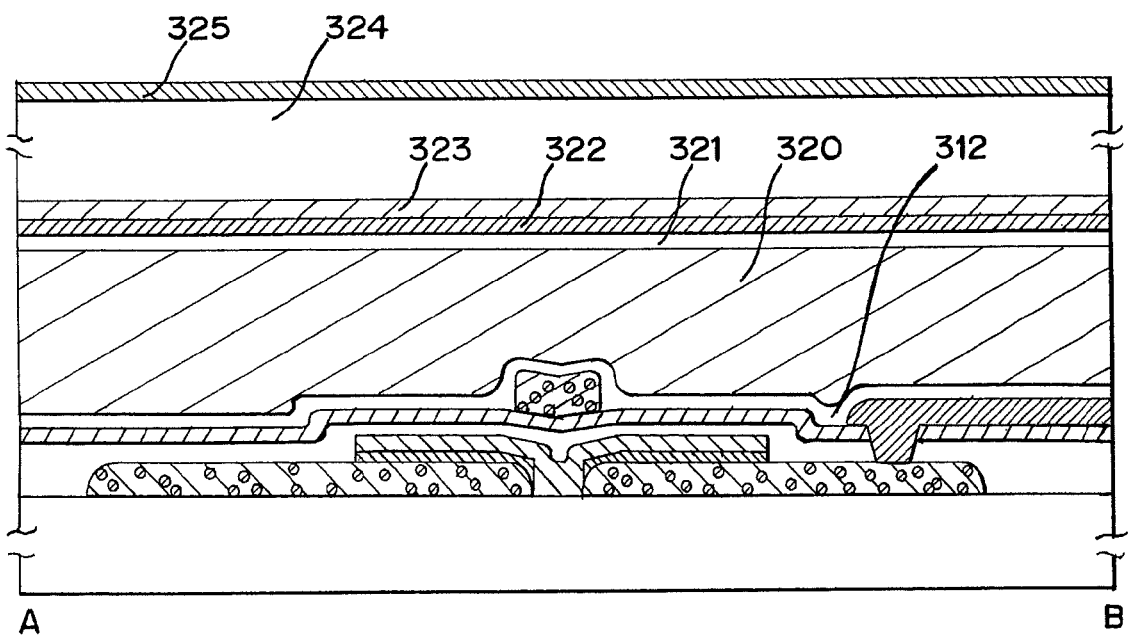

Subsequently, a counter substrate 324 provided with an insulating layer 321 functioning as an alignment film, a coloring layer 322 functions as a color filter, a conductive layer 323 functioning as a counter electrode, and the counter substrate 324 provided with a polarizing plate 325 are attached to the TFT substrate 300 with a spacer therebetween, and by providing the space with a liquid crystal layer 320; thus, a liquid crystal display panel can be manufactured (FIG. 11B). In the case of a transmissive liquid crystal display device, a polarizing plate may be provided on a side opposite to the surface of the substrate 300 having a TFT, which is not provided with the TFT. A sealant may be mixed with a filler, and further, the counter substrate 324 may be provided with a shielding film (a black matrix), or the like. Note that a dispensing method (a dropping method) or a dip method (a pumping method) by which a liquid crystal is injected utilizing capillary phenomenon after attaching the counter substrate 324 can be used as a method for forming the liquid crystal layer.

Figure 29:
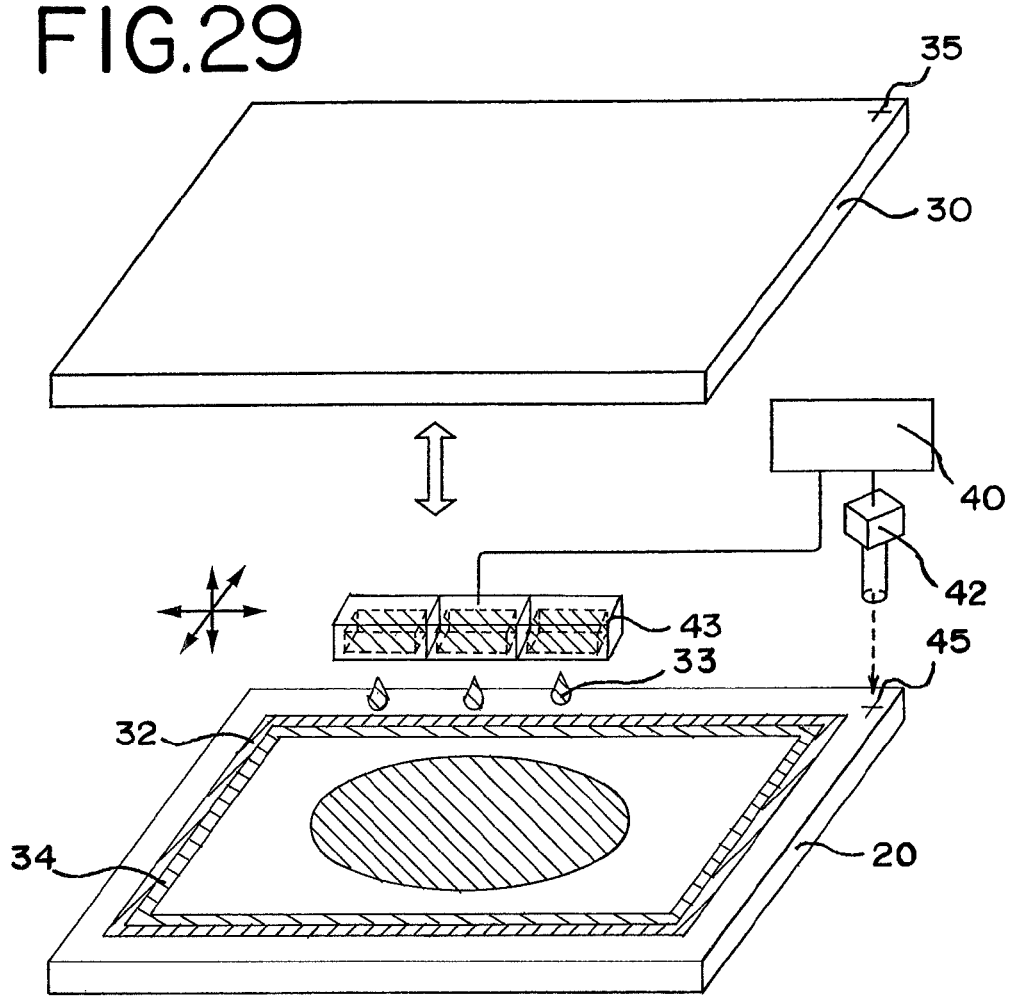
FIG. 29 is a figure describing a droplet discharge injection method which is applicable to the present invention.

A liquid crystal drop injection method employing a dispensing method will be described with reference to FIG. 29. A liquid crystal drop injection method shown in FIG. 29 includes a control device 40, an imaging means 42, a head 43, a liquid crystal 33, markers 35 and 45, a barrier layer 34, a sealant 32, a TFT substrate 30, and a counter substrate 20. A closed loop is formed with the sealant 32, and the liquid crystal 33 is dropped once or plural times therein from the head 43. When the liquid crystal material has high viscosity, the liquid crystal material is continuously discharged and attached to a liquid crystal formation region without a break. On the other hand, when the liquid crystal material has low viscosity, the liquid crystal material is intermittently discharged and a droplet is dropped as in FIG. 29. At this time, the barrier layer 34 is provided to prevent the sealant 32 and the liquid crystal 33 from reacting with each other. Subsequently, the substrates are attached in vacuum, and then, ultraviolet curing is performed to make the space filled with the liquid crystal.

A connection area is formed to connect the pixel area formed through the above steps and an external wiring substrate. The insulating layer in the connection area is removed by ashing treatment using oxygen gas under the atmospheric pressure or pressure close to the atmospheric pressure. This treatment is performed by using oxygen gas and one or more gases of hydrogen, $CF_4$, $NF_3$, $H_2O$, and $CHF_3$. In this process, ashing treatment is performed after sealing using the counter substrate to prevent damage or destruction due to static; however, ashing treatment may be performed at any timing as long as there are few effects of static.

A connection wiring substrate is provided so as to electrically connect a wiring layer with an anisotropic conductive layer interposed therebetween. The wiring substrate has a function of transmitting a signal or electric potential from the external. Through the above-mentioned steps, a liquid crystal display panel having a display function can be manufactured.

In this embodiment mode, a switching TFT having a single gate structure is described; however, a multi gate structure such as a double gate structure may be employed. When a semiconductor layer is manufactured with the use of a SAS or a crystalline semiconductor, an impurity region can be formed by adding an impurity which provides one conductivity type. In this case, the semiconductor layer may have impurity regions having different concentrations. For example, the periphery of a channel region of a semiconductor layer, which forms a laminate with a gate electrode layer and may be a low concentration impurity region, and the outer region thereof may be a high concentration impurity region.

As described above, in this embodiment mode, a light exposure step using a photomask is not carried out; thus, the number of steps can be reduced. Further, various patterns are formed directly on a substrate with a droplet discharge method; thus, a display panel can be easily manufactured even when a glass substrate in and after the fifth generation having 1000 mm or more on a side is used.

According to the present invention, a component can be formed to a desired pattern with good adhesion, and the material loss and cost can be reduced. Hence, a thin film transistor and a display device with high performance and high reliability can be manufactured with high yield.

Embodiment Mode 4

A thin film transistor can be formed by applying the present invention, and a display device can be formed with the use of the thin film transistor. In addition, when a light emitting element is used and an n-channel transistor is used as a transistor which drives the light emitting element, light emitted from the light emitting element performs any one of bottom emission, top emission, and dual emission. Here, a layered structure of a light emitting element corresponding to each emission will be described with reference to FIGS. 12A to 12C.

Further, in this embodiment mode, channel protective thin film transistors 461, 471, and 481 according to the present invention are used. The thin film transistor 481 is provided over a substrate 480 and includes a gate electrode layer 493, a first insulating layer 497a, a second insulating layer 497b, a semiconductor layer 494, an n-type semiconductor layer 495, a source/drain electrode layer 482, and a channel protective layer 496. In this embodiment mode, a silicon film having an amorphous structure is used as the semiconductor layer, and an n-type semiconductor layer is used as a semiconductor layer of one conductivity type. Instead of forming an n-type semiconductor layer, a semiconductor may be given conductivity by plasma treatment using $PH_3$ gas. The semiconductor layer is not limited to this embodiment mode, and a crystalline semiconductor layer may be used as in Embodiment Mode 2. In the case of using a crystalline semiconductor layer of polysilicon or the like, an impurity region having one conductivity type may be formed by introducing (adding) impurities into the crystalline semiconductor layer without forming the one conductivity type semiconductor layer. Further, an organic semiconductor of such as pentacene can be used. For example, when an organic semiconductor is selectively formed by a droplet discharge method, the patterning process can be simplified.

As to the thin film transistor 481 according to the invention, the gate insulating layer is formed includes layers which are a first insulating layer 497a containing an organic material and a second insulating layer 497b containing an inorganic material. The first insulating layer 497a is formed by an application method, so that it can cover the gate electrode layer 493 with good coverage, which contributes in planarizing the surface. The second insulating layer 497b can be formed densely so that which improves the electrical characteristics such as dielectric strength. Accordingly, the coverage defect of the irregularities on the formation subject surface, deterioration of the electrical characteristics due to a defect in the insulating layer, or the like can be prevented; thus, a highly reliable thin film transistor can be formed. In the invention, a glass substrate is used for the substrate 480. A material containing silicon oxide included in a glass substrate is added (mixed) as a material which is the same as one of the substances forming the formation subject surface into the gate electrode layer 493. Accordingly, the materials containing silicon oxide adheres at the interface between the gate electrode layer 493 and the substrate 480; thus, the gate electrode layer 493 can be formed on the substrate 480 with good adhesion without being peeled off due to the adhesion.

A channel protective layer 496 may be formed by a droplet discharge method using polyimide, polyvinyl alcohol or the like. As a result, a photolithography process can be omitted. The channel protective layer may be formed from one or more of an inorganic material (silicon oxide, silicon nitride, silicon oxynitride, silicon nitride oxide, and the like), a photosensitive or non-photosensitive organic material (an organic resin material) (polyimide, acrylic, polyamide, polyimide amide, benzocyclobutene, a resist, or the like), a Low k material which has a low dielectric constant, and the like; a laminate of such films; or the like. Additionally, a material which has a skeleton formed by the bond of silicon (Si) and oxygen (O), and which includes at least hydrogen as a substituent, or at least one of fluoride, an alkyl group, and aromatic hydrocarbon as a substituent, may be used. As a manufacturing method, a vapor phase growth method such as plasma CVD or thermal CVD, or sputtering can be used. A droplet discharge method or a printing method (a method for forming a pattern, such as screen printing or offset printing) can also be used. A TOF film or an SOG film obtained by an application method can also be used.

First, the case where light is emitted to a 480 side, in other words, bottom emission is performed, will be described with reference to FIG. 12A. In this case, a first electrode 484, an electroluminescent layer 485, and a second electrode 486 are sequentially stacked in contact with a source/drain electrode layer 482 so as to be electrically connected to the thin film transistor 481. A first insulating layer 497a and a second insulating layer 497b, and the substrate 480 are required to have light-transmitting properties. The case where light is emitted to the side opposite to the substrate 460, in other words, top emission is performed, will be described with reference to FIG. 12B. The thin film transistor 461 can be formed in a similar manner to the above described thin film transistor.

A source/drain electrode layer 462 that is electrically connected to the thin film transistor 461, a first electrode layer 463, an electroluminescent layer 464, a second electrode layer 465 are stacked in order. With the structure, even if the first electrode layer 463 transmits light, the light is reflected by the source/drain electrode layer 462, and the light is emitted to the side opposite to the substrate 460. In this structure, the first electrode layer 463 is not required to use a light-transmitting material. Finally, the case where light is emitted from both the substrate 470 side and the opposite side thereto, that is the case where dual emission is carried out, will be described with reference to FIG. 12C. The thin film transistor 471 is a channel protective thin film transistor the same as the thin film transistor 481. So, it can be formed in the like manner as the thin film transistor 481. A source/drain electrode layer 477 that is electrically connected to the thin film transistor 471, a first electrode layer 472, an electroluminescent layer 473, a second electrode layer 474 are stacked in order. At that time, when both the first electrode layer 472 and the second electrode layer 474 are formed from materials that transmit light or formed thin enough to transmit light, dual emission is realized. In this case, the insulating layer and the substrate 470 are also required to have light-transmitting properties.

Modes of a light emitting element which can be used in this embodiment mode is shown in FIGS. 13A to 13D. The light emitting element has a structure in which an electroluminescent layer 860 is provided between a first electrode layer 870 and a second electrode layer 850. The materials of the first electrode layer and the second electrode layer are required to be selected considering the work functions. The first electrode layer and the second electrode layer can be either an anode or a cathode depending on the pixel structure. In this embodiment mode, a driving TFT has n-type conductivity, so that it is preferable that the first electrode layer 870 serves as a cathode and the second electrode layer 850 serves as an anode. In the case where the driving TFT has p-channel conductivity, the first electrode layer 870 may be used as an anode and the second electrode layer 850 may be used as a cathode.

FIGS. 13A and 13B show the case where the first electrode layer 870 is an anode and the second electrode layer 850 is a cathode. The electroluminescent layer 860 preferably has a structure in which an HIL (hole injection layer), HTL (hole transport layer) 804, EML (light emitting layer) 803, ETL (electron transport layer), EIL (electron injection layer) 802, and a second electrode layer 850 are stacked in order from the first electrode layer 870 side. FIG. 13A shows a structure in which light is emitted from the side of the first electrode layer 870 which is constituted by an electrode layer 805 having a light-transmitting conductive oxide material, and the second electrode layer has a structure in which an electrode layer 801 containing an alkali metal or an alkaline earth metal such as LiF or MgAg and an electrode layer 800 made of a metal material such as aluminum are stacked in order from the light emitting layer 860 side. FIG. 13B shows a structure in which light is emitted from the side of the second electrode layer 850 and the first electrode layer 870 is constituted by an electrode layer 807 made of a metal such as aluminum or titanium, or a metal material containing such metal and nitrogen of concentration in stoichiometric proportion or less, and the second electrode layer 806 made of a conductive oxide material containing silicon oxide in a concentration of 1 to 15 atomic %. The second electrode layer is constituted by an electrode layer 801 containing an alkali metal or an alkaline earth metal such as LiF or MgAg and an electrode layer 800 made of a metal material such as aluminum from the electroluminescent layer 860 side; each layer is formed to a thickness of 100 nm or less; thus, the light can be emitted from the second electrode layer 850.

FIGS. 13C and 13D show the case where the first electrode layer 870 is a cathode and the second electrode layer 850 is an anode. The electroluminescent layer 860 preferably has a structure in which an EIL (electron injection layer) and an ETL (electron transport layer) 802, an EML (light emitting layer) 803, an HTL (hole transport layer) and HIL (hole injection layer) 804, and the second electrode layer 850 which is an anode are stacked in order from the cathode side. FIG. 13C shows a structure in which light is emitted from the first electrode layer 870. The first electrode layer 870 is constituted by an electrode layer 801 containing an alkali metal or an alkaline earth metal such as LiF or MgAg and an electrode layer 800 made of a metal material such as aluminum from the electroluminescent layer 860 side; each layer is formed to a thickness of 100 nm or less to transmit light; thus, the light can be emitted through the first electrode layer 870. The second electrode layer is constituted by the second electrode layer 806 made of a conductive oxide material containing silicon oxide in a concentration of 1 to 15 atomic % and an electrode layer 807 made of a metal such as aluminum or titanium, or a metal material containing such metal and nitrogen of concentration in stoichiometric proportion or less, from the electroluminescent layer 860 side. FIG. 13D shows a structure in which light is emitted from the second electrode layer 850. The first electrode layer 870 is constituted by an electrode layer 801 containing an alkali metal or an alkaline earth metal such as LiF or MgAg and an electrode layer 800 made of a metal material such as aluminum from the electroluminescent layer 860 side; the first electrode layer 870 is formed thick enough to reflect the light produced in the electroluminescent layer 860. The second electrode layer 850 is constituted by an electrode layer 805 made of a light-transmitting conductive oxide material. The electroluminescent layer may have a single layer structure or a mixed structure other than a layered structure.

As the electroluminescent layer, materials each displays luminescence of red (R), green (G), and blue (B) are selectively formed by an evaporation method using respective evaporation masks or the like. The materials (low molecular weight materials or high molecular weight materials or the like) each displays luminescence of red (R), green (G), and blue (B) can be formed by a droplet discharge method in the same manner as a color filter. This case is preferable since RGB can be separately colored without using a mask.

In the case of the above top emission type, when ITSO or ITSO having light-transmitting properties are used for the second electrode layer, BzOS—Li in which Li is added to benzoxazole derivatives (BzOS) or the like can be used. $Alq_3$ doped with a dopant corresponding to respective luminescent colors of R, G, and B (DCM or the like for R, and DMQD or the like for G) may be used for the EML, for example.

Note that the electroluminescent layer is not limited to the above-mentioned material. For example, hole injection properties can be improved by co-evaporating an oxide such as molybdenum oxide ($MoO_x$: X=2 to 3) and α-NPD or rubrene instead of using CuPc or PEDOT. An organic material (including a low molecular weight material or a high molecular weight material) or a composite material of an organic material and an inorganic material can be used as the material of the electroluminescent layer. A material forming a light emitting element will be described below in detail.

As a substance having high electron transport properties among charge injection transport materials, for example, a metal complex having a quinoline skeleton or a benzoquinoline skeleton such as tris(8-quinolinolato)aluminum ($Alq_3$), tris(5-methyl-8-quinolinolato)aluminum ($Almq_3$), bis(10-hydroxybenzo[h]-quinolinato)beryllium ($BeBq_2$), bis(2-methyl-8-quinolinolato)-4-phenylphenolato-aluminum (BAlq), and the like can be given. As a substance having high hole transport properties, for example, an aromatic amine compound (in other words, a compound having the bond of benzene ring-nitrogen) such as 4,4'-bis[N-(1-naphthyl)-N-phenyl-amino]-biphenyl (α-NPD), 4,4'-bis[N-(3-methylphenyl)-N-phenyl-amino]-biphenyl (TPD), 4,4',4"-tris(N,N-diphenyl-amino)-triphenylamine (TDATA), or 4,4',4"'-tris[N-(3-methylphenyl)-N-phenyl-amino]-triphenylamine (MTDATA) can be used.

As a substance having high electron injection properties among charge injection transport materials, a compound of an alkali metal or an alkaline earth metal such as lithium fluoride (LiF), cesium fluoride (CsF), or calcium fluoride ($CaF_2$) can be given. In addition to this, it may be a compound of a substance having high electron transport properties such as $Alq_3$ and an alkaline earth metal such as magnesium (Mg).

As a substance having high hole injection properties among charge injection transport materials, for example, metal oxide such as molybdenum oxide ($MoO_x$), vanadium oxide ($VO_x$), a ruthenium oxide ($RuO_x$), tungsten oxide ($WO_x$), manganese oxide (MnOx) are given. In addition, a phthalocyanine compound such as phthalocyanine ($H_2Pc$) or copper phthalocyanine (CuPC) can be given.

The light emitting layer may have a structure to perform color display by providing each pixel with light emitting layers having different emission wavelength ranges. Typically, a light emitting layer corresponding to color of R (red), G (green), and B (blue) is formed. On this occasion, color purity can be improved and a pixel area can be prevented from having a mirror surface (reflection) by providing the light emitting side of the pixel with a filter which transmits light of an emission wavelength range. By providing a filter, a circularly polarizing plate or the like that is conventionally required can be omitted, and further, the loss of light emitted from the light emitting layer can be eliminated. Further, change in hue, which occurs when a pixel area (display screen) is obliquely seen, can be reduced.

Various materials can be used for a light emitting material. As a low molecular weight organic light emitting material, 4-dicyanomethylene-2-methyl-6-[2-(1,1,7,7-tetramethyljulolidyl-9-ethenyl]-4H-pyran; (DCJT); 4-dicyanomethylene-2-t-butyl-6-(1,1,7,7-tetramethyljulolidine-9-ethenyl)]-4H-pyran (DPA); periflanthene; 2,5-dicyano-1,4-bis[2-(10-methoxy-1,1,7,7-tetramethyljulolidine-9-yl)ethenyl] benzene; N,N'-dimethylquinacridon (DMQd); coumarin 6; coumarin 545T; tris(8-quinolinolato)aluminum ($Alq_3$); 9.9'-bianthryl; 9,10-diphenylanthracene (DPA); 9,10-bis(2-naphthyl)anthracene (DNA); and the like can be used. Another substance can also be used.

On the other hand, a high molecular weight organic light emitting material is physically stronger than a low molecular weight material and is superior in durability of the element. In addition, a high molecular weight organic light emitting material can be formed by application, and therefore, the element can be relatively easily manufactured. The structure of a light emitting element using a high molecular weight organic light emitting material has basically the same structure as in the case of using a low molecular weight organic light emitting material, that is, a cathode, an organic light emitting layer, and an anode are stacked in order. However, a two-layer structure is employed in many cases when a light emitting layer using a high molecular weight organic light emitting material is formed. This is because it is difficult to form such a layered structure as in the case of using a low molecular weight organic light emitting material. Specifically, the light emitting element using a high molecular weight organic light emitting material has a structure of a cathode, a light emitting layer, a hole transport layer, and an anode in order.

The emission color is determined depending on a material forming a light emitting layer; therefore, a light emitting element which displays desired luminescence can be formed by selecting an appropriate material for the light emitting layer. As a high molecular weight electroluminescent material which can be used for forming a light emitting layer, a polyparaphenylene-vinylene-based material, a polyparaphenylene-based material, a polythiophene-based material, or a polyfluorene-based material can be used.

As the polyparaphenylene vinylene-based material, a derivative of poly(paraphenylenevinylene) [PPV], for example, poly(2,5-dialkoxy-1,4-phenylenevinylene) [RO-PPV]; poly(2-(2'-ethyl-hexoxy)-5-methoxy-1,4-phenylenevinylene) [MEH-PPV]; poly(2-(dialkoxyphenyl)-1,4-phenylenevinylene) [ROPh-PPV]; and the like can be given. As the polyparaphenylene-based material, a derivative of poly-paraphenylene [PPP], for example, poly(2,5-dialkoxy-1,4-phenylene) [RO-PPP]; poly(2,5-dihexoxy-1,4-phenylene); and the like can be given. As the polythiophene-based material, a derivative of a derivative of polythiophene [PT], for example, poly(3-alkylthiophene) [PAT]; poly(3-hexylthiophen) [PHT]; poly(3-cyclohexylthiophen) [PCHT]; poly (3-cyclohexyl-4-methylthiophene) [PCHMT]; poly(3,4-dicyclohexylthiophene) [PDCHT]; poly[3-(4-octylphenyl)-thiophene] [POPT]; poly[3-(4-octylphenyl)-2,2bithiophene] [PTOPT]; and the like can be given. As the polyfluorene-based material, a derivative of polyfluorene [PF], for example, poly(9,9-dialkylfluorene) [PDAF]; poly(9,9-dioctylfluorene) [PDOF]; and the like can be given.

When a high molecular weight organic light emitting material having hole transport properties is interposed between an anode and a high molecular weight organic light emitting material having light emitting properties, hole injection properties from the anode can be improved. Generally, the high molecular weight organic light emitting material having hole transport properties which is dissolved in water along with an acceptor material is applied by spin coating or the like. In addition, the high molecular weight light emitting material having hole injection properties is insoluble in an organic solvent; therefore, it can be formed over the above-mentioned high molecular weight organic light emitting material having light emitting properties. As the high molecular weight organic light emitting material having hole transportablity, a mixture of PEDOT and camphor-10-sulfonic acid (CSA) that serves as an acceptor material, a mixture of polyaniline [PANI] and polystyrene sulfonic acid [PSS] that serves as an acceptor material, or the like can be used.

The light emitting layer can be made to emit single color or white light. When a white light emitting material is used, color display can be made possible by applying a structure in which a filter (a coloring layer) which transmits light having a specific wavelength on the light emitting side of a pixel is provided.

In order to form a light emitting layer that emits white light, for example, $Alq_3$, $Alq_3$ partly doped with Nile red that is a red light emitting pigment, p-EtTAZ, TPD (aromatic diamine) are laminated sequentially by a vapor deposition method to obtain white light. In the case that the light emitting layer is formed by an application method using spin coating, the layer formed by spin coating is preferably baked by vacuum heating. For example, an aqueous solution of poly(ethylene dioxythiophene)/poly(styrene sulfonic acid) solution (PEDOT/PSS) may be entirely applied and baked to form a film that functions as a hole injection layer. Then, a polyvinyl carbazole (PVK) solution doped with a luminescent center pigment (1,1,4,4-tetraphenyl-1,3-butadiene (TPB); 4-dicyanomethylene-2-methyl-6-(p-dimethylamino-styryl)-4H-pyran (DCM1); Nile red; coumarin 6; or the like) may be entirely applied and baked to form a film that functions as a light emitting layer.

The light emitting layer may be formed to be a single layer. For example, a 1,3,4-oxadiazole derivative (PBD) having electron transport properties may be dispersed in polyvinyl carbazole (PVK) having hole transportability. Further, white light emission can be obtained by dispersing PBD of 30 wt % as an electron transporting agent and dispersing an appropriate amount of four kinds of pigments (TPB, coumarin 6, DCM1, and Nile red). In addition to the light emitting element from which white light emission can be obtained as shown here, a light emitting element which can provide red light emission, green light emission, or blue light emission can be manufactured by appropriately selecting materials of the light emitting layer.

Further, a triplet light emitting material containing a metal complex or the like as well as a singlet light emitting material may be used for the light emitting layer. For example, among pixels emitting red, green, and blue light, a pixel emitting red light whose luminance is reduced by half in a relatively short time is formed of a triplet light emitting material and the rest are formed of a singlet let light emitting material. A triplet light emitting material has a feature that the material has a good luminous efficiency and consumes less power to obtain the same luminance. When a triplet light emitting material is used for a red pixel, only small amount of current needs to be supplied to a light emitting element. Thus, reliability can be improved. A pixel emitting red light and a pixel emitting green light may be formed of a triplet light emitting material and a pixel emitting blue light may be formed of a singlet light emitting material to achieve low power consumption. Low power consumption can be further achieved by forming a light emitting element which emits green light that has high visibility with a triplet light emitting material.

A metal complex used as a dopant is an example of a triplet light emitting material, and a metal complex having platinum that is a third transition series element as a central metal, a metal complex having iridium as a central metal, and the like are known. A triplet light emitting material is not limited to the compounds. A compound having the above described structure and an element belonging to any of the Groups 8 to 10 of the periodic table as a central metal can also be used.

The above described materials for forming the light emitting layer are just examples. A light emitting element can be formed by appropriately stacking functional layers such as a hole injection transport layer, a hole transport layer, an electron injection transport layer, an electron transport layer, a light emitting layer, an electron blocking layer, and a hole blocking layer. Further, a mixed layer or a mixed junction may be formed by combining these layers. The layer structure of the light emitting layer can be varied. Instead of providing a specific electron injection region or a light emitting region, modification such as providing an electrode layer for the purpose or providing a dispersed light emitting material is acceptable as long as it does not deviate from the scope of the present invention.

A light emitting element formed with the above described materials emits light by being forward biased. A pixel of a display device formed with a light emitting element can be driven by a simple matrix mode or an active matrix mode. In any event, each pixel emits light by applying a forward bias thereto at a specific timing; however, the pixel is in a non-light-emitting state for a certain period. Reliability of a light emitting element can be improved by applying a reverse bias at the non-light-emitting time. In a light emitting element, there is a deterioration mode in which emission intensity is decreased under specific driving conditions or a deterioration mode in which a non-light-emitting region is enlarged in the pixel and luminance is apparently decreased. However, progression of deterioration can be slowed down by alternating current driving where bias is applied forward and reversely. Thus, reliability of a light emitting device can be improved. Additionally, both of digital driving and analog driving can be applied.

Figure 12A:
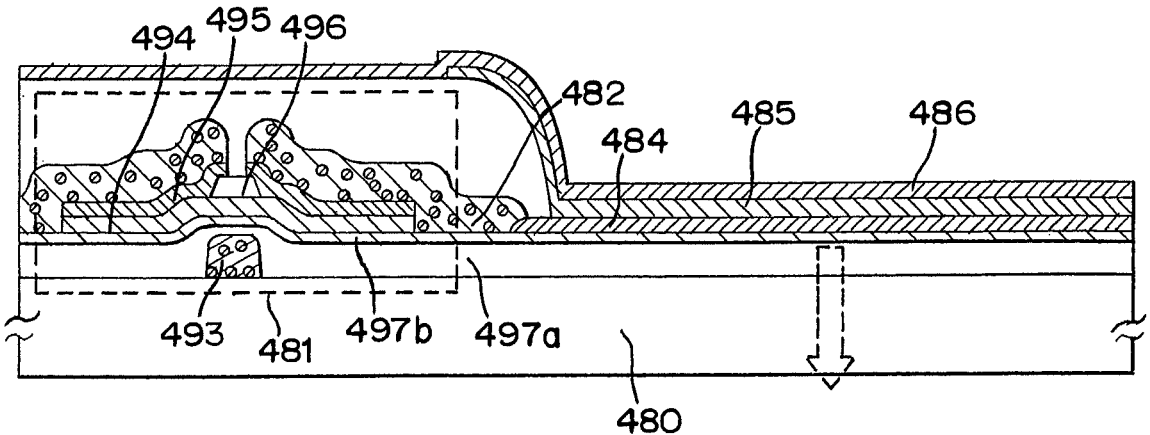
FIGS. 12A to 12C are cross-sectional views of a display device according to the present invention.
Figure 12B:
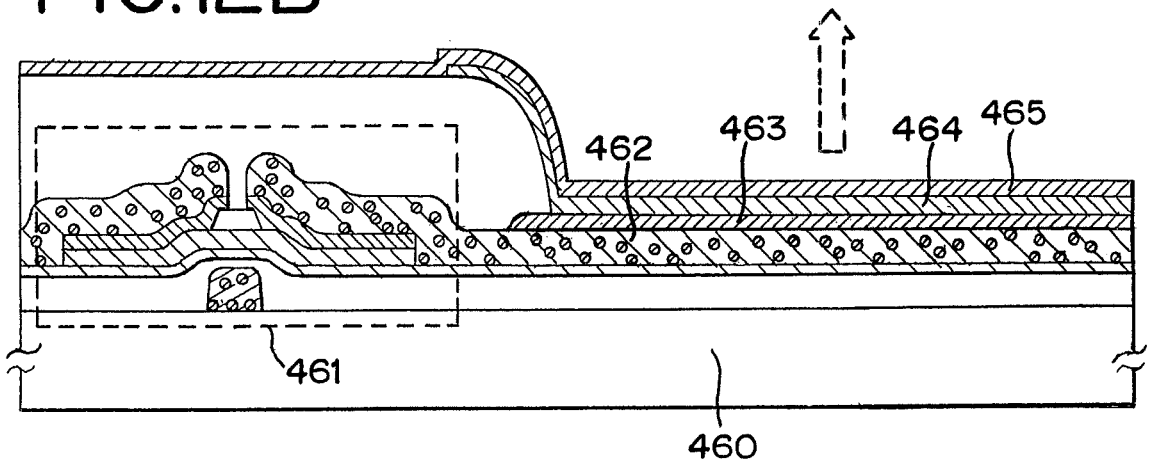
Figure 12C:
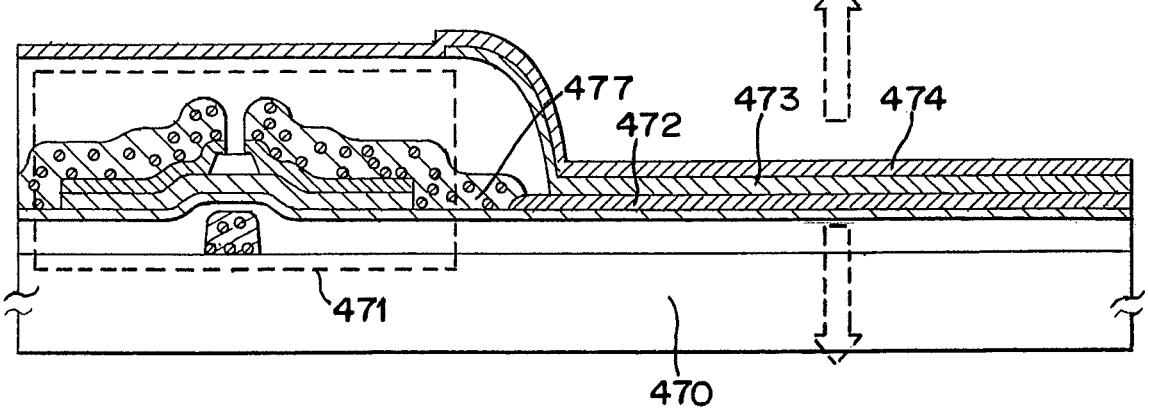

A color filter (coloring layer) may be formed over the sealing substrates formed over the substrates 480, 460 and 470 although it is not shown in FIGS. 12A to 12C. The color filter (coloring layer) can be formed by a droplet discharge method, and in this case, light irradiation treatment or the like can be applied as the above-mentioned base pretreatment. According to the present invention, a color filter (coloring layer) can be formed to have a desired pattern with good control. With the use of a color filter (coloring layer), high-definition display can also be performed. This is because a broad peak can be modified to be sharp in light emission spectrum of each RGB.

As described above, the case of forming a material displaying luminescence of R, G, and B is shown; however, full color display can be performed by forming a material displaying a single color and combining a color filter and a color conversion layer. The color filter (coloring layer) or the color conversion layer is formed over, for example, a second substrate (a sealing substrate) and may be attached to a substrate. As described above, any of the material indicating a plain color, the color filter (coloring layer), and the color conversion layer can be formed by a droplet discharge method.

Naturally, display may be performed in monochrome. For example, a display device having an area color type may be manufactured by using single color emission. The area color type is suitable for a passive matrix type display area, and a characters and symbols can be mainly displayed.

In the above-mentioned structure, it is possible to use a low work function material as a cathode, for example, Ca, Al, CaF, MgAg, AlLi, or the like is desirable. Any of a single layer type, a layered type, a mixed type having no interface between layers can be used for the electroluminescent layer. The electroluminescent layer may be formed by a singlet material, a triplet material, or a mixture of the materials; or a charge injection transport material and a light emitting material including an organic compound or an inorganic compound, which includes one layer or plural layers of a low molecular weight organic compound material, a middle molecular weight organic compound (which means an organic compound having no sublimation properties, and the number of molecules is 20 or less or the length of linked molecules is 10 μm or less), and a high molecular weight organic compound, which are defined by the number of molecules, and may be combined with an electron injection transport inorganic compound or a hole injection transport inorganic compound. The first electrode layer 484 (FIG. 12A), the first electrode layer 463 (FIG. 12B), and the first electrode layer 472 (FIG. 12C) are formed by using a transparent conductive film which transmits light, and for example, a transparent conductive film in which zinc oxide (ZnO) of 2% to 20% is mixed in indium oxide is used in addition to ITO or ITSO. Plasma treatment or heat treatment in vacuum atmosphere may be preferably performed before forming the first electrode 484, the first electrode 463, and the first electrode 472. The partition wall (also referred to as a bank) is formed by using a material containing silicon, an organic material or a compound material. Additionally, a porous film may be used. However, when a photosensitive material or a non-photosensitive material such as acrylic or polyimide is used to form, the side face thereof has a shape in which a radius curvature changes continuously, and an upper layer thin film is formed without disconnection due to a step; therefore, it is preferable. This embodiment mode can be freely combined with the above-mentioned embodiment modes.

Embodiment Mode 5

In a display panel manufactured according to Embodiment Modes 2 to 4, as shown in FIG. 14B, a scan line driver circuit can be formed over a substrate 3700 by forming a semiconductor layer with a SAS.

Figure 25:
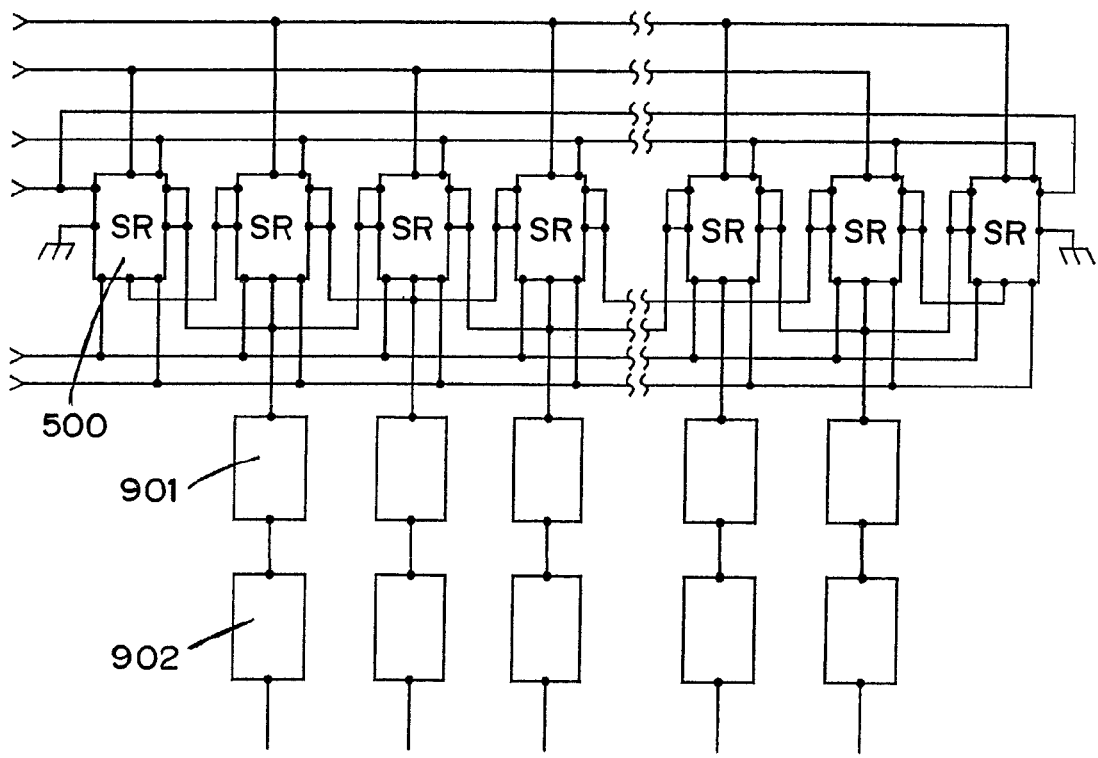
FIG. 25 is a view describing a circuit structure of a scan line driver circuit in an EL display panel according to the present invention.

FIG. 25 shows a block diagram of the scan line driver circuit including n-channel TFTs using a SAS in which electric field effect mobility of from 1 cm$^2$/V·sec to 15 cm$^2$/V·sec is obtained.

In FIG. 25, a block 500 corresponds to a pulse output circuit outputting a sampling pulse for one stage and a shift register includes n pulse outputting circuits. Reference numeral 901 denotes a buffer circuit and connected to a pixel 902.

Figure 26:
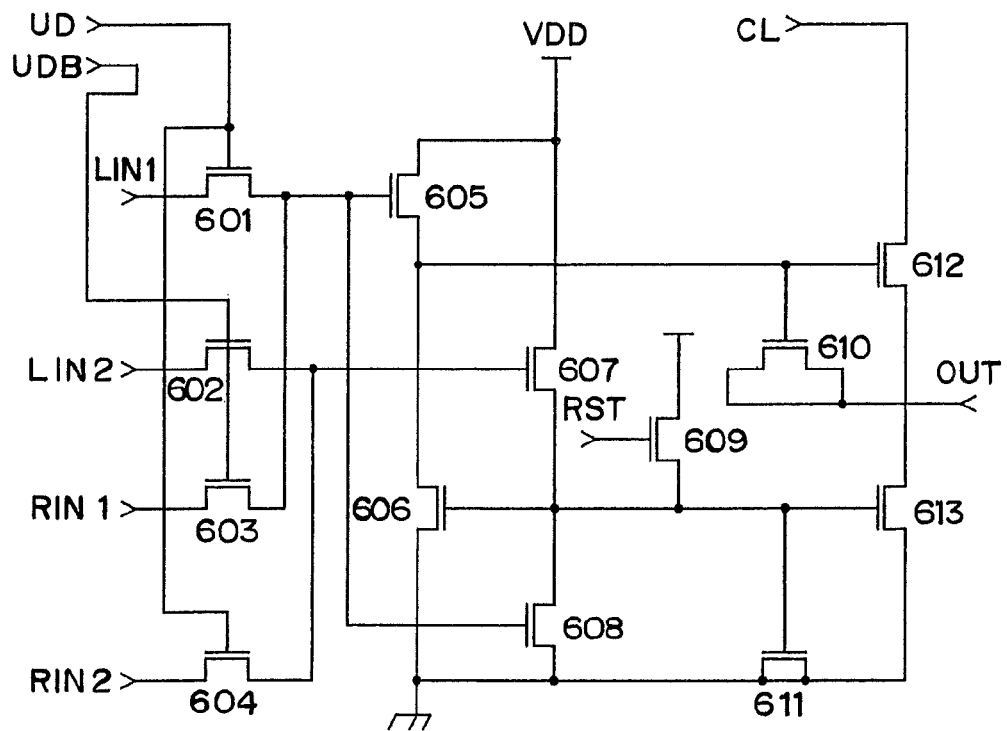
FIG. 26 is a diagram describing a circuit structure in a scan line driver circuit in an EL display panel according to the present invention (a shift resistor circuit).

FIG. 26 shows a specific structure of the block 500 which is a pulse output circuit, and the pulse output circuit includes n-channel TFTs 601 to 613. The size of the TFTs may be decided in consideration of the operation characteristics of the n-channel TFTs using a SAS. For example, when a channel length shall be 8 μm, the channel width can be set from 10 μm to 80 μm.

Figure 27:
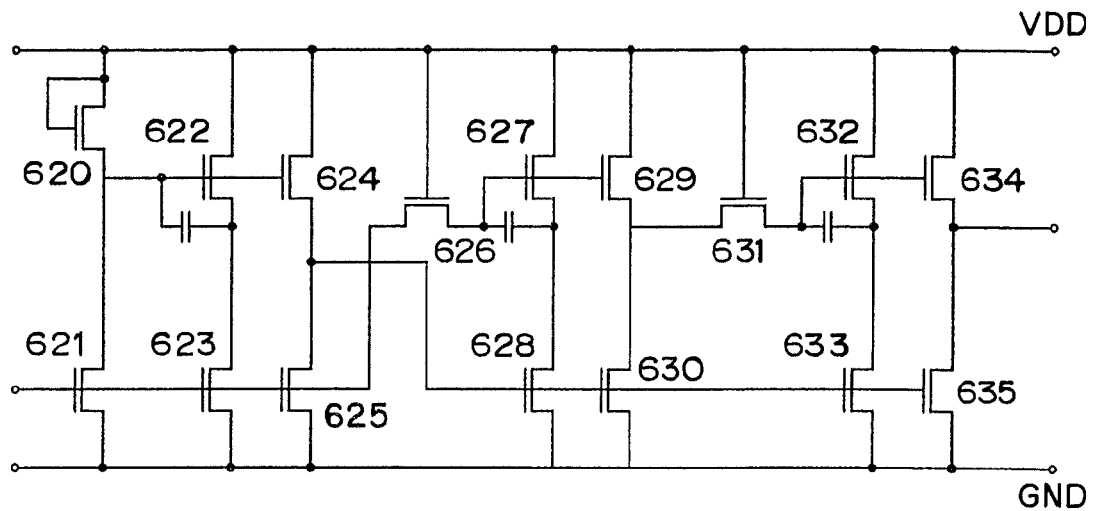
FIG. 27 is a diagram describing a circuit structure when a scan line driver circuit is formed of a TFT in an EL display panel according to the present invention (a buffer circuit).

In addition, FIG. 27 shows a specific structure of the buffer circuit 901. The buffer circuit includes n-channel TFTs 620 to 635 in the same manner. At this time, the size of the TFTs may be decided in consideration of the operation characteristics of the n-channel TFTs using a SAS. For example, when a channel length shall be 10 μm, the channel width can be set from 10 μm to 1800 μm. According to the present invention, a pattern can be formed to have a desired shape with good control; therefore, a fine wiring like this having a channel width of 10 μm can be stably formed without a fault such as a short circuit.

Figure 16:
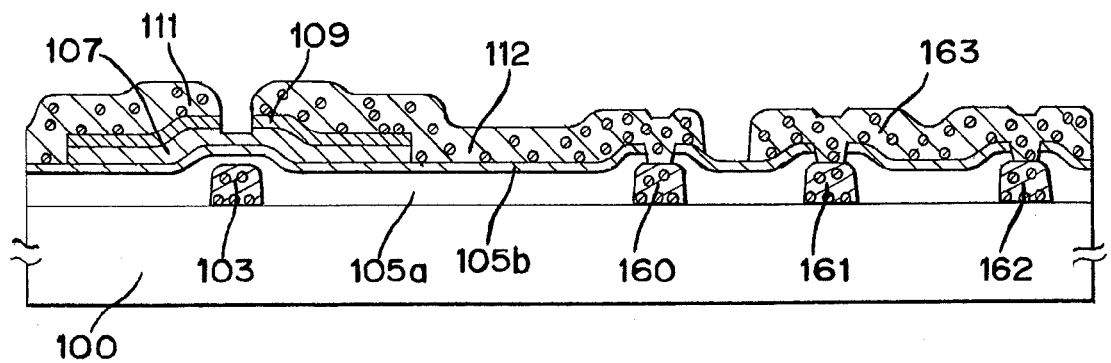
FIG. 16 is a view describing a method for manufacturing a display device according to the present invention.

To realize such a circuit, TFTs should be connected with each other through wirings. A structural example of the wirings in this case are shown in FIG. 16. In FIG. 16, a gate electrode layer 103, a first insulating layer 105a containing an organic material and a second insulating layer 105b containing an inorganic material which form a gate insulating layer, a semiconductor layer 107, an n-type semiconductor layer 109 as a semiconductor layer having one conductivity type, source/drain electrode layers 111 and 112 are formed as in Embodiment Mode 2. In this embodiment mode, a material containing silicon oxide which is included in the substrate 100 which is the formation subject onto the gate electrode layer 103. Accordingly, the gate electrode layer 103 can also be formed on the substrate with good adhesion owing to the material containing silicon oxide which has good adhesion to the substrate 100.

Further, the first insulating layer 105a is formed by a droplet discharge method so that it can cover the gate electrode layer 103 with good coverage, which contributes in planarizing the surface. The second insulating layer 105b can be formed densely so that which improves the electrical characteristics such as dielectric strength. Accordingly, the coverage defect of the irregularities on the formation subject surface, deterioration of the electrical characteristics due to a defect in the insulating layer, or the like can be prevented; thus, a highly reliable thin film transistor can be formed.

Connection wiring layers 160, 161, and 162 are formed over a substrate 100 through the same steps as the gate electrode layer 103. Parts of a gate insulating layer are etched so that the connection wiring layers 160, 161, and 162 are exposed, and TFTs are appropriately connected with the use of the source/drain electrode layers 111 and 112, and a connection wiring layer 163 formed in the same step; thus, a variety of circuits can be realized.

Embodiment Mode 6

A mode of mounting a driver circuit on a display panel manufactured according to Embodiment Modes 4 and 5 will be described.

First, a display device employing a COG method is described with reference to FIG. 15A. A pixel area 2701 having pixels 2702 for displaying information on characters, images or the like is provided over a substrate 2700. A substrate provided with a plurality of driver circuits is divided into rectangles, and the divided driver circuits (hereinafter also referred to as a driver IC) are mounted on the substrate 2700. FIG. 15A shows a mode of mounting a plurality of driver ICs 2751 and FPCs 2750 on the end of the driver ICs 2751. In addition, the divided size may be made almost the same as the length of a side of a pixel area on a signal line side, and a tape may be mounted on the end of a single driver IC.

A TAB method may be adopted. In that case, a plurality of tapes may be attached and driver ICs may be mounted on the tape as shown in FIG. 15B. Similarly to the case of a COG method, a singular driver IC may be mounted on a singular tape. In that case, a metal piece or the like for fixing the driver IC may be attached together in terms of the matter of intensity.

A plurality of the driver ICs to be mounted on a display panel is preferably formed over a rectangular substrate having a side of from 300 mm to 1000 mm or more in terms of improving production efficiency.

In other words, a plurality of circuit patterns including a driver circuit portion and an input-output terminal as a unit is formed over the substrate, and may be lastly divided to be used. In consideration of a side length of the pixel area and the pixel pitch, the driver IC may be formed to be a rectangle having a long side (length) of 15 mm to 80 mm and a short side of from 1 mm to 6 mm. Alternatively, the driver IC may be formed to have the long side length of a side length of the pixel area, or the long side length of adding the pixel area to a side length of each driver circuit.

An advantage of the external dimension over an IC chip of a driver IC is the length of the long side. When a driver IC having a long side of from 15 mm to 80 mm is used, the number of driver ICs necessary for mounting in accordance with the pixel area is less than that in the case of using an IC chip. Therefore, a yield in manufacturing can be improved. When a driver IC is formed over a glass substrate, production efficiency is not impaired, without limitation due to the shape of a substrate used as a mother body. This is a great advantage compared with the case of taking IC chips out of a circular silicon wafer.

When a scan line driver circuit 3702 is integrally formed over the substrate as shown in FIG. 14B, the driver IC provided with a signal line driver circuit is mounted on a region outside the pixel area 3701. The driver IC is a signal line driver circuit. In order to form a pixel area corresponding to RGB full color, 3072 signal lines are required for an XGA class and 4800 signal lines are required for a UXGA class. The signal lines formed in such a number are divided into several blocks on an end of the pixel area 3701 to form lead lines. The signal lines are gathered corresponding to the pitches of output terminals of the driver ICs.

The driver IC is preferably made of a crystalline semiconductor formed over a substrate. The crystalline semiconductor is preferably formed by being irradiated with continuous wave laser light. Therefore, a continuous wave solid-state laser or gas laser is used as an oscillator for generating the laser light. There are few crystal defects when a continuous wave laser is used, and as a result, a transistor can be formed by using a polycrystalline semiconductor layer with a large grain size. In addition, high-speed driving is possible since mobility or response speed is favorable, and it is possible to further improve an operating frequency of an element than that of the conventional element. Therefore, high reliability can be obtained since there are few characteristics variations. Note that the channel-length direction of a transistor and a scanning direction of laser light may be directed in the same direction to further improve an operating frequency. This is because the highest mobility can be obtained when a channel length direction of a transistor and a scanning direction of laser light with respect to a substrate are almost parallel (preferably, from −30° to 30°) in a step of laser crystallization by a continuous wave laser. The channel length direction coincides with the flowing direction of a current, in other words, a direction in which an electric charge moves in a channel formation region. The thus manufactured transistor has an active layer including a polycrystalline semiconductor layer in which a crystal grain is extended in the channel direction, and this means that a crystal grain boundary is formed almost along the channel direction.

In order to perform laser crystallization, it is preferable to extensively focus the laser light, and the beam spot thereof preferably has the same width as that of a short side of the driver ICs, approximately from 1 mm to 3 mm. In addition, in order to secure an enough and effective energy density for an object to be irradiated, an irradiation region of the laser light preferably has a linear shape. As used herein, the term "linear" refers to not a line in a strict sense but a rectangle or an oblong with a large aspect ratio. For example, the linear shape refers to a rectangle or an oblong with an aspect ratio of 2 or more (preferably from 10 to 10000). Thus, it is possible to provide a method for manufacturing a display device in which productivity is improved by making a beam spot width of the laser light and that of a short side of the driver ICs to have the same length.

As shown in FIGS. 15A and 15B, driver ICs may be mounted as both a scan line driver circuit and a signal line driver circuit. In this case, it is preferable to differentiate specifications of the driver ICs to be used on the scan line and on the signal line.

In the pixel area, the signal line and the scan line intersect to form a matrix and a transistor is arranged in accordance with each intersection. A TFT having an amorphous semiconductor or a semiamorphous semiconductor as a channel portion is used as the transistor arranged in the pixel area in the present invention. The amorphous semiconductor is formed by a method such as plasma CVD or sputtering. It is possible to form the semiamorphous semiconductor at temperatures of 300° C. or less by plasma CVD. A film thickness necessary to form a transistor is formed in a short time even in the case of a non-alkaline glass substrate of an external size of, for example, 550 mm×650 mm. The feature of such a manufacturing technique is effective in manufacturing a large-area display device. In addition, a semiamorphous TFT can obtain field effect mobility of from 2 $cm^2$/V·sec to 10 $cm^2$/V·sec by forming a channel formation region of a SAS. When the present invention is applied, a fine wiring having a short channel width can be stably formed without a fault such as a short circuit due to coverage fault and film peeling-off since a pattern can be formed with good surface planarity and adhesion. Accordingly, TFT having electric characteristics required to operate pixels sufficiently. Therefore, this TFT can be used as a switching element of pixels and as an element constituting the scan line driver circuit. Thus, a display panel in which system-on-panel is realized can be manufactured.

The scan line driver circuit is also integrally formed over the substrate by using a TFT having a semiconductor layer formed of a semiamorphous semiconductor (SAS). In the case of using a TFT having a semiconductor layer formed of an amorphous semiconductor (AS), a driver IC may be mounted as both the scan line driver circuit and the signal line driver circuit.

In that case, it is preferable to differentiate specifications of the driver ICs to be used on the scan line and on the signal line. For example, a transistor constituting the scan line side driver ICs is required to withstand a voltage of approximately 30 V; however, a drive frequency is 100 kHz or less and high-speed operation is not comparatively required. Therefore, it is preferable to set a channel-length (L) of the transistor included in the scan line driver sufficiently long. On the other hand, a transistor of the signal line driver ICs is required to withstand a voltage of only approximately 12 V; however, a drive frequency is around 65 MHz at 3 V and high-speed operation is required. Therefore, it is preferable to set a channel-length or the like of the transistor included in a driver with a micron rule. According to the present invention, a wiring can be stably formed without a fault such as a short circuit due to coverage fault and film peeling-off since a pattern can be formed with good surface planarity and adhesion. Therefore, the present invention can correspond to such a micron rule sufficiently.

A method for mounting a driver IC is not particularly limited, and a known method such as a COG method, a wire bonding method, or a TAB method can be employed.

The heights of the driver IC and the counter substrate can be made almost the same by forming the driver IC to have the same thickness as that of the counter substrate, which contributes to thinning a display device as a whole. When both substrates are formed of the same material, thermal stress is not generated and characteristics of a circuit including a TFT are not harmed even when temperature change is generated in the display device. Furthermore, the number of driver ICs to be mounted on one pixel area can be reduced by mounting a longer driver IC than an IC chip as a driver circuit as described in this embodiment mode.

As described above, a driver circuit can be incorporated in a display panel.

Embodiment Mode 7

A structure of a pixel of a display panel shown in this embodiment is described with reference to equivalent circuit diagrams shown in FIGS. 17A to 17F.

Figure 17A:
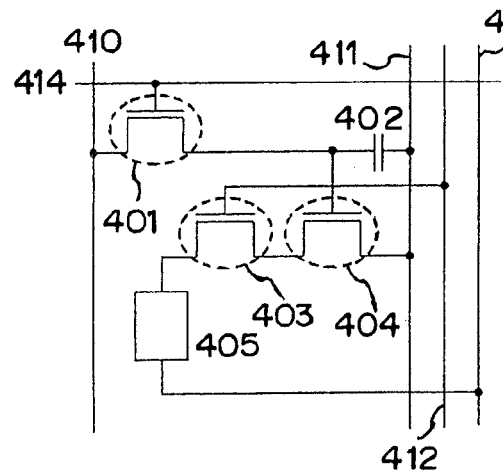
FIGS. 17A to 17F are circuit diagrams describing a structure of a pixel which is applicable to an EL display panel according to the present invention.

In a pixel shown in FIG. 17A, a signal line 410 and power supply lines 411 to 413 are arranged in columns, and a scan line 414 is arranged in a row. The pixel also includes a TFT 401 that is a switching TFT, a TFT 403 that is a driving TFT, a TFT 404 that is a current control TFT, a capacitor element 402, and a light-emitting element 405.

Figure 17B:
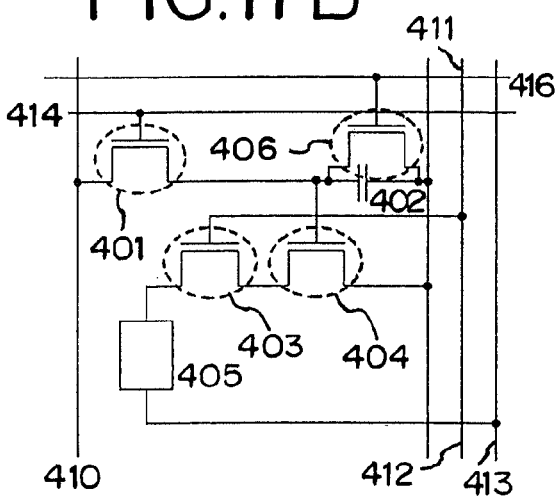
Figure 17C:
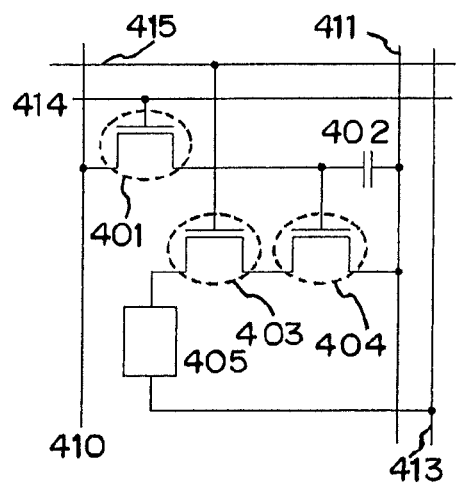
Figure 17D:
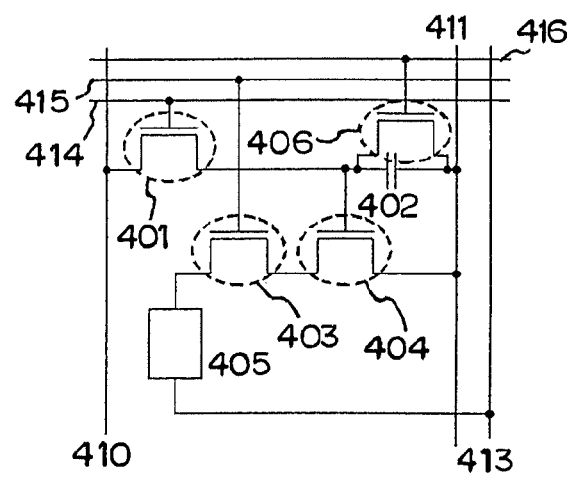

A pixel shown in FIG. 17C has the same structure as the one shown in FIG. 17A, except that a gate electrode of the driving TFT 403 is connected to the power supply line 415 arranged in a row. Both pixels in FIGS. 17A and 17C show the same equivalent circuit diagrams. However, each power supply line is formed of conductive layers in different layers in between the cases where the power supply line 412 is arranged in a column (FIG. 17A) and where the power supply line 415 is arranged in a row (FIG. 17C). The two pixels are separately shown in FIGS. 17A and 17C in order to show that layers in which a wiring connected to the gate electrode of the TFT 403 is formed are different in between FIGS. 17A and 17C.

In both FIGS. 17A and 17C, the TFTs 403 and 404 connected in series in the pixel, and the ratio of the channel length $L_3$/the channel width $W_3$ of the TFT 403 to the channel length $L_4$/the channel width $W_4$ of the TFT 404 is set as $L_3/W_3:L_4/W_4=5$ to 6000:1. For example, when $L_3$, $W_3$, $L_4$, and $W_4$ are 500 μm, 3 μM, 3 μm, and 100 μm, respectively. When the present invention is applied, a fine wiring having a short channel width can be stably formed without a fault such as a short circuit due to coverage fault and film peeling-off since a pattern can be formed with good surface planarity and adhesion. Hence, a TFT having electric characteristics required for sufficiently operating such pixels shown in FIGS. 17A and 17C can be formed. As a result, a highly reliable display panel superior in display capability can be manufactured.

The TFT 403 is operated in a saturation region and controls the amount of current flowing in the light emitting element 405, whereas the TFT 404 is operated in a linear region and controls a current supplied to the light emitting element 405. The TFTs 403 and 404 preferably have the same conductivity in view of the manufacturing process. For the driving TFT 403, a depletion type TFT may be used instead of an enhancement type TFT. According to the present invention having the above structure, slight variations in $V_{GS}$ of the TFT 404 does not affect the amount of current flowing in the light emitting element 405, since the current controlling TFT 404 is operated in a linear region. That is, the amount of current flowing in the light emitting element 405 is determined by the TFT 403 operated in a saturation region. Accordingly, it is possible to provide a display device in which image quality is enhanced by improving variations in luminance of the light emitting element due to the variation of the TFT properties.

The TFTs 401 of pixels shown in FIGS. 17A to 17D controls a video signal input to the pixel. When the TFT 401 is turned ON and a video signal is input to the pixel, the video signal is held in the capacitor element 402. Although the pixel includes the capacitor element 402 in FIGS. 17A to 17D, the present invention is not limited thereto. When a gate capacitance or the like can serve as a capacitor for holding a video signal, the capacitor element 402 is not necessarily provided.

The light emitting element 405 has a structure in which an electroluminescent layer is sandwiched between a pair of electrodes. A pixel electrode and a counter electrode (an anode and a cathode) have a potential difference therebetween so that a forward bias voltage is applied. The electroluminescent layer is formed of wide range of materials such as an organic material, an inorganic material. The luminescence in the electroluminescent layer includes luminescence that is generated when an excited singlet state returns to a ground state (fluorescence) and luminescence that is generated when an exited triplet state returns to a ground state (phosphorescence).

A pixel shown in FIG. 17B has the same structure as the one shown in FIG. 17A, except that a TFT 406 and a scan line 416 are added. Similarly, a pixel shown in FIG. 17D has the same structure as the one shown in FIG. 17C, except that a TFT 406 and a scan line 416 are added.

The TFT 406 is controlled to be ON/OFF by the added scan line 416. When the TFT 406 is turned ON, charges held in the capacitor element 402 are discharged, thereby turning the TFT 404 OFF. That is, supply of a current to the light emitting element 405 can be forcibly stopped by providing the TFT 406. Therefore, a lighting period can start simultaneously with or shortly after a writing period starts before signals are written into all the pixels by adopting the structures shown in FIGS. 17B and 17D, thus, the duty ratio can be improved.

Figure 17E:
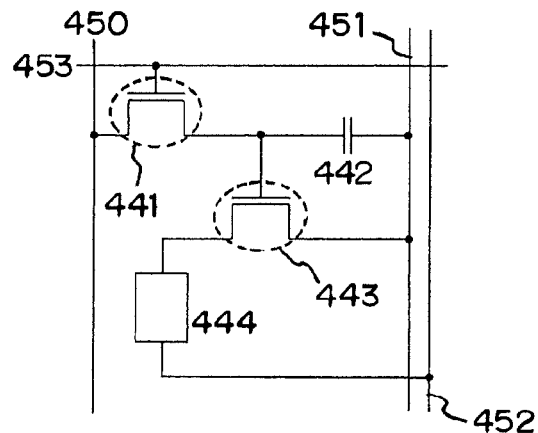
Figure 17F:
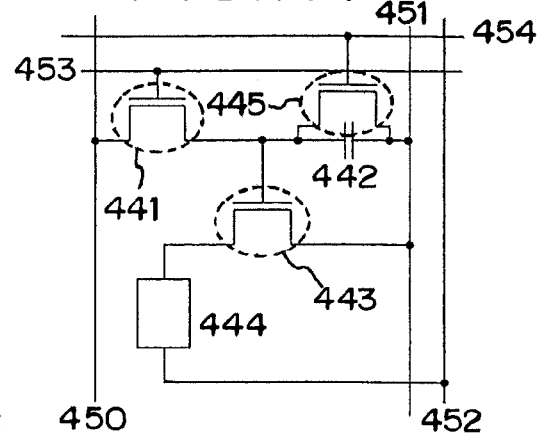

In a pixel shown in FIG. 17E, a signal line 450 and power supply lines 451 and 452 are arranged in columns, and a scan line 453 is arranged in a row. The pixel further includes a TFT 441 that is a switching TFT, a TFT 443 that is a driving TFT, a capacitor element 442, and a light emitting element 444. A pixel shown in FIG. 17F has the same structure as the one shown in FIG. 17E, except that a TFT 445 and a scan line 454 are added. It is to be noted that the structure of FIG. 17F also allows a duty ratio to be improved by providing the TFT 445.

As described above, according to the present invention, a pattern of a wiring or the like can be stably formed with good adhesion without a break. Therefore, a TFT can be provided with high electric characteristics and reliability, and the present invention can satisfactorily be used for an applied technique for improving display capacity of a pixel in accordance with the intended use.

Embodiment Mode 8

One mode in which protective diodes are provided for a scan line input terminal portion and a signal line input terminal portion is explained with reference to FIG. 24. TFTs 501 and 502, a capacitor 504, a light emitting element 503, a gate line 506, and a power supply line 507 are provided for a pixel 2702 in FIG. 24. This TFT has the same structure as that in Embodiment Mode 2.

Protective diodes 561 and 562 are provided for the signal line input terminal portion. These protective diodes are manufactured in the same step as that of the TFTs 501 and 502 and being operated as a diode by being each connected to a gate and one of a drain or a source. FIG. 23 shows an equivalent circuit diagram such as a top view shown in FIG. 24.

The protective diode 561 includes a gate electrode layer, a semiconductor layer, a wiring layer. The protective diode 562 has the same structure. Common potential lines 554 and 555 connecting to this protective diode are formed in the same layer as that of the gate electrode layer. Therefore, it is necessary to form a contact hole in the gate insulating layer to electrically connect to the wiring layer.

A mask layer may be formed and etching-processed to form a contact hole in the gate insulating layer. In this case, when etching-process at atmospheric pressure discharge is applied, electric discharging process can be locally performed, and a mask layer is not necessarily formed over the entire surface.

A signal wiring layer is formed in the same layer as that of a source/drain wiring layer 505 in the TFT 501 and has a structure in which the signal wiring layer connected thereto is connected to the source or drain side.

The input terminal portion of the scanning signal line side also has the same structure. A protective diode 563 includes a gate electrode layer, a semiconductor layer, and a wiring layer. A protective diode 564 also has the same structure. Common potential lines 556 and 557 connected to the protective diode are formed in the same layer as that of the source/drain wiring layer. According to the present invention, the protective diodes provided in an input stage can be formed at the same time. Note that the position of depositing a protective diode is not limited to this embodiment mode and can also be provided between a driver circuit and a pixel.

As described above, according to the present invention, a pattern of a wiring or the like can be stably formed without generating a formation defect with good control. Therefore, even when a wiring or the like is complex and formed densely by forming a protective circuit, a short or the like due to the defect of installation at the time of formation is not generated. Additionally, the present invention can correspond to a miniaturized or thinned device sufficiently since it is not necessary to take wide margin into consideration. As a result, a display device having preferable electric characteristics and high reliability can be manufactured.

Embodiment Mode 9

Figure 22:
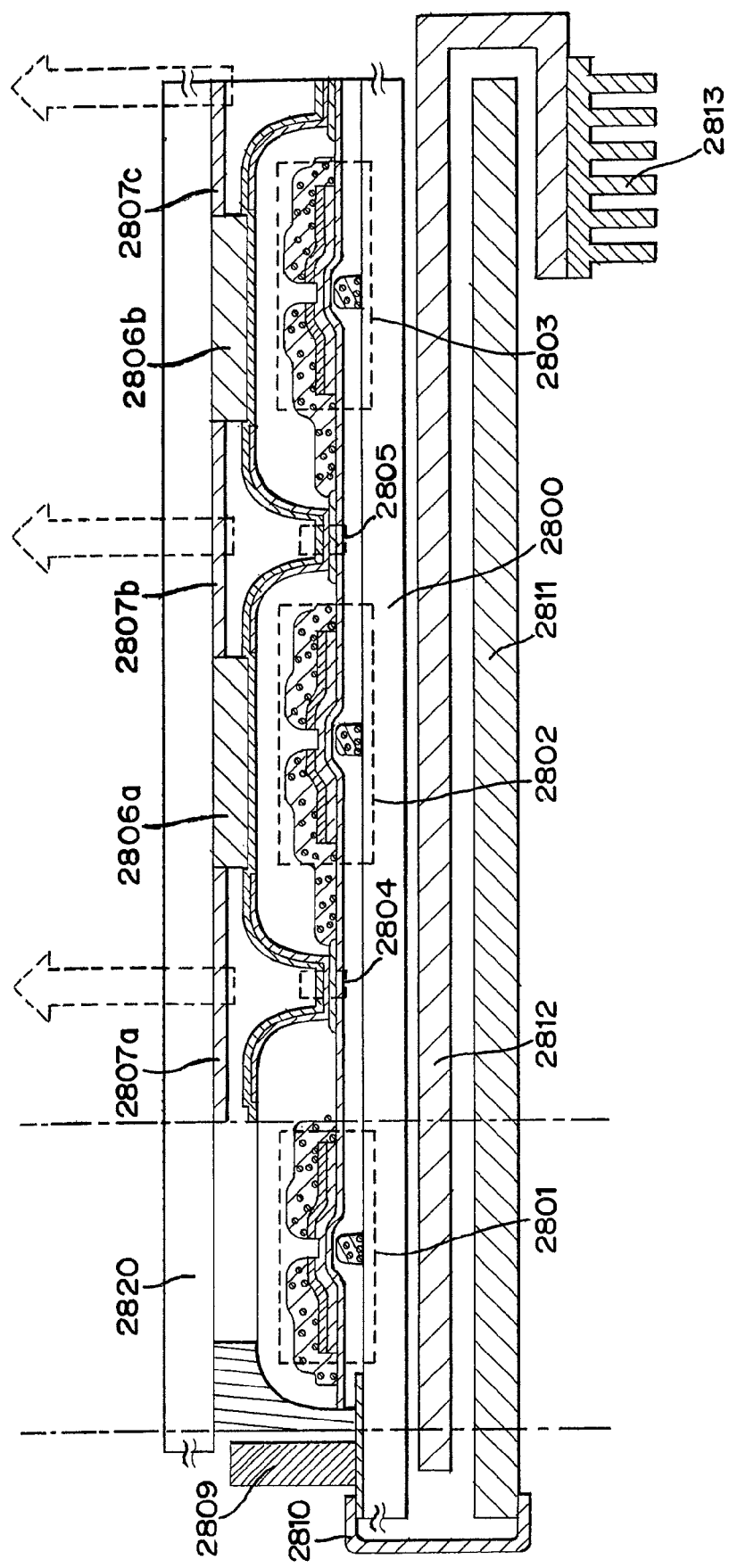
FIG. 22 is a cross-sectional view describing a structure example of an EL display module according to the present invention.

FIG. 22 shows an example constituting an EL display module having a TFT substrate 2800 manufactured according to the present invention. A pixel area including pixels is formed over the TFT substrate 2800.

In FIG. 22, a TFT which is the same as that formed in a pixel or a protective circuit portion 2801 operated in the same manner as a diode by being connected to a gate and one of a source or a drain of the TFT is provided between a driver circuit and the pixel which is outside of the pixel area. A driver IC formed of a single crystal semiconductor, a stick driver IC formed of a polycrystalline semiconductor film over a glass substrate, or a driver circuit formed of a SAS is applied to a driver circuit 2809.

The TFT substrate 2800 is bonded to a sealing substrate 2820 by interposing spacers 2806a and 2806b formed by a droplet discharge method therebetween. The spacer is preferably provided to keep the space between two substrates constantly even when a substrate is thin and an area of a pixel area is enlarged. A space between the TFT substrate 2800 and the sealing substrate 2820 over light emitting elements 2804 and 2805 connected to TFTs 2802 and 2803, respectively may be filled with a light-transmitting resin material and solidified, or may be filled with anhydrous nitrogen or an inert gas.

FIG. 22 shows the case in which the light emitting elements 2804 and 2805 have a structure of a top emission type and has a structure in which light is emitted in the direction of the arrow shown in the figure. Multicolor display can be carried out in each pixel by having different luminescent colors of red, green, and blue. In addition, at this time, color purity of the luminescence emitted outside can be improved by forming coloring layers 2807a, 2807b and 2807c corresponding to each color on the sealing substrate 2820 side. Moreover, the coloring layers 2807a, 2807b and 2807c may be combined by using the pixel as a white light emitting element.

The driver circuit 2809 which is an external circuit is connected to a scan line or signal line connection terminal provided over one end of an external circuit substrate 2811 through a wiring substrate 2810. In addition, a heat pipe 2813 and a heat sink 2812 may be provided to be in contact with or close to the TFT substrate 2800 to have a structure improving a heat effect.

FIG. 22 shows the top emission type EL module; however, it may be a bottom emission structure by changing the structure of the light emitting element or the disposition of the external circuit substrate. Naturally, a dual emission structure in which light is emitted to both sides of the top and bottom surfaces may be used. In the case of the top emission structure, the insulating layer which is to be a partition wall may be colored to be used as a black matrix. This partition wall can be formed by a droplet discharge method or the like and it may be formed by mixing a black resin of a pigment material, carbon black, or the like into a resin material such as polyimide, or a lamination thereof may be also used.

Additionally, in the TFT substrate 2800, a sealing structure may be formed by attaching a resin film to the side where the pixel area is formed with the use of a sealant or an adhesive resin. In this embodiment mode, glass sealing using a glass substrate is shown; however, various sealing methods such as resin sealing using a resin, plastic sealing using plastic, and film sealing using a film can be used. A gas barrier film which prevents moisture from penetrating is preferably provided on the surface of a resin film. By applying a film sealing structure, further thinner and lighter can be realized.

Embodiment Mode 10

A television device can be completed by a display device formed according to the present invention. A display panel can be formed in any manners as follows: as the structure shown in FIG. 14A, in the case where only a pixel area is formed, and then a scan line driver circuit and a signal line driver circuit are mounted by a TAB method as shown in FIG. 15B; as the structure shown in FIG. 14A, in the case where only a pixel area is formed, and then a scan line driver circuit and a signal line driver circuit are mounted by a COG method as shown in FIG. 15A; a TFT is formed of a SAS, a pixel area and a scan line driver circuit are integrally formed over a substrate, and a signal line driver circuit is separately mounted as a driver IC as shown in FIG. 14B; and a pixel area, a signal line driver circuit, and a scan line driver circuit are integrally formed over the substrate as shown in FIG. 14C; or the like.

Another structure of an external circuit includes a video signal amplifier circuit which amplifies a video signal received by a tuner; a video signal processing circuit which converts the video signal output therefrom into a chrominance signal corresponding to each color of red, green, and blue; a control circuit which converts the video signal into an input specification of a driver IC; and the like on inputting side of the video signal. The control circuit outputs the signal into the scan line side and the signal line side, respectively. In the case of digital driving, a signal division circuit may be provided on the signal line side so as to have a structure in which an input digital signal is provided by dividing into m-pieces.

Among a signal received from the tuner, an audio signal is transmitted to an audio signal amplifier circuit, and the output thereof is provided for a speaker through an audio signal processing circuit. A control circuit receives control information on a receiving station (a receiving frequency) or sound volume from an input portion and transmits the signal to the tuner or the audio signal processing circuit.

Figure 30:
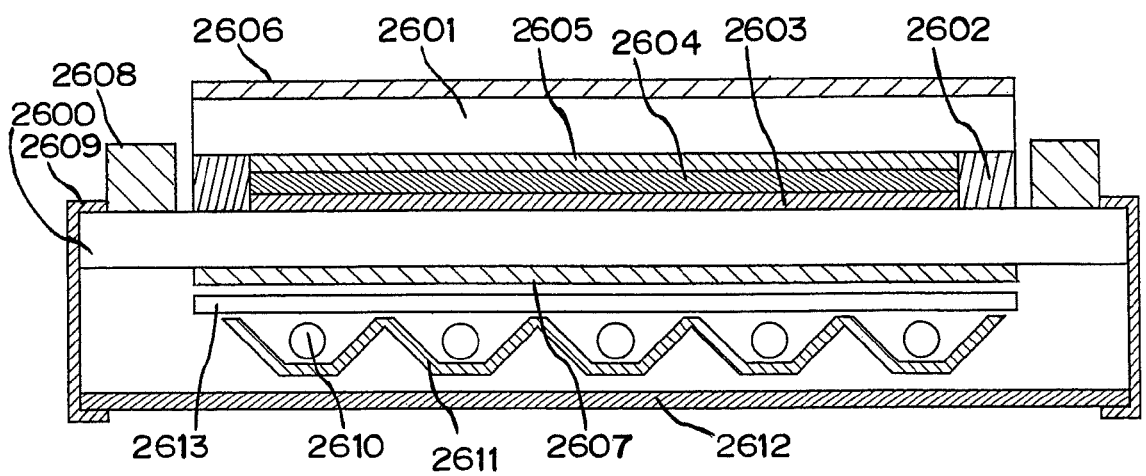
FIG. 30 is a cross-sectional view describing a structural example of a liquid crystal display module of the invention.

FIG. 30 shows an example of a liquid crystal display module, and a TFT 2600 and a counter substrate 2601 are fixed with a sealant 2602, with a pixel area 2603 and a liquid crystal layer 2604 interposed therebetween to form a display region. Coloring layer 2605 is required in the case of performing a color display. In the case of an RGB method, coloring layers corresponding to red, green, and blue are provided for each pixel. Polarizing plates 2606 and 2607, an optical film 2613 are provided outside the TFT substrate 2600 and the counter substrate 2601. A light source includes a cold cathode tube 2610 and reflection plate 2611, and a circuit substrate 2612 is connected to the TFT substrate 2600 through a driver circuit 2608 and a flexible wiring substrate 2609 and an external circuit such as a control circuit or a power supply circuit is incorporated.

As shown in FIGS. 20A and 20B, a television device can be completed by incorporating a display module into a chassis 2001. An EL television device can be completed when an EL display module as in FIG. 22 is used, and a liquid crystal television device can be completed when a liquid crystal module as in FIG. 30 is used. A main screen 2003 is formed by using the display module, and a speaker unit 2009, operation switches, and the like are provided as other attached equipments. In such a manner, the television device can be completed according to the present invention.

Figure 19:
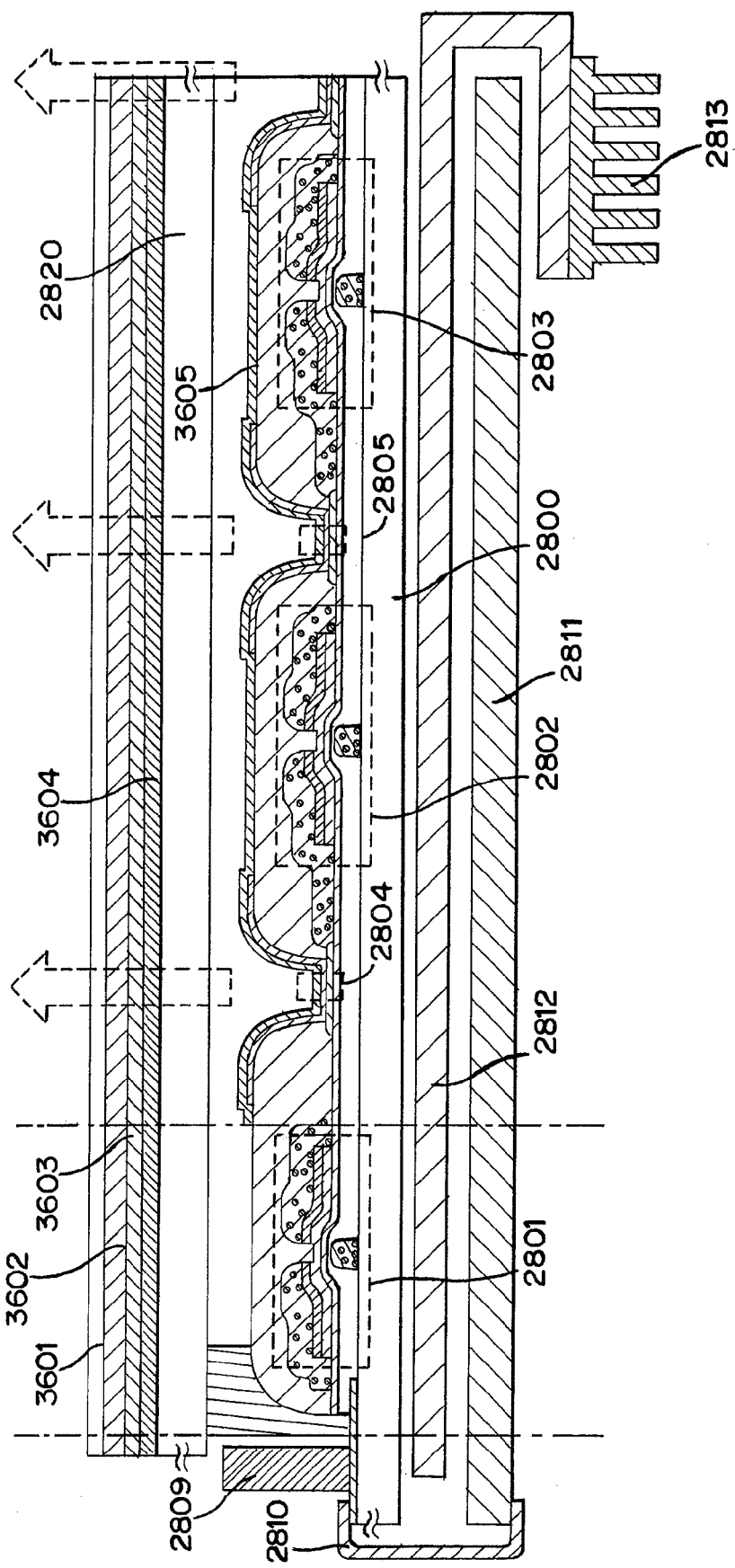
FIG. 19 is a cross-sectional view describing a structure example of an EL display module according to the present invention.

In addition, reflected light of light entered from exterior may be shielded by using a retardation film and a polarizing plate. FIG. 19 is a structure of a top emission type and an insulating layer 3605 which is to be a partition wall is colored to use as a black matrix. The partition wall can be formed by a droplet discharge method, and carbon black or the like may be mixed into a resin material such as polyimide, and a lamination thereof may be also used. Depending on a droplet discharge method, different materials may be discharged on the same region plural times to form the partition wall. In this embodiment mode, a black resin of a pigment is used. A quarter wave plate and a half wave plate may be used as retardation films 3603 and 3604 and may be designed to be able to control light. As the structure, a TFT element substrate 2800, a light emitting element 2804, a sealing substrate (sealant) 2820, retardation films (quarter and half wave plates) 3603 and 3604, a polarizing plate 3602 are sequentially laminated, in which light emitted from the light emitting element is emitted outside of the polarizing plate side to transmit them. The retardation film or polarizing plate may be provided on a side where light is emitted or may be provided on the both sides in the case of a dual emission type display device in which light is emitted from the both faces. In addition, an anti-reflective film 3601 may be provided on the outer side of the polarizing plate. Accordingly, a higher definition and more accurate image can be displayed.

As shown in FIG. 20A, a display panel 2002 using a display element is incorporated into a chassis 2001. By using a receiver 2005, in addition to receiving general TV broadcast, information communication can also be carried out in one direction (from a transmitter to a receiver) or in the both directions (between a transmitter and a receiver or between receivers) by connecting to a communications network by a fixed line or a wireless through a modem 2004. The operation of the television device can be carried out by switches incorporated into the chassis or by a remote control device 2006, which is separated from the main body. A display area 2007 that displays information to be output may be also provided for this remote control device.

In addition, in the television device, a structure displaying a channel, sound volume, or the like may be additionally provided by forming a sub-screen 2008 of a second display panel in addition to the main screen 2003. In this structure, the main screen 2003 is formed of an EL display panel superior in a viewing angle, and the sub-screen may be formed of a liquid crystal display panel capable of displaying the sub-screen with low power consumption. In order to prioritize low power consumption, a structure in which the main screen 2003 is formed of a liquid crystal display panel, the sub-screen is formed of an EL display panel, and the sub-screen is able to flash on and off may be also applied. According to the present invention, a display device with high reliability can be manufactured even by using many TFTs and electronic parts by using such a large-sized substrate.

FIG. 20B shows a television device having a large-sized display area of, for example, 20 inches to 80 inches, which includes a chassis 2010, a display area 2011, a keyboard unit 2012 which is an operation unit, a speaker unit 2013, and the like. The present invention is applied to manufacturing the keyboard unit 2012 which is an operation unit. FIG. 20B shows a television device having a curved display area since a substance which is capable of curving is used for the display area. The present invention sufficiently corresponds to such a curved shape, without film peeling-off since a wiring or an insulating layer included in the display device are formed with good adhesion. Thus, a television device having a desired shape can be manufactured since the shape of the display area can be freely designed.

Using the present invention enables to simplify the process. Accordingly, a display panel can be easily manufactured even when a glass substrate which is in and after the fifth generation having 1000 mm or more on a side is used.

According to the present invention, a desired pattern can be formed with good control, and the material loss and the cost can be reduced. Hence, a television device even with a large screen display area can be formed with low cost by applying the present invention, and a defect is not generated even when the shape of the television device is designed freely. Accordingly, a high-performance and highly reliable television device can be manufactured with a preferable yield.

Naturally, the present invention is not limited to the television device and it can be applied to various usages especially as the display mediums having a large area such as an information display board at a station, an airport, or the like, or an advertisement display board on the street as well as a monitor of a personal computer.

Embodiment Mode 11

Various display devices can be manufactured by applying the present invention. In other words, the present invention can be applied to various electronic devices in which these display devices are incorporated into display areas.

The electronic devices include a camera such as a video camera or a digital camera, a projector, a head mounted display (a goggle type display), a car navigation system, a car stereo, a personal computer, a game machine, a portable information terminal (a mobile computer, a cellular phone, an electronic book, or the like), an image reproducing device provided with a recording medium (specifically a device that is capable of playing a recording medium such as a Digital Versatile Disc (DVD) and that has a display device that can display the image) or the like. FIGS. 21A to 21D show the examples thereof.

Figure 21A:
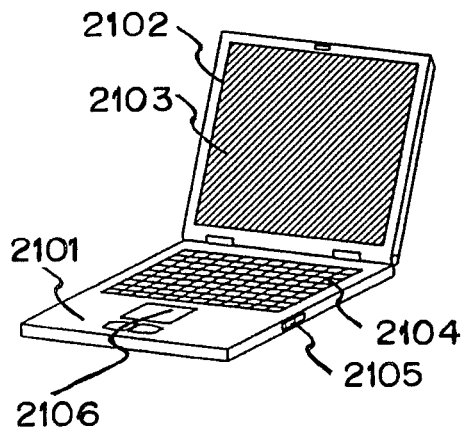
FIGS. 21A to 21D are figures showing electronic devices to which the present invention is applied.

FIG. 21A shows a computer, which includes a main body 2101, a chassis 2102, a display area 2103, a keyboard 2104, an external connection port 2105, a pointing mouse 2106 and the like. According to the present invention, a computer in which an image with high reliability and high resolution can be displayed can be completed even the computer is miniaturized and a wiring or the like becomes precise.

Figure 21B:
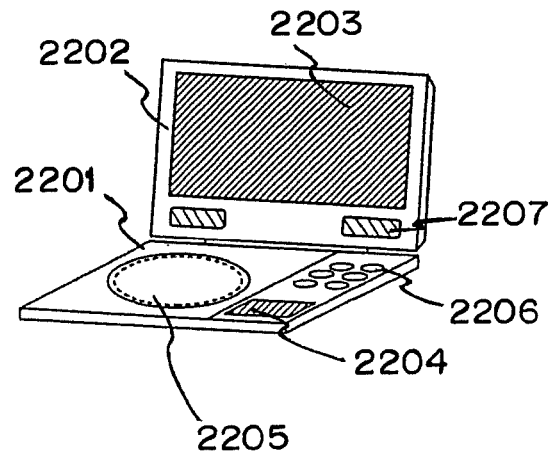

FIG. 21B shows an image reproducing device provided with a recording medium (specifically a DVD reproducing device), which includes a main body 2201, a chassis 2202, a display area A 2203, a display area B 2204, a recording medium (such as a DVD) reading portion 2205, operation keys 2206, a speaker unit 2207 and the like. The display area A 2203 mainly displays image information and the display area B 2204 mainly displays character information. According to the present invention, an image producing device in which an image with high reliability and high resolution can be displayed can be completed even when the image reproducing device is miniaturized and a wiring or the like becomes precise.

Figure 21C:
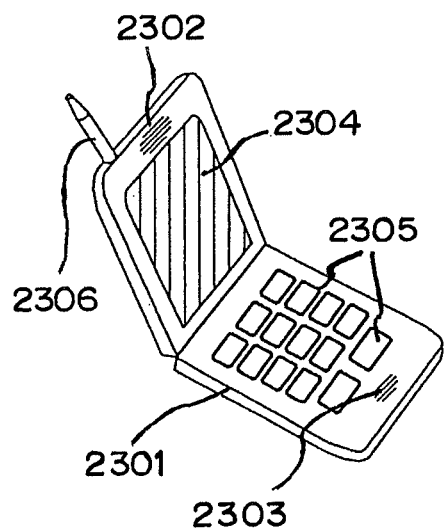

FIG. 21C shows a cellular phone, which includes a main body 2301, an audio output portion 2302, an audio input portion 2303, a display area 2304, operation switches 2305, an antenna 2306, and the like. According to the present invention, a cellular phone in which an image with high reliability and high resolution can be displayed can be completed even when the cellular phone is miniaturized and a wiring or the like becomes precise.

Figure 21D:
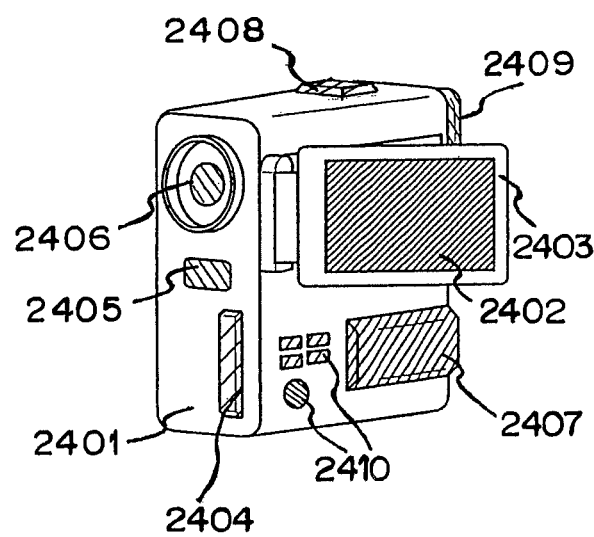

FIG. 21D shows a video camera, which includes a main body 2401, a display area 2402, a chassis 2403, an external connection port 2404, a remote control receiving portion 2405, an image receiving portion 2406, a battery 2407, an audio input portion 2408, operation switches 2410, eyepiece portion 2409, and the like. According to the present invention, a video camera in which an image with high reliability and high resolution can be displayed can be completed even when the video camera is miniaturized and a wiring or the like becomes precise. This embodiment mode can be freely combined with the above-mentioned embodiment modes.

Embodiment 1

In this embodiment, the effect of the present invention will be described based on an experimental result.

As a comparative example, a composition containing silver as a conductive material is discharged onto a glass substrate and is baked to be dried, thereby forming a silver wiring. The experimental result of a comparative example that is the silver wiring formed by a droplet discharge method using silver as a conductive material is shown in FIGS. 31A and 31B. FIG. 31A shows an atomic force microscope (AFM) micrograph of a silver wiring formed by discharging a composition containing particle-like silver and baking it for 30 seconds. FIG. 31B shows an AFM micrograph of a silver wiring formed in a like manner with the baking time of 120 seconds. The baking temperature is 400° C. to 450° C. As shown in FIGS. 31A and 31B, irregularities exist on the surface of the silver wiring which cause bad planarity. Further, FIG. 31C shows the result of profiling the range of about 500 nm in cross section of the irregularities on the surface of the silver wiring. The surface of the silver wiring has the shapes of convections and depressions, and the height difference of the irregularities are 50 nm or more in the case of the wiring with the baking time of 120 seconds. Thus, as to a conductive layer that is formed by discharging a composition containing a conductive material and by baking, irregularities exist on the surface which may cause bad planarity are observed.

Figure 32A:
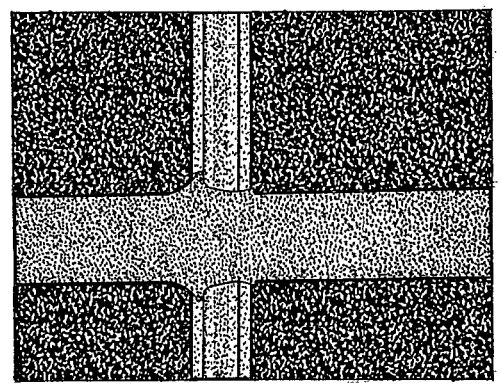
FIGS. 32A and 32B are a micrograph and data of withstand voltage test of Sample A made in Embodiment 1.
Figure 33A:
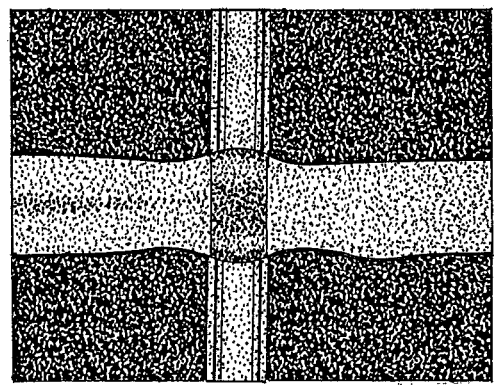
FIGS. 33A and 33B are a micrograph and data of withstand voltage test of Sample A made in Embodiment 1.
Figure 34A:
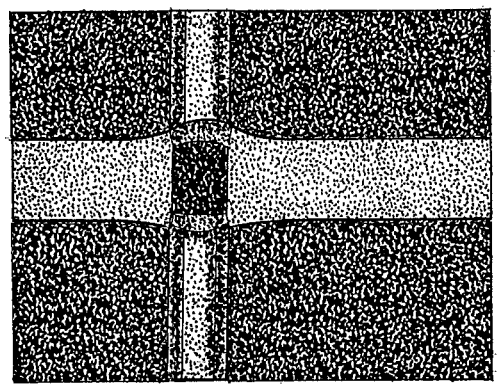
FIGS. 34A and 34B are a micrograph and data of withstand voltage test of Sample A made in Embodiment 1.

Next, a sample in which an insulating layer is formed over a first silver electrode, and a second silver electrode is formed over the insulating layer is formed by such a droplet discharge method is formed. The silver electrodes in the sample are all formed by a droplet discharge method using silver as a conductive film. Three different kinds of Samples A, B, and C are formed. The insulating layer formed between the first silver electrode and the second silver electrode in Sample A is formed with a laminate of a 100 nm thick siloxane polymer film and a 100 nm thick silicon nitride film thereover, in Sample B is formed with a laminate of a 150 nm thick siloxane polymer film and a 100 nm thick silicon nitride film, and in Sample C is formed only with a 150 nm thick siloxane polymer film. The optical micrograph of respective samples are shown in FIG. 32A (Sample A), FIG. 33A (Sample B), and FIG. 34A (Sample C).

Figure 32B:
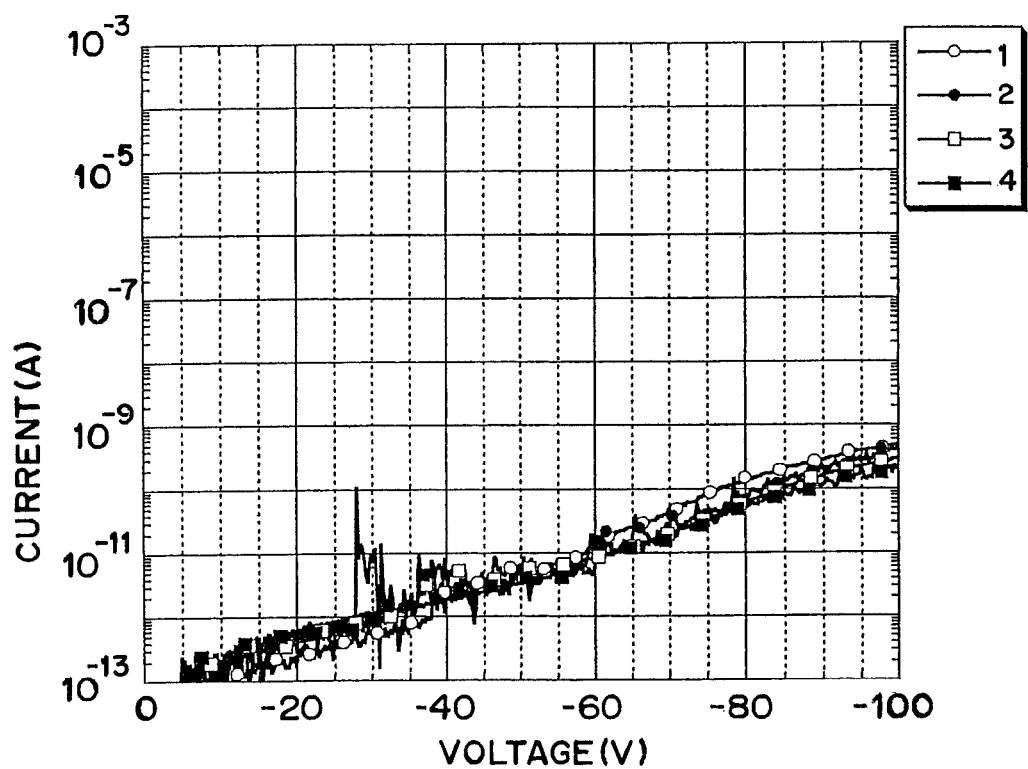
Figure 33B:
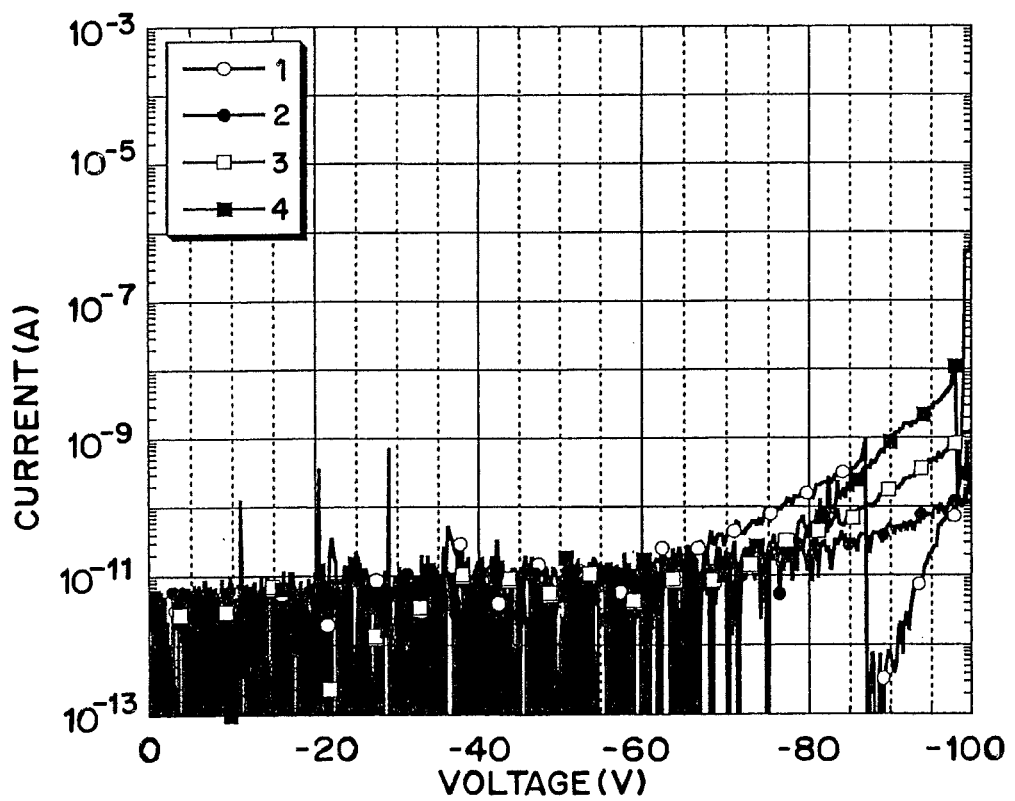
Figure 34B:
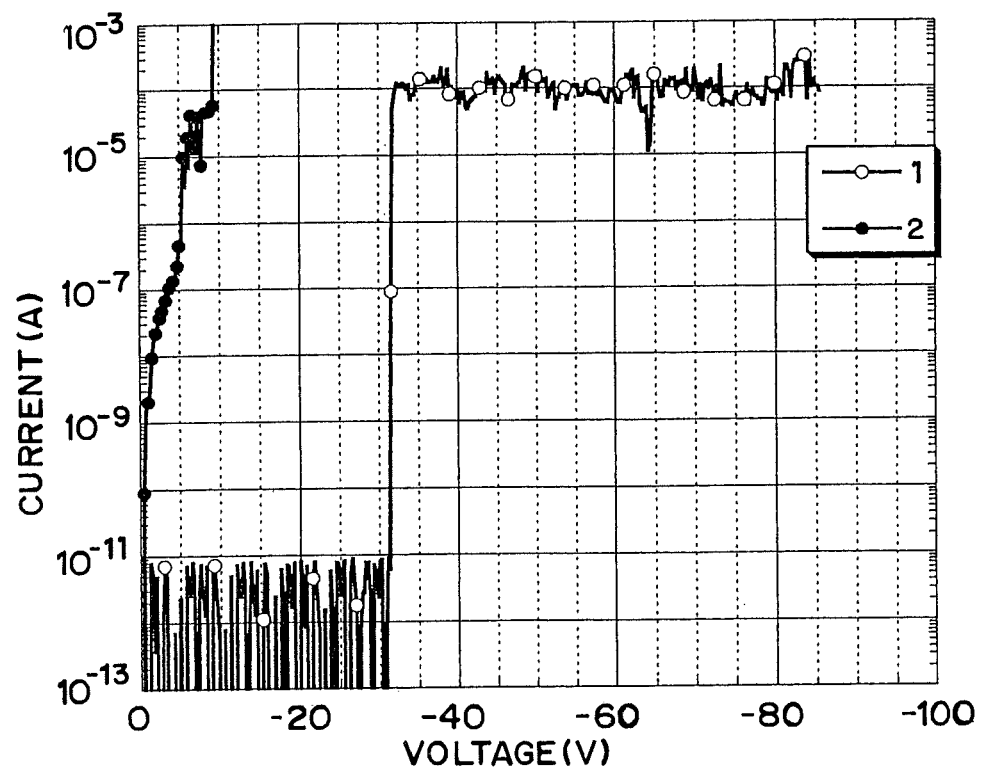

Voltage is applied between silver electrodes of respective Samples A, B, and C to measure the withstand voltage. The change in current value of the insulating layer with respect to the voltage applied to each sample is shown in FIG. 32B (Sample A), FIG. 33B (Sample B), and FIG. 34B (Sample C). In Samples A and B according to the invention each of which is a laminate of a siloxane polymer formed by an application method, which is a first insulating layer containing an organic material, and a silicon nitride film formed by sputtering, which is a second insulating layer containing an inorganic material, current does not flow even when high voltage is applied. However, in the case of only one insulating layer of a siloxane polymer film, current flows under the voltage of −30V since the withstand voltage of the insulating layer is not enough; the insulating layer is observed to be broken to malfunction as an insulating layer.

Thus, an insulating layer with improved electrical characteristics (strength) can be formed by applying the present invention. According to the invention, a component can be formed to a desired pattern with good adhesion. Further, less material loss and reduction in cost can be achieved. Hence, a thin film transistor and a display device with high performance and highly reliability can be manufactured with high yield.

Embodiment 2

Also in this embodiment, the effect of the present invention will be described based on an experimental result.

Two kinds of silver wirings which are formed by discharging a composition containing silver as a conductive material are formed. One of them is a sample of a silver wiring containing only the above composition and the other is a silver wiring that contains a material which is the same as at least one of the substances forming the formation subject surface, which is formed using a composition added with a material which is the same as at least one of the substances forming the formation subject surface.

Amorphous silicon films are formed over a glass substrate by CVD, and Samples (Sample X1, Sample X2, Sample Y1, and Sample Y2) in which silver wirings are formed over the amorphous silicon films are formed. A composition containing silver as a conductive material is attached to each formation subject surface to form silver wirings under different conditions. As the material which is the same as at least one of the substances forming the formation subject surface, a material containing $SiO_2$, $B_2O_3$, or $R_2O$ is used.

As for the samples, a composition containing silver as a conductive material is discharged over an amorphous silicon film over a glass substrate, and is baked at 300° C. for one hour in Sample X1, baked at 500° C. under a nitrogen atmosphere for 10 minutes in Sample X2 to be used. Further, a composition in which the above composition is added with a material which is the same as at least one of the substances forming the formation subject surface and baked at 300° C. for one hour in Sample Y1 and baked at 500° C. under a nitrogen atmosphere or 10 minutes in Sample Y2.

The above Samples X1, X2, Y1, and Y2 are soaked in 0.5 wt % diluted hydrofluoric acid solution and the adhesion of each silver wiring to each formation subject is tested. The results are shown below.

As to Sample X1 in which only a silver wiring is formed over an amorphous silicon film over a glass substrate, the silver wiring is peeled from the amorphous silicon film 30 seconds after being soaked in the hydrofluoric acid solution. As to Sample X2, the silver wiring is peeled from the amorphous silicon film 1 minute after being soaked in the hydrofluoric acid solution. On the other hand, as to Sample Y1 in which a silver wiring containing a material which is the same as at least one of the substances forming the formation subject surface is formed, only about one third of the whole silver wiring is peeled from the amorphous silicon film even two minutes after being soaked in the hydrofluoric acid solution. As to Sample Y2, the silver wiring is not peeled from the amorphous silicon film even two minutes after being soaked in the hydrofluoric acid solution.

The silver wiring containing a material which is the same as at least one of the substances forming the formation subject surface, which forms the formation subject surface, has better adhesion to the amorphous silicon film that is the formation subject. Thus, it is confirmed that the adhesion between a silver wiring and a formation subject can be improved due to the effect of a material containing at least one of the substances forming the formation subject surface. Accordingly, a component can be formed to a desired pattern with good adhesion. Further, less material loss and reduction in cost can be achieved. Hence, a thin film transistor and a display device with high performance and highly reliability can be manufactured with high yield.

What is claimed is:

1. A display device comprising:
    a substrate;
    a gate electrode comprising a particle of an oxide on the substrate, wherein the particle of an oxide contains a material which is contained in the substrate;
    a first insulating layer containing an organic material over the gate electrode;
    a second insulating layer containing an inorganic material over the first insulating layer;
    a semiconductor layer over the second insulating layer; and
    a source electrode layer and a drain electrode layer over and in contact with the semiconductor layer and the second insulating layer,
    wherein the source electrode layer and the drain electrode layer comprise the particle of an oxide.

2. The display device according to claim 1, wherein the first insulating layer containing the organic material includes a siloxane polymer.

3. The display device according to claim 1, wherein the second insulating layer containing the inorganic material includes silicon nitride.

4. The display device according to claim 1, further comprising:
    an electrode layer which is electrically connected to the source electrode layer and the drain electrode layer.

5. The display device according to claim 1, wherein the first insulating layer containing the organic material includes one of epoxy resin, phenol resin, novolac resin, acrylic resin, melamine resin, urethane resin, acrylic acid, methacrylic acid, polyimide, aromatic polyamide, and polybenzimidazole.

6. The display device according to claim 1, wherein the particle of an oxide is in contact with the substrate.

7. The display device according to claim 1, wherein the gate electrode has a rounded corner.

8. The display device according to claim 1, wherein the particle of an oxide has a size of 100 nm or less.

9. The display device according to claim 1, wherein the particle of an oxide contains silicon oxide.

10. A display device comprising:
    a substrate;
    a gate electrode comprising a particle of a nitride on the substrate, wherein the particle of a nitride contains a material which is contained in the substrate;
    a first insulating layer containing an organic material over the gate electrode;
    a second insulating layer containing an inorganic material over the first insulating layer;
    a semiconductor layer over the second insulating layer; and
    a source electrode layer and a drain electrode layer over and in contact with the semiconductor layer and the second insulating layer,
    wherein the source electrode layer and the drain electrode layer comprise the particle of a nitride.

11. The display device according to claim 10, wherein the first insulating layer containing the organic material includes a siloxane polymer.

12. The display device according to claim 10, wherein the second insulating layer containing the inorganic material includes silicon nitride.

13. The display device according to claim 10, further comprising:
    an electrode layer which is electrically connected to the source electrode layer and the drain electrode layer.

14. The display device according to claim 10, wherein the first insulating layer containing the organic material includes one of epoxy resin, phenol resin, novolac resin, acrylic resin, melamine resin, urethane resin, acrylic acid, methacrylic acid, polyimide, aromatic polyamide, and polybenzimidazole.

15. The display device according to claim 10, wherein the particle of a nitride is in contact with the substrate.

16. The display device according to claim 10, wherein the gate electrode has a rounded corner.

17. The display device according to claim 10, wherein the particle of a nitride has a size of 100 nm or less.

* * * * *

UNITED STATES PATENT AND TRADEMARK OFFICE
CERTIFICATE OF CORRECTION

| | | |
|---|---|---|
| PATENT NO. | : 8,912,546 B2 | |
| APPLICATION NO. | : 12/360551 | |
| DATED | : December 16, 2014 | |
| INVENTOR(S) | : Shinji Maekawa | |

It is certified that error appears in the above-identified patent and that said Letters Patent is hereby corrected as shown below:

In the Specification:

Column 25, Line 16; Change "100 mm" to --100 nm--.

Column 39, Line 51; Change "3 µM," to --3 µm,--.

Signed and Sealed this
Fifth Day of May, 2015

Michelle K. Lee
*Director of the United States Patent and Trademark Office*